(12) United States Patent
Maebashi et al.

(10) Patent No.: US 7,986,045 B2
(45) Date of Patent: Jul. 26, 2011

(54) SEMICONDUCTOR DEVICE HAVING AN INCREASED AREA OF ONE OF THE OPPOSING ELECTRODE PARTS FOR PREVENTING GENERATION OF UNCONNECTED POSITIONS THE ELECTRODES ON THE BONDED WAFERS

(75) Inventors: Takanori Maebashi, Asaka (JP); Nobuaki Miyakawa, Niiza (JP)

(73) Assignee: Honda Motor Co., Ltd., Tokyo (JP)

( * ) Notice: Subject to any disclaimer, the term of this patent is extended or adjusted under 35 U.S.C. 154(b) by 52 days.

(21) Appl. No.: 12/194,672

(22) Filed: Aug. 20, 2008

(65) Prior Publication Data
US 2009/0057890 A1     Mar. 5, 2009

Related U.S. Application Data

(60) Provisional application No. 60/957,792, filed on Aug. 24, 2007.

(51) Int. Cl.
*H01L 23/48*   (2006.01)
*H01L 23/52*   (2006.01)
*H01L 29/40*   (2006.01)

(52) U.S. Cl. ........ 257/777; 257/758; 257/686; 257/782; 257/783; 438/109; 438/118; 438/622; 438/406; 438/455

(58) Field of Classification Search .................. 257/777, 257/686, 758, 723, 778, 774, 776, 782, 783, 257/725; 438/118, 622, 108, 109, 406, 455
See application file for complete search history.

(56) References Cited

U.S. PATENT DOCUMENTS
2007/0045836 A1*  3/2007  Kwon et al. .................. 257/734
2007/0269931 A1* 11/2007  Chung et al. ................. 438/109

FOREIGN PATENT DOCUMENTS
JP         2007-59769 A      3/2007
WO    WO-2007/024022 A1    3/2007

\* cited by examiner

*Primary Examiner* — Thao X Le
*Assistant Examiner* — Thanh Y Tran
(74) *Attorney, Agent, or Firm* — Birch, Stewart, Kolasch & Birch, LLP

(57) ABSTRACT

In this semiconductor device, connection parts between wafers are electrically insulated from each other, and a junction face shape of second electrical signal connection parts is larger than the shape of a positioning margin face that is formed by an outer shape when the periphery of a minimum junction face, which has half the area of a junction area of the first electrical signal connection part, is enclosed by a same width dimension as a positioning margin dimension between the first wafer and the second wafer.

5 Claims, 38 Drawing Sheets

SEMICONDUCTOR DEVICE HAVING AN INCREASED AREA OF ONE OF THE OPPOSING ELECTRODE PARTS FOR PREVENTING GENERATION OF UNCONNECTED POSITIONS THE ELECTRODES ON THE BONDED WAFERS

Priority is claimed on U.S. Provisional Application No. 60/957,792, filed Aug. 24, 2007, the content of which are incorporated herein by reference.

BACKGROUND OF THE INVENTION

1. Field of the Invention

The present invention relates to a semiconductor device.

2. Description of Related Art

Conventionally, a three-dimensional semiconductor integrated circuit device has been known having a configuration wherein two or more wafers are stacked and electrically connected with penetrating wiring.

For example, Japanese Unexamined Patent Application, First Publication No. H11-261000 discloses a semiconductor device obtained by the following manufacturing method. After making a trench (i.e., a deep groove) in one of the wafers to be stacked and thermally-oxidizing an inner part of the trench, Poly-Si is buried in the trench as a conductor to form a penetrating wiring. The wafer thickness is reduced until the penetrating wiring is exposed, and backside bumps are formed at positions corresponding to the penetrating wiring on the backside of the wafer. The backside bumps of this wafer are then stacked with frontside bumps formed on a front surface of another wafer. An insulating adhesive is then injected between the two stacked wafers. In this manner, a three-dimensional semiconductor integrated circuit device is manufactured.

Furthermore, a semiconductor device that includes a desired semiconductor circuit, made by bonding a plurality of substrates and electrically connecting semiconductor circuit parts disposed on the substrates, is disclosed in, for example, Japanese Unexamined Patent Application, First Publication No. 2007-59769. In the semiconductor device disclosed in this literature, by joining a penetrating wiring part exposed from an backside of a upper substrate and a frontside bump on a lower substrate, a semiconductor circuit part of the upper substrate can be electrically connected to a semiconductor circuit part of the lower substrate.

However, there is a problem in a conventional semiconductor device in which a plurality of wafers are bonded together, in that there may be positional deviation among some of the electrode parts to be connected on opposite sides of the wafers, leading to portions where electrodes are unconnected. This problem becomes more noticeable when the wafers are made larger and thinner, and when the electrode parts are miniaturized and multi-layered wirings on the wafers are made more complex.

The present invention has been realized in view of the above, and an object thereof is to provide a semiconductor device in which there are unlikely to be unconnected electrode parts on oppositely arranged wafers.

To achieve this object, the inventors researched the causes of positional deviation among electrode parts on oppositely arranged wafers. The following cause was discovered. In processes such as an element formation process and a multi-layer wiring formation process during processes of manufacturing a wafer to be bonded, stress accumulates on a face of the substrate on which a device is disposed. As a result, deformations of the wafer, such as expansion and contraction occur. For example, when the wafer is thick, it bows due to expansion and contraction of the device face. This expansion and contraction (warpage) is even more noticeable during a reducing process of wafer thickness.

The inventors then closely examined substrate warpage during manufacture of the wafer. As a result, it was discovered that, by increasing the area of one of the opposing electrode parts on the wafers, they can be easily arranged opposite each other even if the substrates had suffered warpage when manufacturing the wafers. The inventors thus conceived of the semiconductor device of the invention, which can prevent generation of unconnected portions of the electrodes on the wafers and achieve a highly reliable connection between them.

SUMMARY OF THE INVENTION

To achieve the object, the present invention employs the followings:

(1) a semiconductor device including: a first wafer and a second wafer that are bonded together; a plurality of first electrical signal connection parts, provided on a bonding surface of the first wafer; and a plurality of second electrical signal connection parts, provided on a bonding surface of the second wafer, and forming a plurality of inter-wafer connection parts that electrically connect to each of the first electrical signal connection parts; wherein: the inter-wafer connection parts are electrically insulated from each other; and a junction face shape of each of the second electrical signal connection parts is larger than the shape of a positioning margin face that is formed by an outer shape when the periphery of a minimum junction face, which has half the area of a junction area of the first electrical signal connection part, is enclosed by a same width dimension as a positioning margin dimension between the first wafer and the second wafer.

The semiconductor device may also be configured as follows:

(2) when a difference between the distance from a center of the first wafer and the first electrical signal connection parts arranged in an outermost portion, and the distance from the center of a pre-processed substrate that becomes the first wafer and pre-processed parts that become the first electrical signal connection parts arranged in an outermost portion, is deemed to be a post-processing positioning margin dimension; and the junction face shape of the second electrical signal connection parts is the same as the shape of a post-processing positioning margin face formed when the periphery of the shape of the positioning margin face is enclosed by the same width as that of the post-processing positioning margin dimension.

The semiconductor device may also be configured as follows:

(3) the junction face shape of the second electrical signal connection parts is the same as an outer shape when the periphery of the shape of the post-processing positioning margin face is enclosed by a predetermined correction dimension of no more than 2.5 μm.

The semiconductor device may also be configured as follows:

(4) the first wafer and the second wafer are thinned wafers which is subjected to a thickness reduction process.

The semiconductor device may also be configured as follows:

(5) the first electrical signal connection parts are penetrating wiring parts which electrically connects one face of the first wafer with another face thereof; and the second electrical signal connection parts are bumps.

According to the semiconductor device of this invention, for example, the planar shape of one of the pair of electrical signal connection parts on wafers arranged opposite each other has a larger area than (a) when the planar shape has an area of half the other electrical signal connection part, or (b) the planar shape is the shape of the positioning margin shape. Therefore, electrode parts of the wafers can be reliably aligned opposite each other. Therefore, even when there is a misalignment or the substrates suffer warpage at the time of manufacturing the wafers, the semiconductor device of this invention prevents unconnected portions between electrode parts of the wafers and ensures a highly reliable electrical connection between them.

DETAILED DESCRIPTION OF THE INVENTION

Subsequently, the invention will be explained in detail using the drawings.

First Embodiment

Figure 1A:
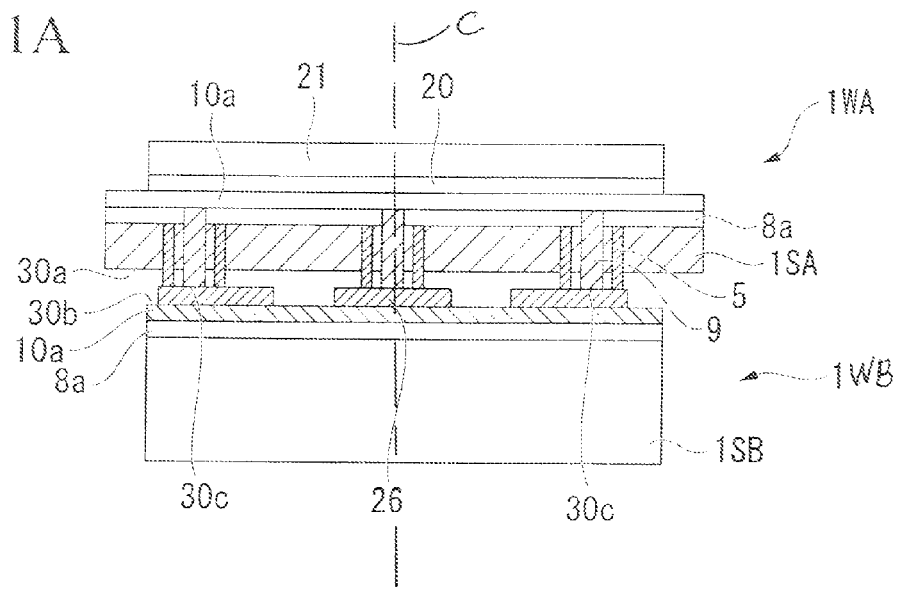
FIG. 1A is an enlarged cross-sectional schematic view of part of a semiconductor device according to a first embodiment of the invention.
Figure 1B:
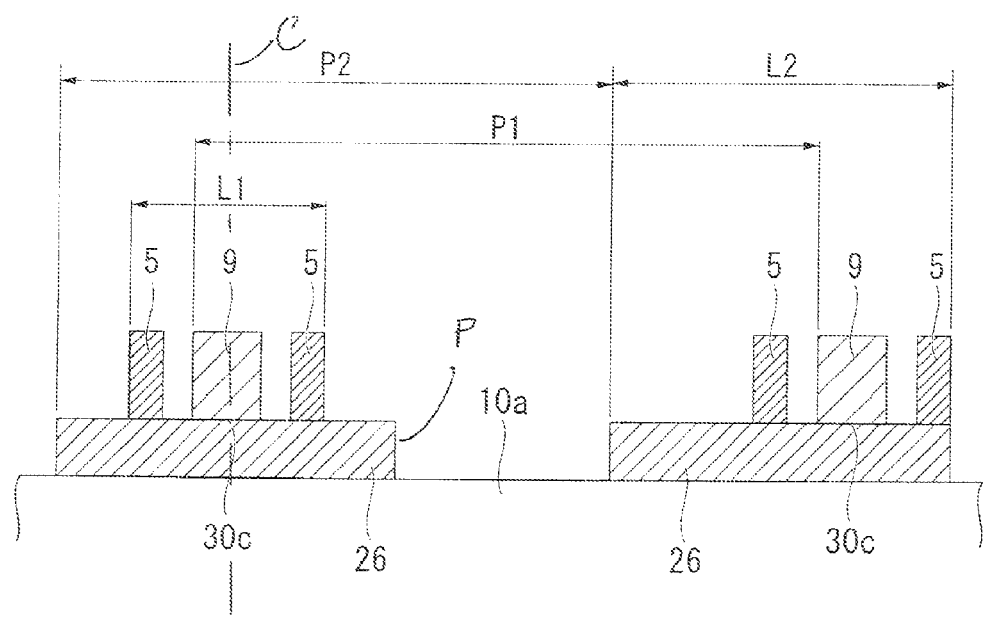
FIG. 1B is an enlarged cross-sectional schematic view of only a part of the same semiconductor device.
Figure 2:
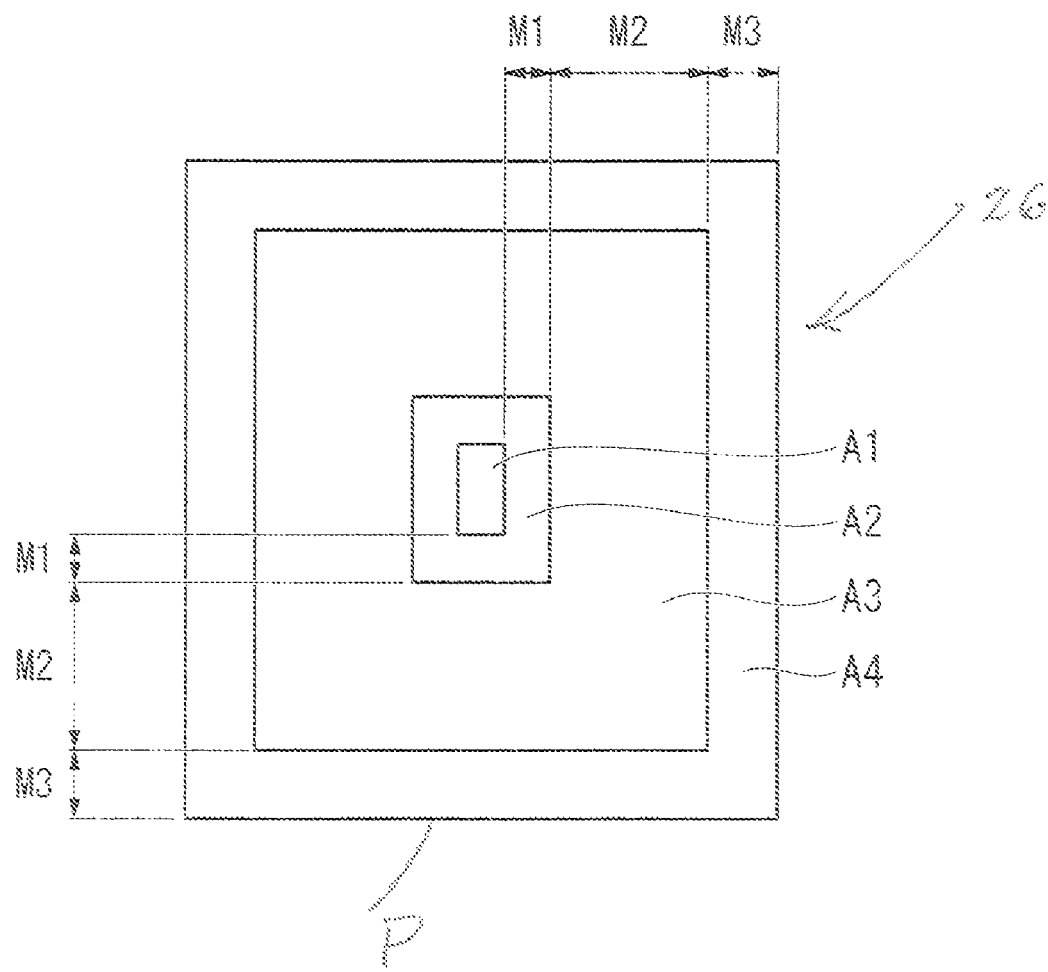
FIG. 2 is an explanatory plan view of the relationship between the size of a penetrating wiring part and a bump in the same semiconductor device.
Figure 19:
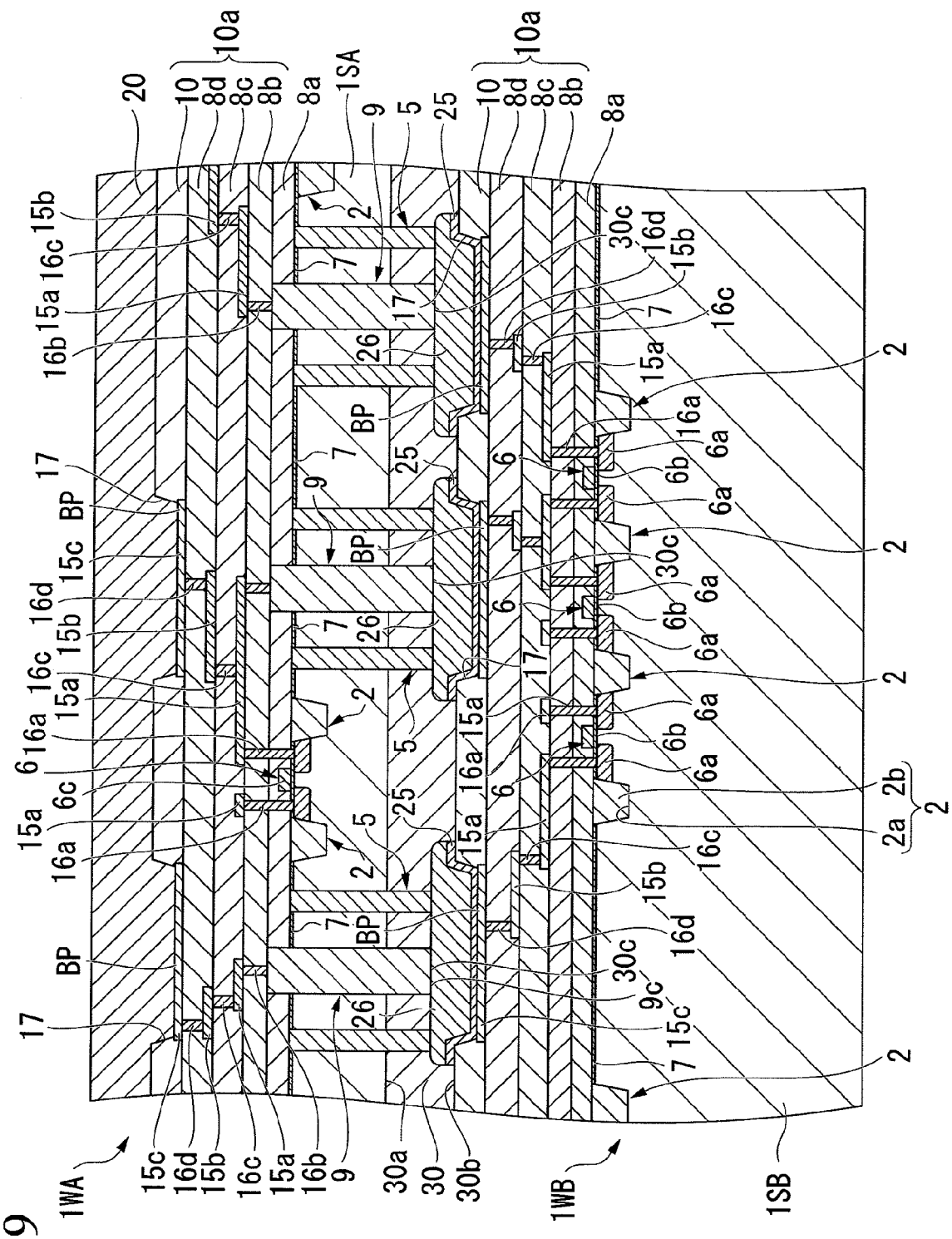
FIG. 19 is a cross-sectional view of primary parts of the same semiconductor device.
Figure 20:
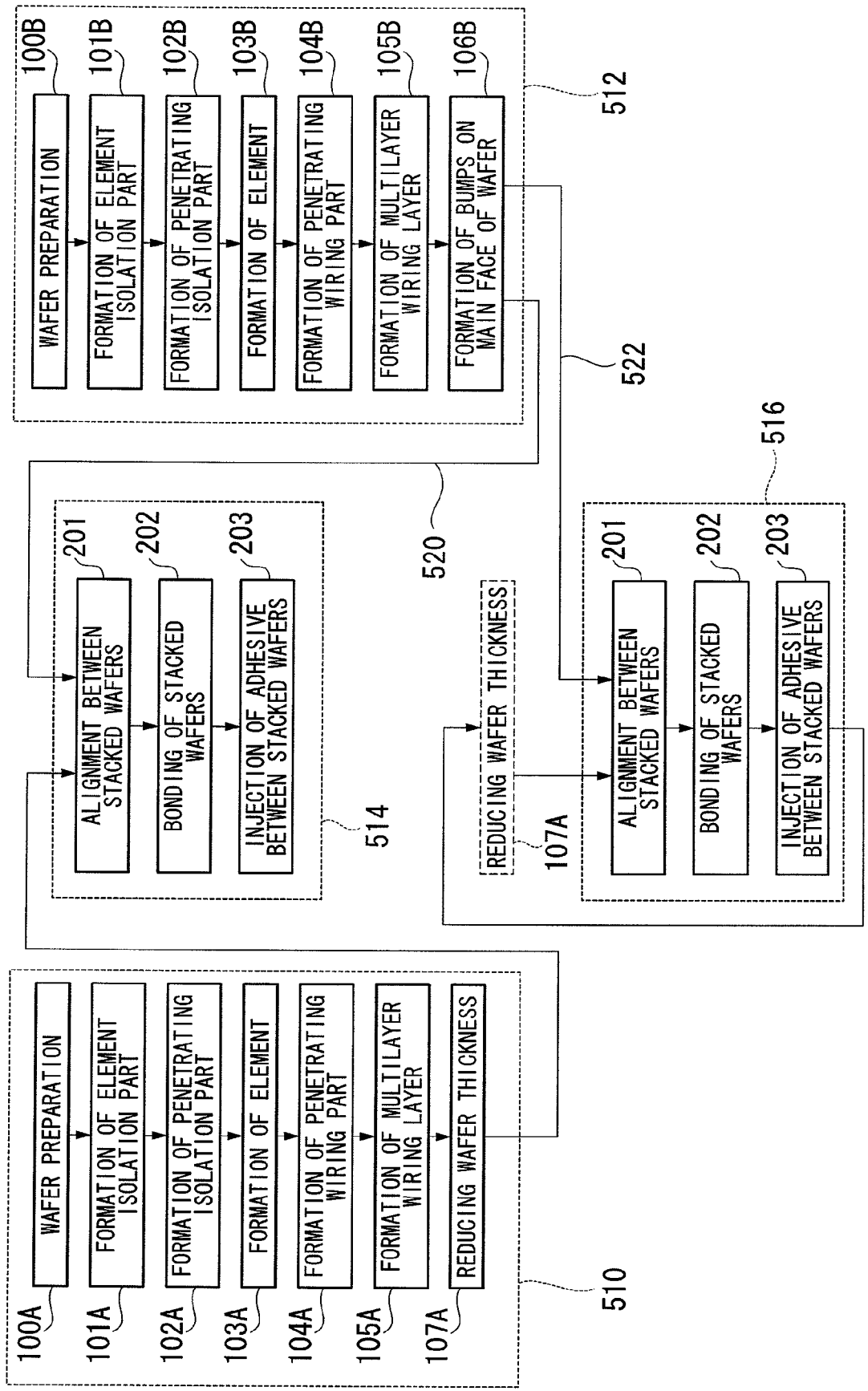
FIG. 20 is an explanatory flowchart of a manufacturing step of the same semiconductor device.

FIGS. 1A to 20 are explanatory views of a first embodiment of the semiconductor device of the invention. FIG. 19 is a cross-sectional view of primary parts of the semiconductor device of this embodiment. FIGS. 1A and 1B are enlarged cross-sectional schematic views of a part of the semiconductor device of this embodiment. FIG. 2 is an explanatory plan view of the relationship between the size of a penetrating wiring part and a bump in the semiconductor device of this embodiment. FIGS. 3 to 18 are explanatory views of manufacturing processes of the semiconductor device of this embodiment. FIG. 20 is an explanatory flowchart of a manufacturing process of the semiconductor device of this embodiment.

In the semiconductor device of the embodiment shown in FIG. 19, an upper wafer 1WA and a lower wafer 1WB are bonded together. The wafer 1WA and the wafer 1WB are manufactured by processing substrates 1SA and 1SB. A bonding surface 30a of the upper wafer 1WA is arranged opposite the lower wafer 1WB. On this bonding surface 30a, electrical signal connection parts are provided in a plurality of respective penetrating wiring parts 9. The penetrating wiring parts 9 penetrate through the substrate 1SA which constitutes the upper wafer 1WA. A main side (a first surface, being the upper surface in FIG. 19) and a backside (another surface, being the lower surface in FIG. 19) which are formed at both ends of the upper wafer 1WA in its thickness direction are electrically connected by the penetrating wiring parts 9. A bonding surface 30b of the lower wafer 1WB is arranged opposite the upper wafer 1WA. On this bonding surface 30b, electrical signal connection parts are provided in a plurality of respective bumps 26.

In the semiconductor device shown in FIG. 19, end parts 9c of the penetrating wiring parts 9 of the upper wafer 1WA and the bumps 26 of the lower wafer 1WB are arranged opposite each other, and are electrically connected. This obtains a plurality of inter-wafer connection parts 30c. Each inter-wafer connection part 30c is insulated from other inter-wafer connection parts 30c which are adjacent to it. The semiconductor device shown in FIG. 19 includes a plurality of inter-wafer connection parts 30c. This achieves a desired semiconductor circuit including metal oxide semiconductor field effect transistors (MOS-FET) 6 provided on the substrates 1SA and 1SB that constitute the wafers 1WA and 1WB.

As shown in FIG. 19, an insulating adhesive 30 is injected into a gap between the bonding surfaces 30a and 30b of the upper and lower wafers 1WA and 1WB. The adhesive 30 maintains mechanical strength between the upper and lower wafers 1WA and 1WB.

In the semiconductor device shown in FIG. 19, the upper wafer 1WA is, for example, a thin plate having a flat and approximately circular shape. The substrate 1SA that constitutes the upper wafer 1WA is made from, for example, n-type or p-type monocrystalline silicon (Si). As shown in FIG. 19, a plurality of trench-shaped isolation parts 2 for isolating the elements are provided on a main face of the substrate 1SA (i.e. the main face of the upper wafer 1WA). The trench-shaped isolation parts 2 are formed by burying an insulating film 2b such as silicon oxide ($SiO_2$). The trench-shaped isolation parts 2 define a plurality of active regions of the main face of the substrate 1SA.

Figure 9:
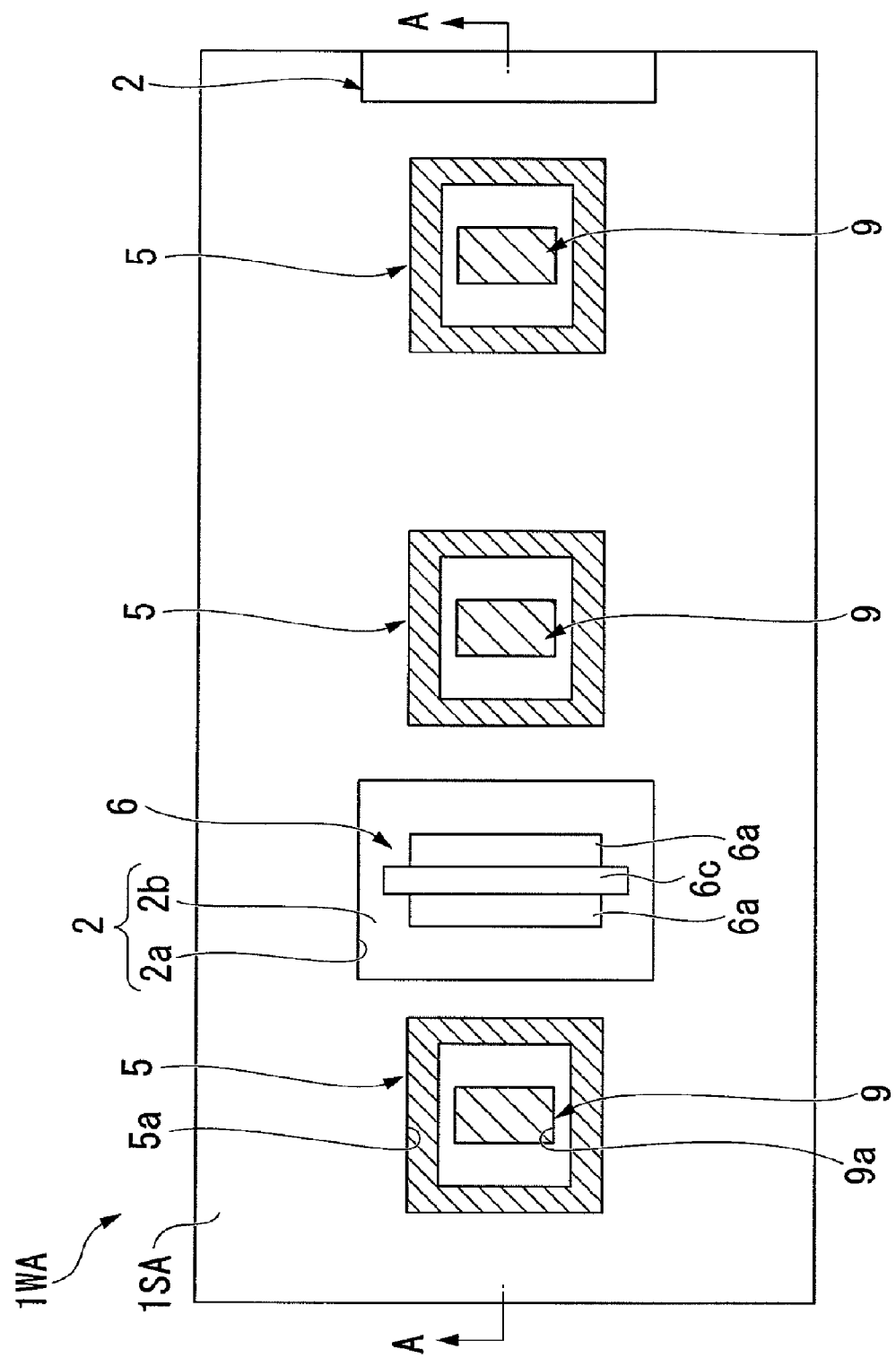
FIG. 9 is an explanatory view of a manufacturing step of the same semiconductor device.

Reference numeral 5 in the semiconductor device shown in FIG. 19 represents a penetrating isolation part 5 including an insulating film that penetrates the substrate 1SA. As shown in FIG. 19, the penetrating isolation parts 5 protrude from the bonding surface 30a. As shown in FIG. 9, each penetrating isolation part 5 has the shape of a square frame in plan view, and individually encloses each penetrating wiring part 9.

In the semiconductor device shown in FIG. 19, the penetrating wiring part 9 of the upper wafer 1WA functioning as an electrical signal connection part includes an end part 9c, which protrudes from the bonding surface 30a where the substrate 1SA is exposed.

As shown in FIG. 19, the penetrating wiring part 9 penetrates through the substrate 1SA. The penetrating wiring part 9 includes a main conductive film of tungsten, and a barrier conductive film of titanium nitride, which is thinner than the main conductive film and is deposited such as to cover side faces and a bottom face of the main conductive film. As shown in FIG. 19, the penetrating wiring part 9 is electrically connected to a bonding pad BP and the MOS-FET 6 via wirings 15a, 15b, and 15c.

The shapes of the penetrating wiring parts 9 and the bumps 26 of the semiconductor device shown in FIG. 19 will be explained using FIGS. 1A, 1B, and 2. FIG. 1A is an enlarged cross-sectional schematic view of only one part of the semiconductor device shown in FIG. 19. To facilitate explanation of the relation between the sizes of the penetrating wiring parts and the bumps, the bumps 26 are represented schematically as having a plate-like shape. Explanations of a bump foundation conductive pattern 25, the MOS-FET 6, the adhesive 30, and such like, are omitted, and the explanation of a multilayer wiring layer 10a is simplified. FIG. 1B is an enlarged cross-sectional schematic view of the inter-wafer connection parts 30c, and vicinity thereof, of the semiconductor device shown in FIG. 1A.

In the semiconductor device of this embodiment, the planar shape of the bump 26 is larger than that of the penetrating wiring part 9. Each of the bumps 26 has a periphery P. In FIGS. 1A, 1B, and 19, the penetrating wiring part 9 arranged on the right side of those diagrams is connected to the right of the center of the bump 26 arranged on the right side of the diagram. The penetrating wiring part 9 arranged on the left side of the diagram is connected to the left of the center of the bump 26 arranged on the left side of the diagram. That is, there is deviation between the width-directional central positions of the bumps 26 and the penetrating wiring parts 9. Therefore, in the semiconductor device shown in FIG. 19, as shown in FIG. 1B, the pitch P1 of the penetrating wiring parts 9 is larger than the pitch P2 of the bumps 26.

In a pre-processing stage of the substrates 1SA and SIB, the pitch P1 of the penetrating wiring parts 9 matches the pitch P2 of the bumps 26, the bumps 26 and the penetrating wiring parts 9 being arranged such that their central positions match. In subsequent processes performed in manufacturing the wafers 1WA and 1WB, such as element formation, multilayer wiring formation, and a process of thinning the wafer 1WA, the substrates 1SA and S1B change shape as they expand and contract. As a result, the upper wafer 1WA becomes larger (longer) than the lower wafer 1WB, and deviation arises between the pitch P1 of the penetrating wiring parts 9 and the pitch P2 of the bumps 26. In particular in this embodiment, the wafer 1WA becomes a thinned wafer due to the process of thinning the thickness of the substrate 1SA. This makes the substrate 1SA especially liable to warp, and its length expands considerably.

In the semiconductor device of this embodiment, the pitch P2 of the bumps 26 shown in FIG. 1B is larger than the combined size of the width L1 of the exterior of the penetrating isolation part 5 and the width L2 of the exterior of the bump 26. For example, if P2 is 50 μm, and L1 is 15 μm, L2 is less than 35 μm. This can prevent adjacent bumps 26 from becoming electrically connected via the penetrating wiring part 9. Consequently, one inter-wafer connection part 30c is reliably insulated from another adjacent inter-wafer connection part 30c.

In the semiconductor device shown in FIG. 19, the penetrating wiring parts 9 are rectangular in plan view, and the bumps 26 are square in plan view. The planar area of the inter-wafer connection part 30c that connects the bump 26 and the penetrating wiring part 9 is preferably larger than the area of the end part 9c of the penetrating wiring part 9, so as not to obstruct the electric connection between the bump 26 and the penetrating wiring part 9.

FIG. 2 is an explanatory plan view of the planar shape of the bump 26. In FIG. 2, reference code A1 represents a basic shape, reference code A2 represents a positioning margin shape, reference code A3 represents a post-processing positioning margin shape, and reference code A4 represents a corrected shape.

The basic shape A1 is a minimum planar shape required for a connection portion between the end part 9c of the penetrating wiring part 9 and the bump 26. The area of the basic shape A1 is half the area of the penetrating wiring part 9 on the bonding surface 30a (or the area of the end part 9c of the penetrating wiring part 9). In the example of FIG. 2, the planar shape of the basic shape A1 resembles the planar shape of the penetrating wiring part 9 (the shape of the end part 9c of the penetrating wiring part 9). If the area of the planar shape of the basic shape A1 is half that of the end part 9c of the penetrating wiring part 9, the basic shape A1 can be any shape. While the basic shape A1 can resemble the shape of the end part 9c of the penetrating wiring part 9, it is more preferable to alter the shape of the end part 9c to a smooth shape that can be formed easily, e.g. a square, a circle, etc.

The positioning margin shape A2 shown in FIG. 2 will be explained. Let M1 represent a positioning margin corresponding to the precision of an apparatus that positions the wafers for bonding (the upper and lower wafers 1WA and 1WB). The positioning margin shape A2 is a planar shape that encloses the end parts of the basic shape A1 with the width of the position margin M1. The positioning margin shape A2 can be obtained by enlarging the basic shape A1 at exactly the width of M1.

In the semiconductor device shown in FIG. 19, the planar shape of the bumps 26 on the bonding surface 30b is larger than the positioning margin shape A2 shown in FIG. 2. Therefore, even if the positions of the penetrating wiring parts 9 and the bumps 26 deviate within the range of the precision of the apparatus that positions the wafers for bonding, the contact area between the bumps 26 and the penetrating wiring parts 9 will be larger than half the area of the end part 9c of the penetrating wiring part 9. This ensures that the inter-wafer connection part 30c has a sufficient planar area. In this case, in comparison with a case where the planar shape of the bumps 26 is the basic shape A1, or the positioning margin shape A2, a stable connection between the penetrating wiring parts 9 and the bumps 26 can be achieved, even if the substrates 1SA and 1SB suffer warpage during manufacture of the wafers 1WA and 1WB. Therefore, a portion where the penetrating wiring part 9 and the bump 26 are not connected can be prevented. This makes the connection between the wafers 1WA and 1WB highly reliable.

The post-processing positioning margin shape A3 shown in FIG. 2 will be explained. Firstly, in the pre-processed substrate 1SA, the distance between the center of the substrate 1SA and the outermost penetrating wiring part 9 is the pre-processing distance. Then let us consider the wafer 1WA obtained after processing the substrate 1SA. The distance between the center of the wafer 1WA and the outermost penetrating wiring part 9 is the post-processing distance. The difference between the pre-processing distance and the post-processing distance, caused by warpage of the wafer 1WA, is regarded as a post-processing positioning margin M2. The post-processing positioning margin shape A3 is a planar shape obtained by enlarging the positioning margin shape A2 by the width of the post-processing positioning margin M2, and resembles the basic shape A1. The planar shape of the bumps 26 on the bonding surface 30b can be the post-processing positioning margin shape A3. In this case, even if the substrate 1SA warps during manufacture of the wafer 1WA, and there is positional deviation between the penetrating wiring part 9 and the bump 26, the connection area of the penetrating wiring part 9 and the bump 26 will be at least half that of the end part 9c of the penetrating wiring part 9. This can reliably ensure that the inter-wafer connection part 30c has a wider planar area.

The corrected shape A4 shown in FIG. 2 is a planar shape obtained by enlarging the edges of the post-processing positioning margin shape A3 toward the outside by a correction dimension M3 of no more than 2.5 μm. The corrected shape A4 resembles the basic shape A1. The correction dimension M3, which is the interval between the edge of the post-processing positioning margin shape A3 and the edge of the corrected shape A4, can be even or uneven along the edge periphery P of bump 26. Specifically, while in the corrected shape A4 shown in FIG. 2, the same correction dimension M3 is applied extending toward the outside in the long and short directions of the rectangular post-processing positioning margin shape A3, different correction lengths M3A and M3B extending toward the outside can be applied in the long and short directions. For example, the corrected shape can be a square.

When the planar shape of the bumps 26 on the bonding surface 30b is the corrected shape A4, even if positional deviation between the penetrating wiring parts 9 and the bumps 26 is larger than the post-processing positioning margin M2, the penetrating wiring parts 9 and the bumps 26 are reliably connected together. Portions where the penetrating wiring parts 9 and the bumps 26 are unconnected can thereby be prevented. Another advantage of this embodiment is that, since the correction dimension M3 is no greater than 2.5 μm, the bumps 26 do not become excessively large.

Moreover, when extending the corrected shape A4 from the edge of the post-processing positioning margin shape A3 toward the outside, instead of making the corrected shape A4 resemble the basic shape A1, it can be made into a smooth shape that can be formed easily, such as a square, a circle, or a shape close to those. This is preferable in that it enables the shape of the bumps 26 to be formed easily.

While FIG. 2 illustrates an example where each penetrating wiring part 9 includes a single wiring part, a plurality of wiring parts can be arranged as each penetrating wiring part 9 within the frame of one penetrating isolation part 5. Also, the penetrating wiring part can be a shape having an indented outline, such as a U-shape in plan view.

When the penetrating wiring part 9 includes a plurality of wiring parts, there is sometimes an overlap between respective positioning margin shapes A2, post-processing positioning margin shapes A3, and corrected shapes A4 corresponding to adjacent wiring parts. Furthermore, when the shape of the penetrating wiring part has an indented outline, there is sometimes an overlap between respective positioning margin shapes A2, post-processing positioning margin shapes A3, and corrected shapes A4 corresponding to the indented parts.

In this case, the positioning margin shape of the penetrating wiring part can be regarded as a comprehensive positioning margin shape formed by the outline of the overlapping positioning margin shapes, the post-processing positioning margin shape can be regarded as a comprehensive positioning margin shape formed by the outline of the overlapping post-processing positioning margin shapes, and the corrected shape can be regarded as a comprehensive positioning margin shape formed by the outline of the overlapping corrected shapes.

In the semiconductor device shown in FIG. 19, elements constituting a semiconductor circuit such as, for example, a metal oxide semiconductor field effect transistor (MOS-FET) 6 are fabricated in the active regions enclosed by the trench-shaped isolation parts 2. The MOS-FET 6 includes semiconductor regions for source and drain 6a, a gate insulating film 6b, and a gate electrode 6c. The semiconductor regions for source and drain 6a are fabricated by adding a desired impurity (e.g. phosphorous (P) or arsenic (As) in the case of an n-channel MOS-FET 6, or boron (B) in the case of a p-channel MOS-FET 6) to the substrate 1SA. The gate insulating film 6b includes, for example, silicon oxide, and is deposited on a main face of the substrate 1SA. The gate electrode 6c includes, for example, low-resistance Poly-Si, and is deposited over the gate insulating film 6b. An insulating film 7 over the main face of the active region of the substrate 1SA includes, for example, silicon oxide.

Instead of the MOS-FET 6 shown in FIG. 19, another active element can be deposited, e.g. a bipolar transistor, a diode, etc. Also, instead of the MOS-FET 6, a passive element can be deposited, e.g. a resistor (diffusive resistor and Poly-Si resistor), a capacitor, an inverter, etc.

In FIG. 19, reference numeral 10a represents a multilayer wiring layer, reference numerals 8a, 8b, 8c, and 8d represent interlayer insulating films, reference numeral 10 represents a surface protective film, reference numerals 15a, 15b, and 15c represent wirings, and reference numerals 16a, 16b, 16c, and 16d represent plugs. The interlayer insulating films 8a, 8b, 8c, and 8d are made from, for example, silicon oxide. The wirings 15a to 15c and the plugs 16a to 16d are made from a metal such as, for example, tungsten (W), aluminum (Al), and copper (Cu). The first-layer wiring 15a passes through the plug 16a, and electrically connects to the semiconductor regions for source and drain 6a and the gate electrode 6c of the MOS-FET 6; it also passes through the plug 16b and electrically connects to the penetrating wiring part 9. The surface protective film 10 includes, for example, a single silicon oxide film, or a stacked film made by depositing a silicon nitride film over silicon oxide. An opening 17, where part of a third-layer wiring 15c is exposed, is provided in one part of the surface protective film 10. The third-layer wiring 15c portion exposed from the opening 17 in plan view is a bonding pad (hereinafter 'pad') BP. Although not shown in FIG. 19, a bump can be provided for connecting to the pad BP on the main face of the wafer 1WA.

While in the semiconductor device shown in FIG. 19, the configuration of the lower wafer 1WB is almost the same as that of the upper wafer 1WA, the penetrating isolation parts 5 and the penetrating wiring parts 9 are not provided on the lower wafer 1WB. Another difference with respect to the upper wafer 1WA is that a bump foundation conductive pattern 25 is deposited over the opening 17 in the main face of the lower wafer 1WB, and electrically connects via the opening to the pad BP. The bump 26 is formed over the bump foundation conductive pattern 25. The bump 26 protrudes from the bonding surface 30b of the lower wafer 1WB. The bump 26 is made from a conductive material such as copper or In, and, as shown in FIG. 19, electrically connects to the uppermost wiring layer 15c of the lower wafer 1WB.

Subsequently, manufacturing processes of the semiconductor device shown in FIG. 19 will be explained using FIG. 20.

Figure 3:
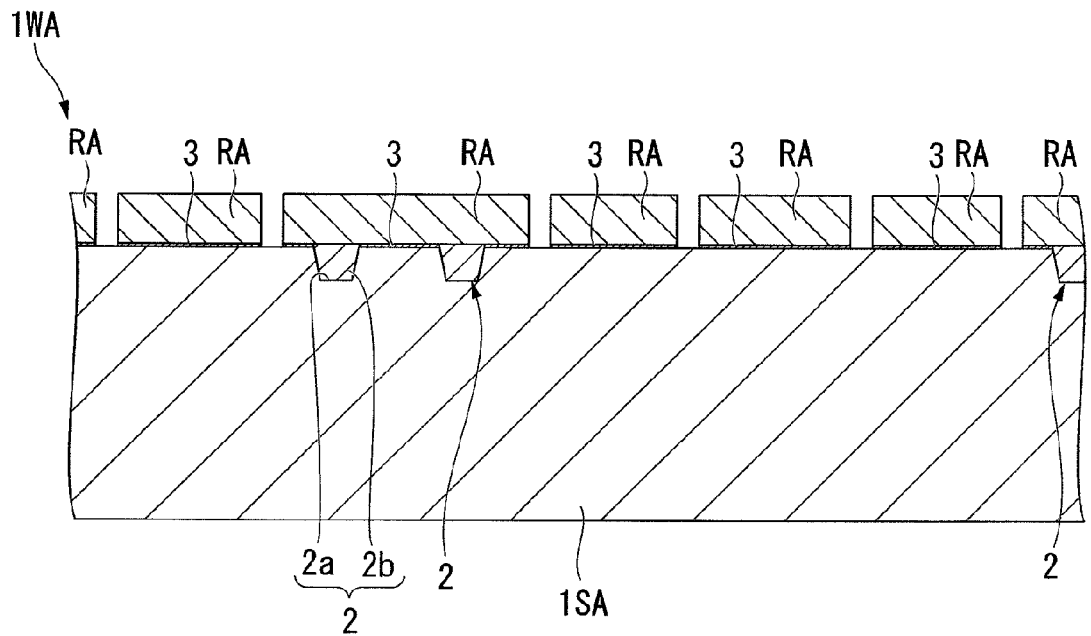
FIG. 3 is an explanatory view of a manufacturing step of the same semiconductor device.

Firstly, a manufacturing process of the upper wafer (manufacturing process of upper wafer of first layer 510 in FIG. 20) will be explained. The upper wafer 1WA is prepared (process 100A in FIG. 20). Then, as shown in FIG. 3, a trench-shaped isolation part 2 for isolating elements is formed on a main face of the substrate 1SA (i.e. the main face of the wafer 1WA) (process 101A in FIG. 20). Each isolation part 2 is formed by forming an isolation trench 2a on the main face of the substrate 1SA, and then burying a insulating film 2b of, for example, silicon oxide ($SiO_2$) in the isolation trench 2a. An insulating film 3 of silicon oxide and the like is deposited over the main face of the active region of the substrate 1SA by a process such as thermal-oxidation.

A penetrating isolation part 5 is then formed on the substrate 1SA. The main face of the substrate 1SA is coated with a resist film by rotation coating and the like, and processes of exposure and developing are then performed (this series of processes of resist coating, exposing, and developing, is known as photolithography), whereby, as shown in FIG. 3, a resist pattern RA is deposited over the main face of the substrate 1SA.

Figure 4:
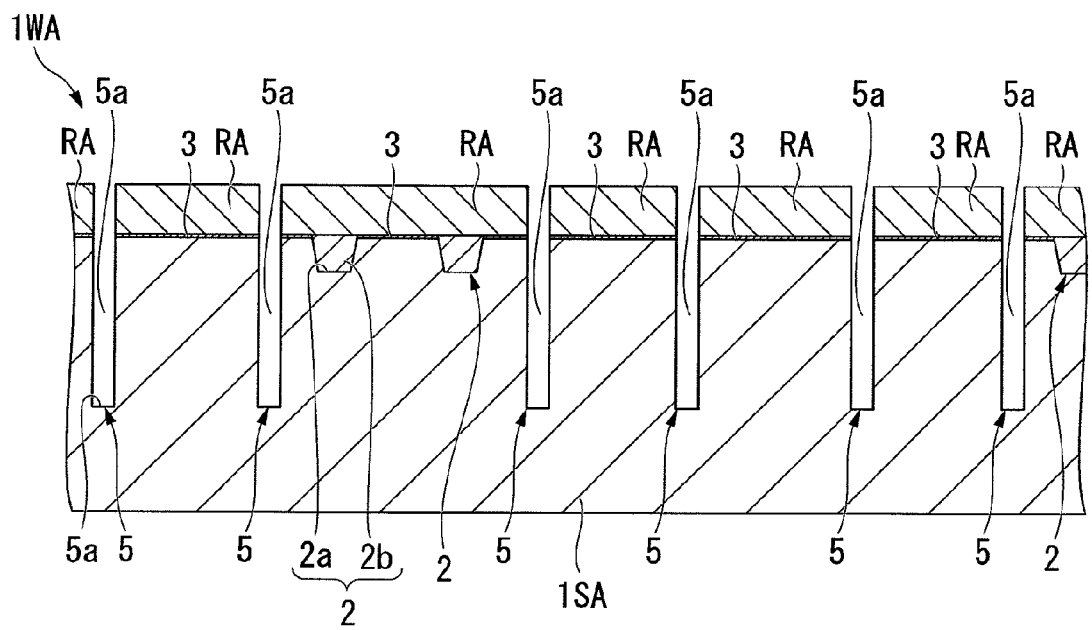
FIG. 4 is an explanatory view of a manufacturing step of the same semiconductor device.

Using the resist pattern RA as an etching mask, the substrate 1SA and the insulating film 3 exposed through it are etched, forming deep isolation trenches 5a in the substrate 1SA as shown in FIG. 4. As shown in FIG. 4, the deep isolation trenches 5a extend along a direction (vertically) intersecting the main face (i.e. the thick direction of the substrate 1SA), and terminate at positions deeper than the isolation trenches 2a for isolating elements.

Figure 5:
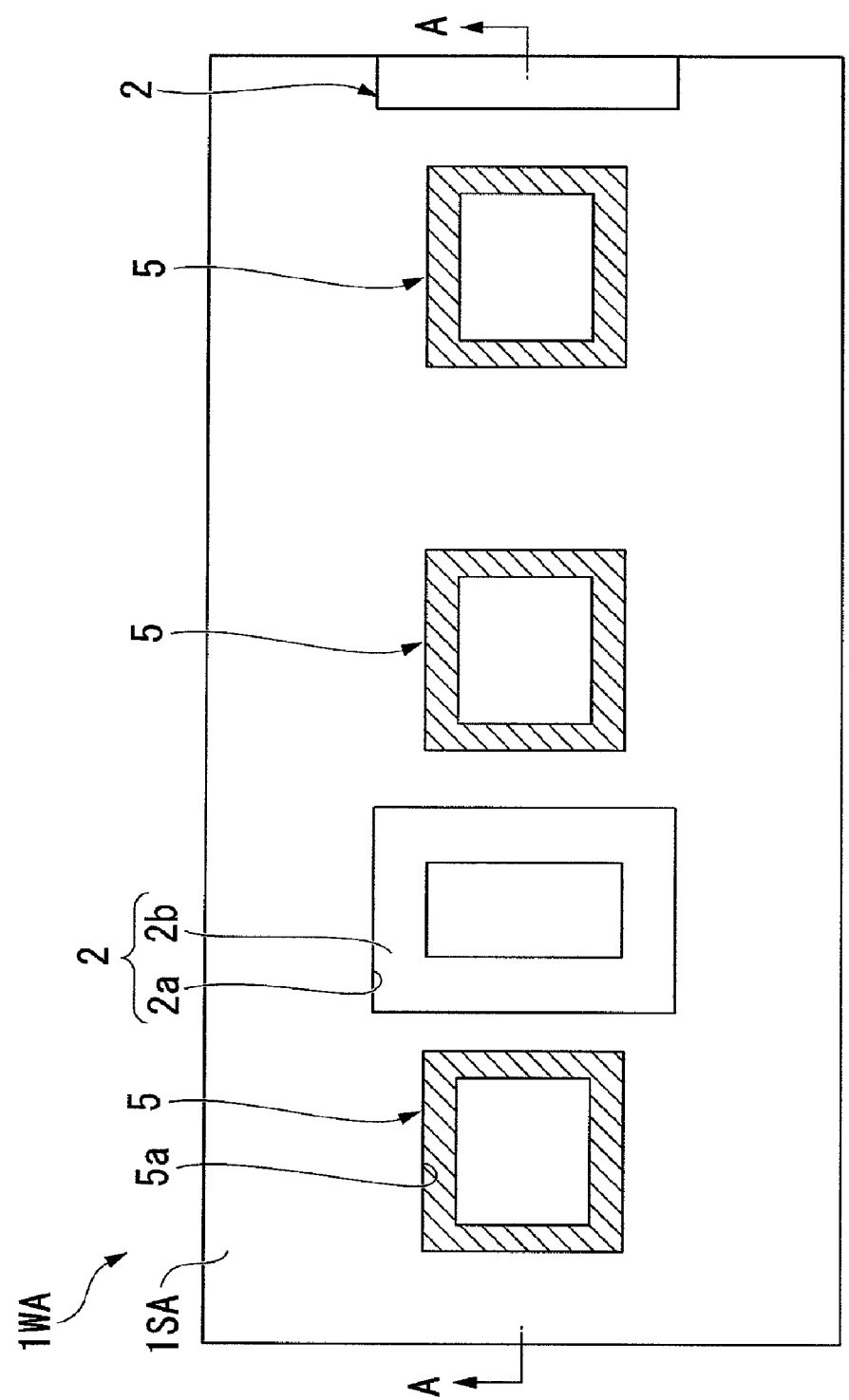
FIG. 5 is an explanatory view of a manufacturing step of the same semiconductor device.
Figure 6:
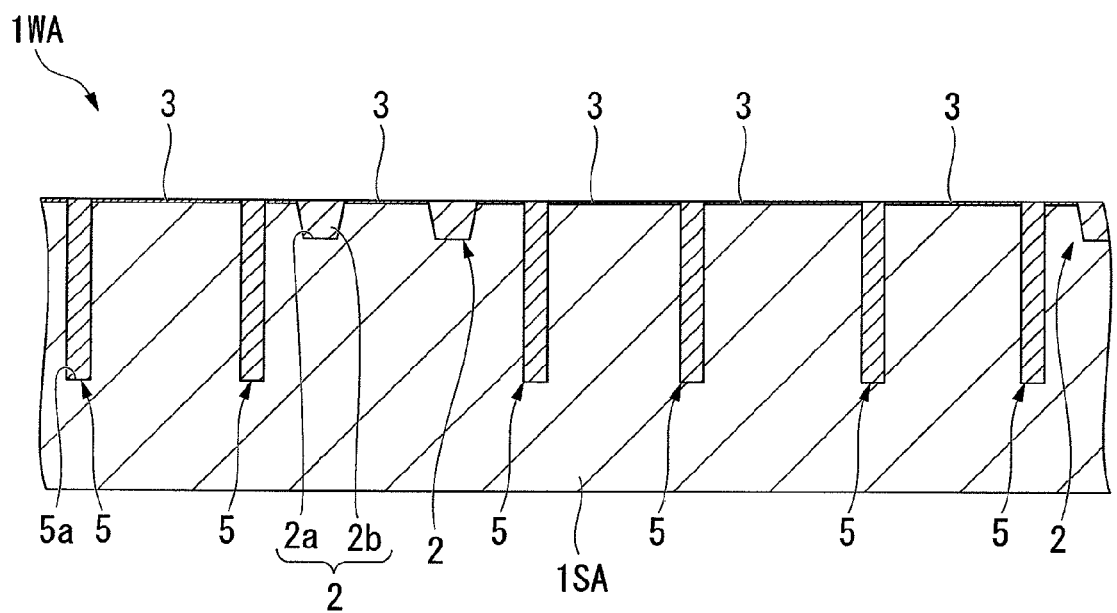
FIG. 6 is an explanatory view of a manufacturing step of the same semiconductor device.

The resist pattern RA is removed and the substrate 1SA is subjected to a thermal-oxidation process, thereby forming an insulating film of, for example, silicon oxide on the inside faces and bottom face of each deep isolation trench 5a. Over the main face of the substrate 1SA, an insulating film made of, for example, silicon oxide or a low-K (low dielectric constant) material is buried in each of the deep isolation trenches 5a by chemical vapor deposition (CVD) and the like. Superfluous portions of insulating film outside the deep isolation trenches 5a are removed through an etchback process using anisotropic dry etching, chemical mechanical polishing (CMP), and such like. As shown in FIGS. 5 and 6, this obtains a penetrating isolation part 5 including an insulating film buried in the deep isolation trench 5a (process 102A in FIG. 20).

FIG. 6 is a cross-sectional view along the line A-A of FIG. 5. Although FIG. 5 is a plan view, hatching is applied to the penetrating isolation parts 5 for ease of viewing. As shown in FIG. 5, the penetrating isolation parts 5 are formed in square frames in plan view. The depth of the penetrating isolation parts 5 (i.e. the depth of the deep isolation trenches 5a) can be greater than, equal to, or less than that of the penetrating wiring parts 9. It is preferable that the depth of the penetrating isolation parts 5 is greater than or equal to that of the penetrating wiring parts 9, since this prevents excessive weight acting on the penetrating wiring parts 9 when the upper and lower wafers 1WA and 1WB are bonded, and alleviates variation in the weight on the penetrating wiring parts 9.

Figure 7:
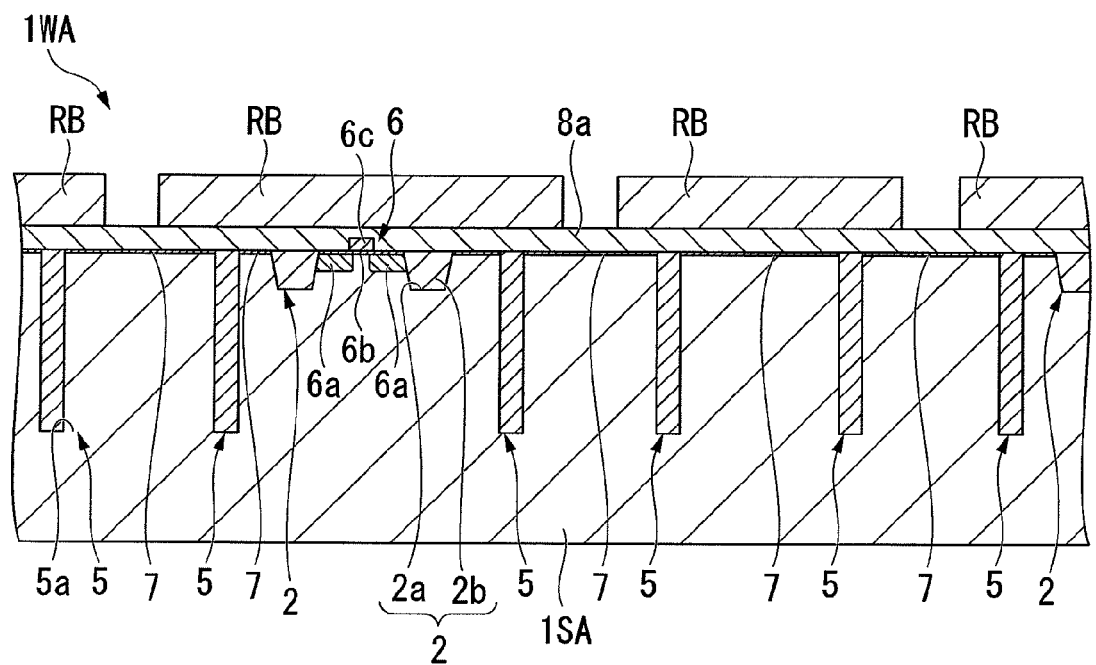
FIG. 7 is an explanatory view of a manufacturing step of the same semiconductor device.

The insulating film is then removed, and an element such as the MOS-FET 6 shown in FIG. 7, including, for example, semiconductor regions for source and drain 6a, a gate insulating film 6b, and a gate electrode 6c is fabricated in an active region enclosed by the trench-shaped isolation parts 2 of the substrate 1SA (process 103A in FIG. 20). An insulating film 7 of, for example, silicon oxide is then deposited over the main face of the active regions of the substrate 1SA.

When, for example, the penetrating isolation part 5 is formed after fabricating the MOS-FET 6, there is a danger that impurities in the substrate 1SA (the semiconductor regions for source and drain 6a and the channel-formation region under the gate electrode 6c) will be rediffused during the thermal-oxidation process of depositing the insulating film of each penetrating isolation part 5. This might result in fluctuation in electrical characteristics such as a threshold voltage of the MOS-FET 6. By contrast in this embodiment, the MOS-FET 6 is fabricated after forming the penetrating isolation parts 5, thereby preventing fluctuation in the electrical characteristics of the MOS-FET 6 arising from a high processing temperature during formation of the penetrating isolation parts 5. Therefore, the reliability of the semiconductor device can be enhanced.

Figure 8:
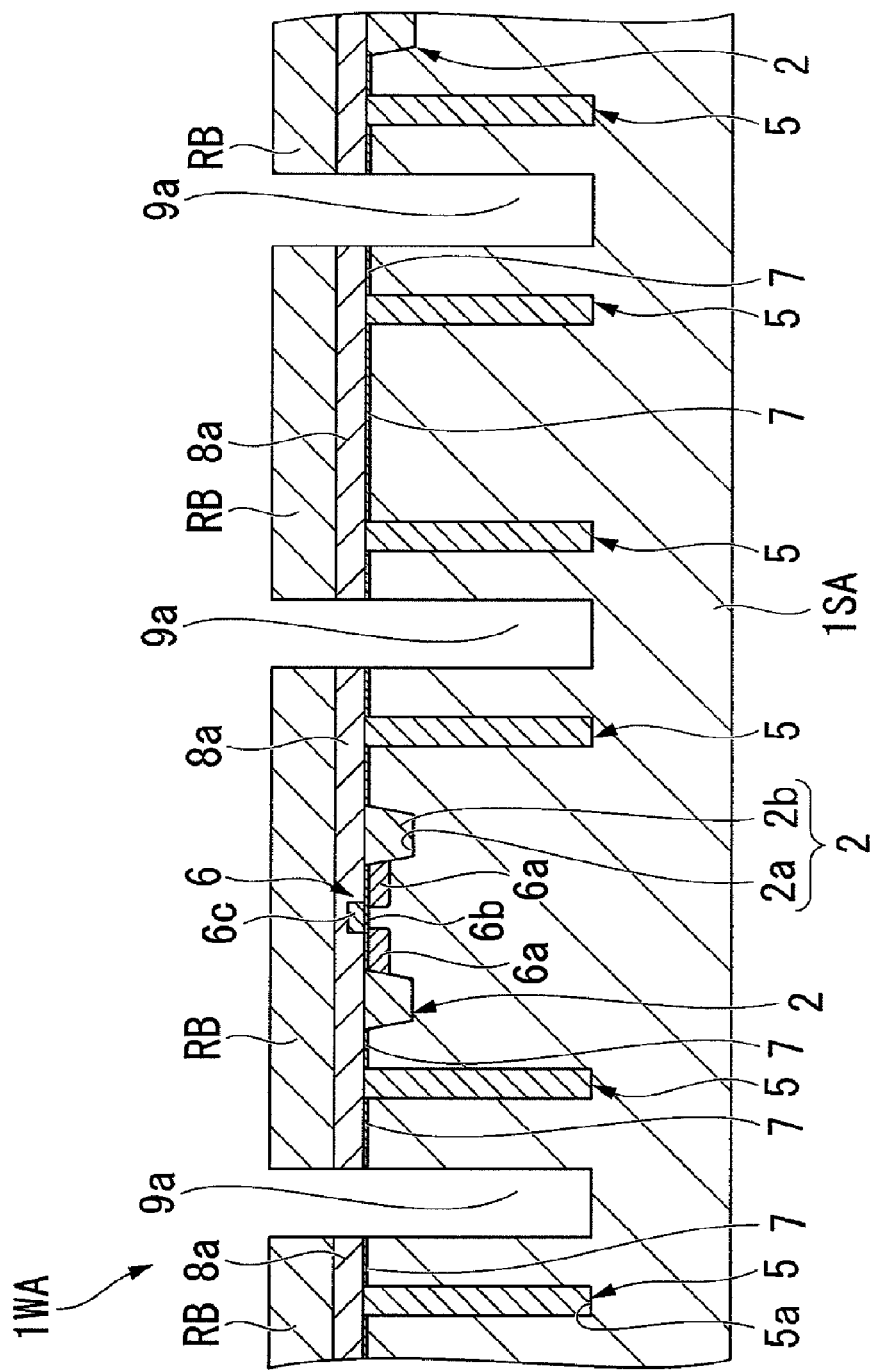
FIG. 8 is an explanatory view of a manufacturing step of the same semiconductor device.

Next, the penetrating wiring parts 9 are formed. Firstly, an insulating film of, for example, silicon oxide is deposited on the main face of the substrate 1SA by a method such as CVD. The upper face of the insulating film is flattened to form an interlayer insulating film 8a shown in FIG. 7. A resist pattern RB shown in FIG. 7 is then formed over the interlayer insulating film 8a by photolithography. As shown in FIG. 7, the resist pattern RB is formed such that regions for forming the penetrating wiring parts 9 are exposed while other areas are covered. Using this resist pattern RB as an etching mask, the interlayer insulating film 8a, the insulating film 7, and the substrate 1SA exposed from the etching mask are etched away. As shown in FIG. 8, deep conductive trenches 9a that become the penetrating wiring parts 9 are thereby formed in the substrate 1SA. The deep conductive trenches 9a extend from a upper face of the interlayer insulating film 8a along a direction (vertically) intersecting the main face (i.e. the thick direction of the substrate 1SA), and terminate at a position (second position) deeper than the isolation trenches 2a for isolating elements. The depth of these deep conductive trenches 9a is the same as that of the penetrating isolation part 5 described above. In this example, as shown in FIG. 8, the depth of the deep conductive trench 9a is the same as that of the deep isolation trench 5a.

Figure 10:
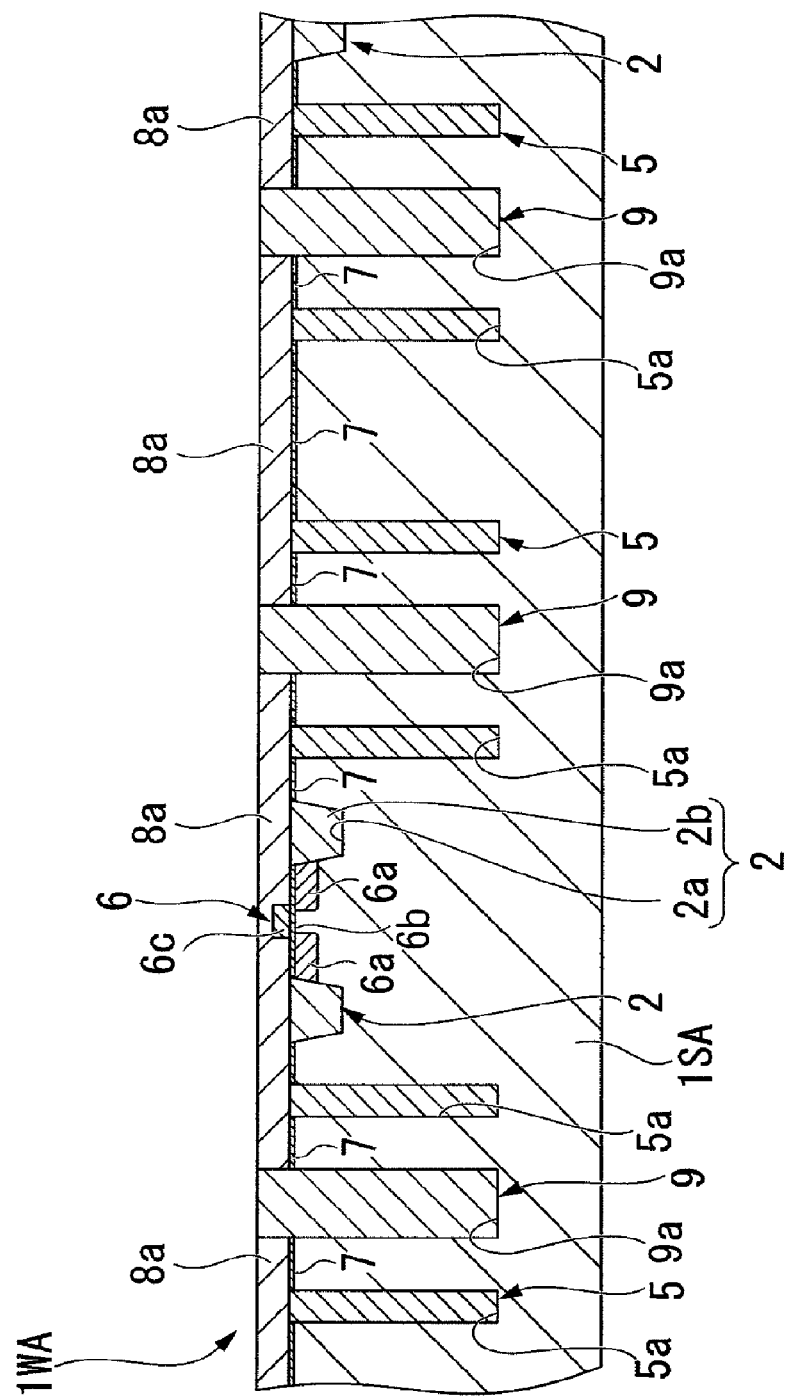
FIG. 10 is an explanatory view of a manufacturing step of the same semiconductor device.

The resist pattern RB is then removed, and a barrier conductive film is deposited on the main face of the substrate 1SA by a method such as sputtering, such as to cover the inner faces (inside faces and bottom face) of the deep conductive trench 9a. A main conductive film is buried in the deep conductive trench 9a by, for example, CVD deposition. The main conductive film is made thicker than the barrier conductive film. Superfluous portions of main conductive film and the barrier conductive film formed outside of the deep conductive trench 9a are polished and removed by CMP and the like, leaving the main conductive film and the barrier conductive film only in the deep conductive trenches 9a. As shown in FIGS. 9 and 10, this forms a conductive part that will become the penetrating wiring part 9 (process 104A in FIG. 20).

FIG. 10 is a cross-sectional view along the line A-A of FIG. 9. Although FIG. 9 is a plan view, hatching is applied to the penetrating isolation parts 5 and the penetrating wiring parts 9 for ease of viewing. As shown in FIG. 9, the penetrating wiring part 9 has the planar shape of, for example, an elongated rectangle. The penetrating wiring part 9 is arranged in the square frame of the penetrating isolation part 5 with a predetermined interval between them. That is, the penetrating wiring part 9 is enclosed by the penetrating isolation part 5, which is arranged at a predetermined distance therefrom.

The number of penetrating wiring parts 9 in each penetrating isolation part 5 is not restricted to one, it being possible to arrange a plurality of penetrating wiring parts 9 inside one penetrating isolation part 5. Also, the planar shape of the penetrating isolation part 5 is not restricted to that shown in the example of FIG. 9, and it can be another shape, such as a rectangle.

Figure 11:
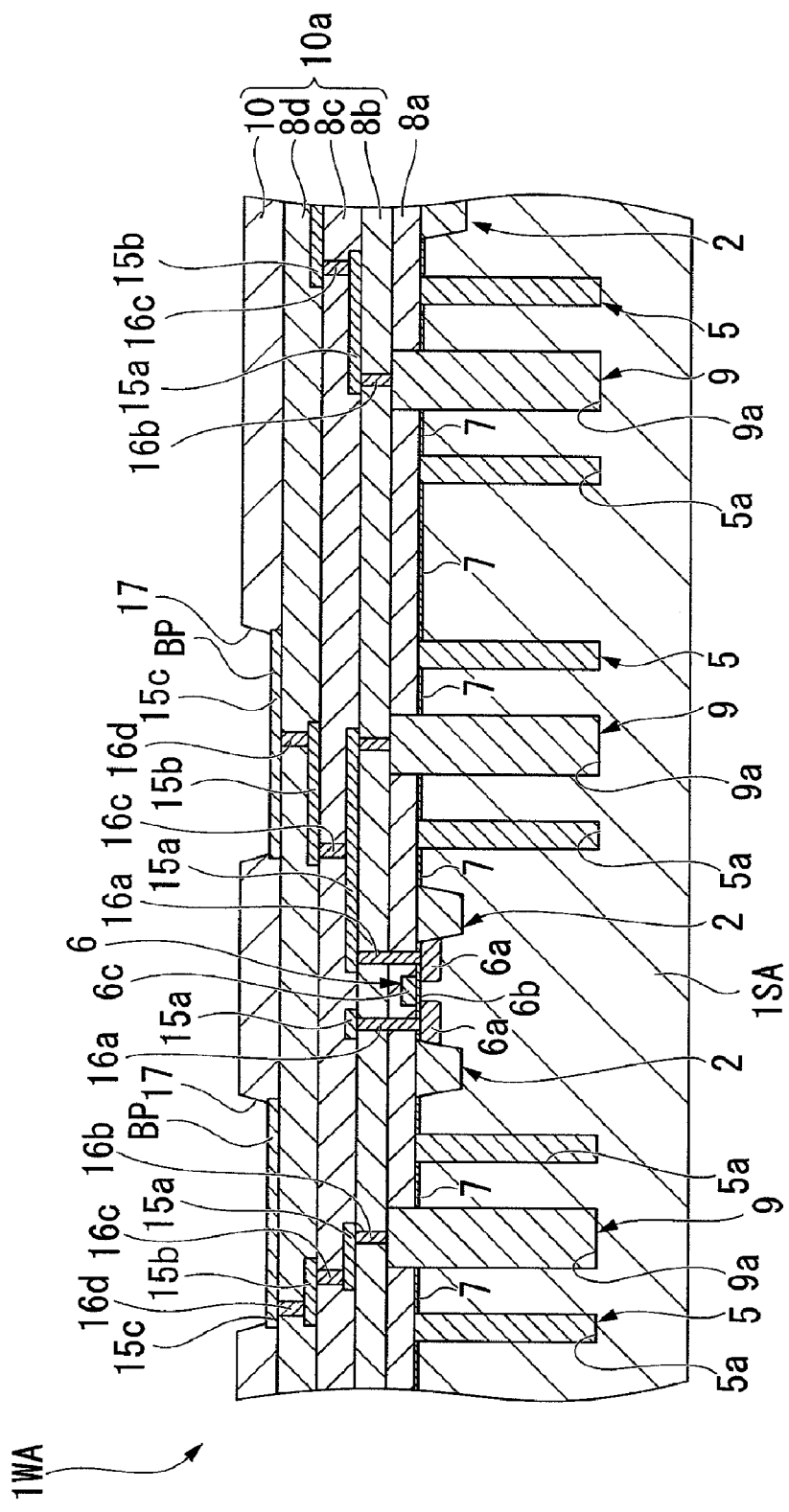
FIG. 11 is an explanatory view of a manufacturing step of the same semiconductor device.

Subsequently, as shown in FIG. 11, interlayer insulating films 8b, 8c, 8d, a surface protective film 10, wirings 15a, 15b, 15c, plugs 16a, 16b, 16c, and 16d, an opening 17, and a bonding pad BP are formed on the main face of the substrate 1SA by conventional semiconductor device wiring-formation methods, obtaining the multilayer wiring layer 10a (process 105A of FIG. 20).

Figure 12:
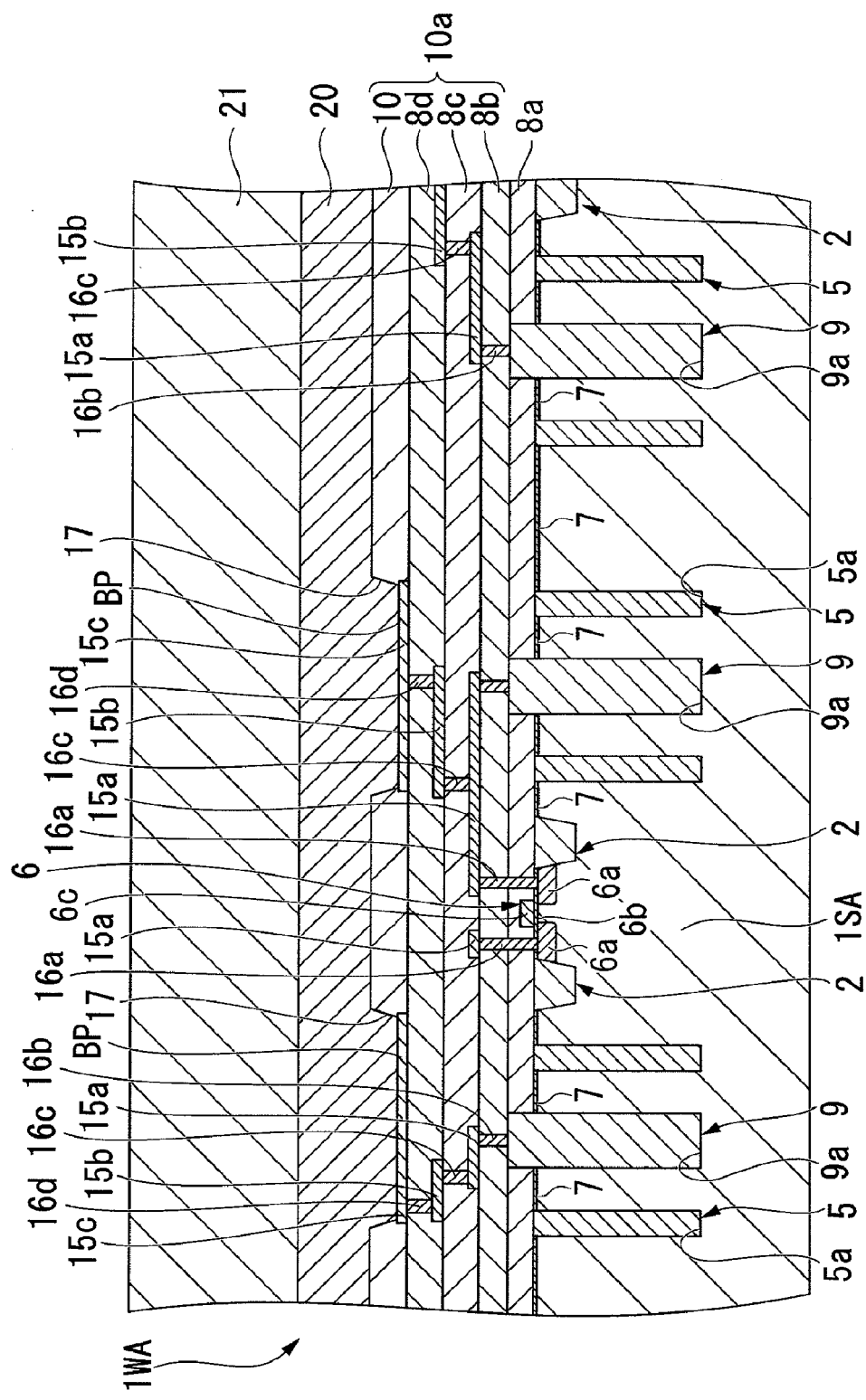
FIG. 12 is an explanatory view of a manufacturing step of the same semiconductor device.

As shown in FIG. 12, a glass support substrate 21 is then bonded over the main face of the wafer 1WA interposing an adhesive sheet 20 therebetween. By bonding this glass support substrate 21 over the main face of the wafer 1WA, handling of the waver 1WA can be stabilized. Also, the mechanical strength of the thin wafer 1WA following a later thinning process can be maintained. Subsequently, a thinning process is performed to the wafer 1WA (process 107A in FIG. 20). Due to this thinning process, each wafer considerably expands and contracts, and there is considerable positional deviation among electrodes of the wafers, making electrical connection between the wafers problematic. As described below, the thinning process of the wafer 1WA of this embodiment includes a first thinning process, a second thinning process, and a third thinning process.

Figure 13:
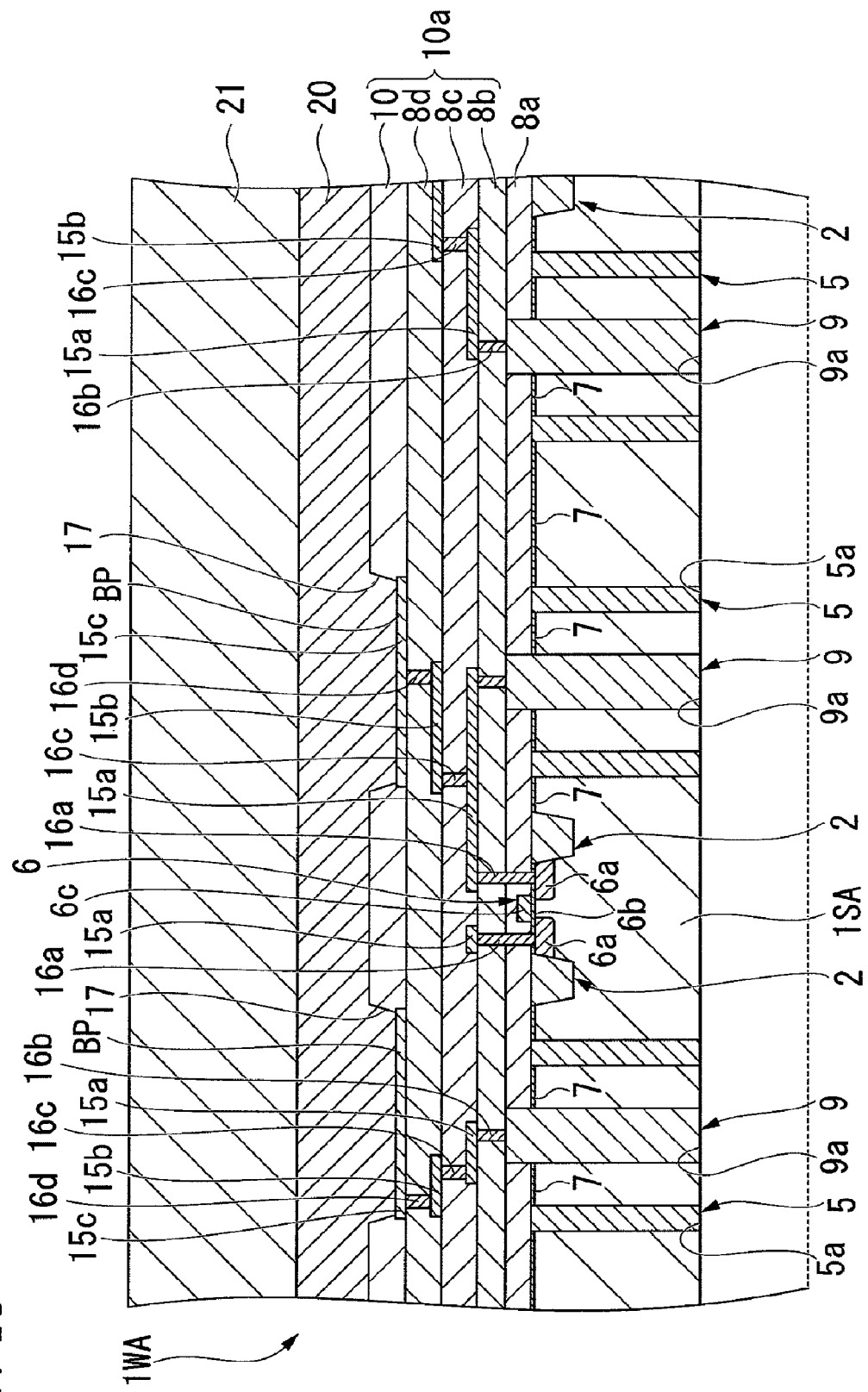
FIG. 13 is an explanatory view of a manufacturing step of the same semiconductor device.

The broken line in FIG. 13 represents the substrate 1SA before a first thinning process. As shown in FIG. 13, in the first thinning process, with the glass support substrate 21 securely attached to the main face of the wafer 1WA, a backside of the wafer 1WA (i.e. the backside of the substrate 1SA) is grinded to a desired thickness. The first thinning process utilizes a mechanical method such as grinding. The first thinning process ends without reaching the penetrating isolation part 5 and the penetrating wiring part 9 (i.e. without exposing the penetrating isolation part 5 and the penetrating wiring part 9 from the backside of the wafer 1WA).

In a second thinning process, the backside of the wafer 1WA is polished. The second thinning process combines chemical and mechanical elements, such as CMP. As shown in FIG. 13, the second thinning process ends when it reaches the penetrating isolation part 5 and the penetrating wiring part 9 (i.e. when the penetrating isolation part 5 and the penetrating wiring part 9 are exposed from the backside of the wafer 1WA).

By executing the first and second thinning processes, the duration of the wafer thinning process can be shortened. The second thinning process can remove a damaged layer on the backside of the wafer 1WA by the grinding performed in the first thinning process, while smoothening the backside, achieving uniform chemical stability in the backside. Consequently, in a later etching process (third thinning process) of the backside portion of the wafer 1WA, the amount removed by etching in the thick direction of the wafer 1WA can be made uniform across its entire backside.

Figure 14:
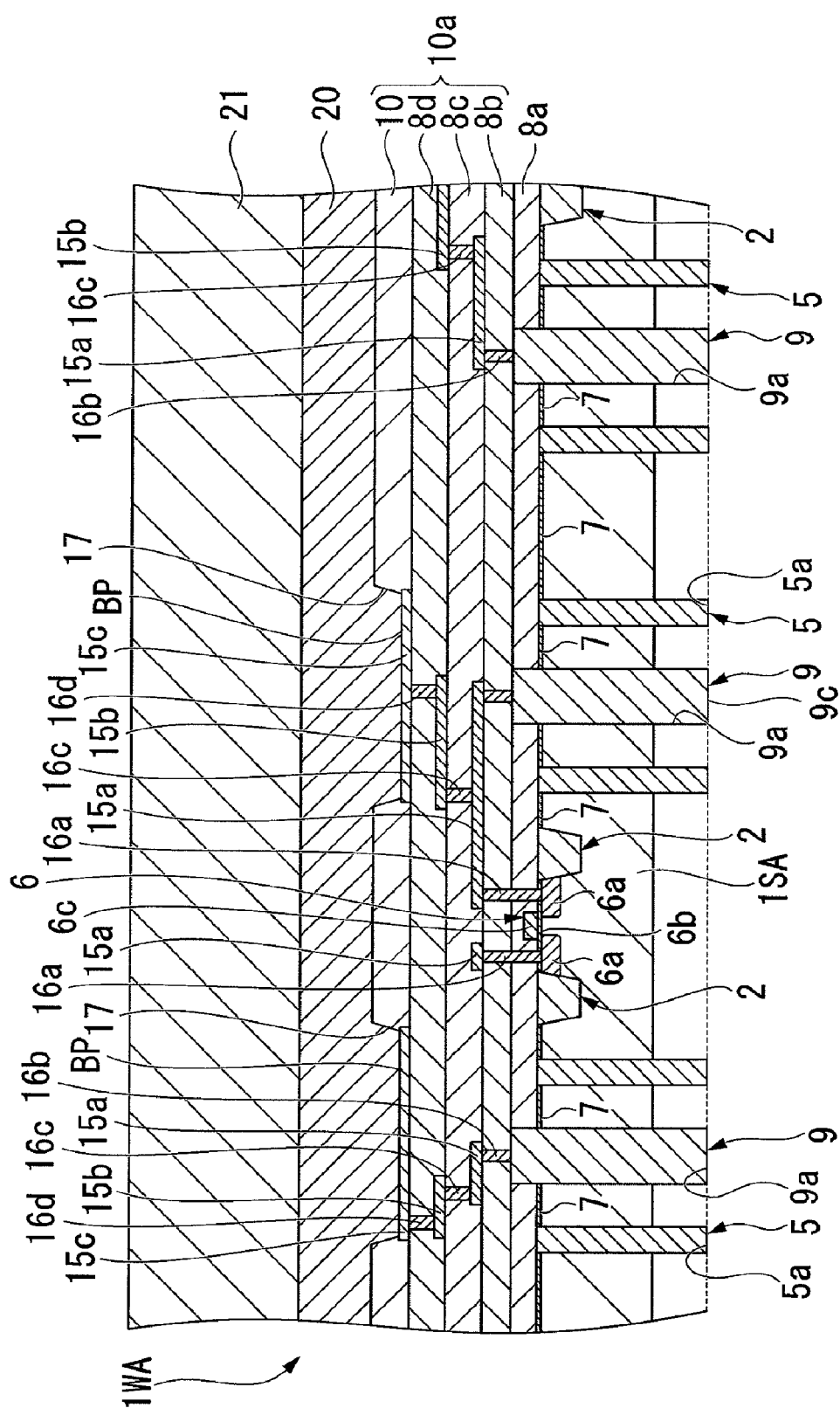
FIG. 14 is an explanatory view of a manufacturing step of the same semiconductor device.

In the third thinning process, with the glass support substrate 21 securely attached to the main face of the wafer 1WA, the backside of the wafer 1WA is immersed in a chemical solution, and the substrate 1SA is etched (using one of both of wet etching and dry etching). As shown in FIG. 14, this exposes one part of the penetrating isolation part 5 and the end parts 9c of the penetrating wiring part 9 from the backside of the wafer 1WA, and makes the penetrating wiring part 9 protrude from the bonding surface 30a.

FIG. 14 is a cross-sectional view of primary parts of the upper wafer 1WA after the third thinning process. A broken line in FIG. 14 represents the substrate 1SA before the third thinning process. As shown in FIG. 14, in the upper wafer 1WA after the third thinning process, a part of the lower parts of the penetrating isolation part 5 and the penetrating wiring part 9 protrude for a desired length from the backside of the wafer 1WA after the third thinning process, i.e. from the bonding surface 30a. As shown in FIG. 14, the length of the penetrating isolation part 5 that protrudes from the backside of the wafer 1WA is the same as that of the end part 9c of the penetrating wiring part 9. The protruding lengths of the penetrating isolation part 5 and the penetrating wiring part 9 from the backside of the wafer 1WA are not restricted to those shown in FIG. 14, and can be determined as appropriate, after considering the interval between the bonding surfaces 30a and 30b of the upper and lower wafers 1WA and 1WB etc.

As a result of the third thinning process, the penetrating isolation part 5 isolates the penetrating wiring part 9 from the substrate 1SA in its side-face direction, and the lower part of the penetrating wiring part 9 is isolated by exposure from the substrate 1SA, ensuring complete electrical isolation from the substrate 1SA. At this stage, the deep isolation trench 5a and the deep conductive trench 9a are holes that penetrate between the main and back sides of the substrate 1SA.

While in the example of the thinning process of the wafer 1WA described above, the first thinning process (grinding), the second thinning process (polishing), and the third thinning process (etching) are performed sequentially, it would be acceptable to omit the first thinning process (grinding) and the second thinning process (polishing).

The manufacturing process of the upper wafer 1WA thus ends.

Subsequently, processes of manufacturing the lower wafer 1WB will be explained. As an example of a lower wafer, this explanation describes a manufacturing process of a wafer of the lowermost layer which will not have another wafer bonded to its backside (the process 512 of manufacturing the lower wafer on and after the second layer in FIG. 20). The processes of manufacturing the lower wafer, which is the lowermost layer wafer, are almost the same as the processes of manufacturing the upper wafer 1WA (processes 100A to 107A of FIG. 20). The processes of manufacturing the wafer of the lowermost layer differ from that of upper wafer 1WA in that a bump formation process (process 106B) is performed after the process of forming a multilayer wiring layer (process 105B) in FIG. 20, whereas none of a waver thinning process (process 107A), a penetrating isolation part formation process (process 102B), and a penetrating wiring part formation process (process 104B) is performed.

Figure 15:
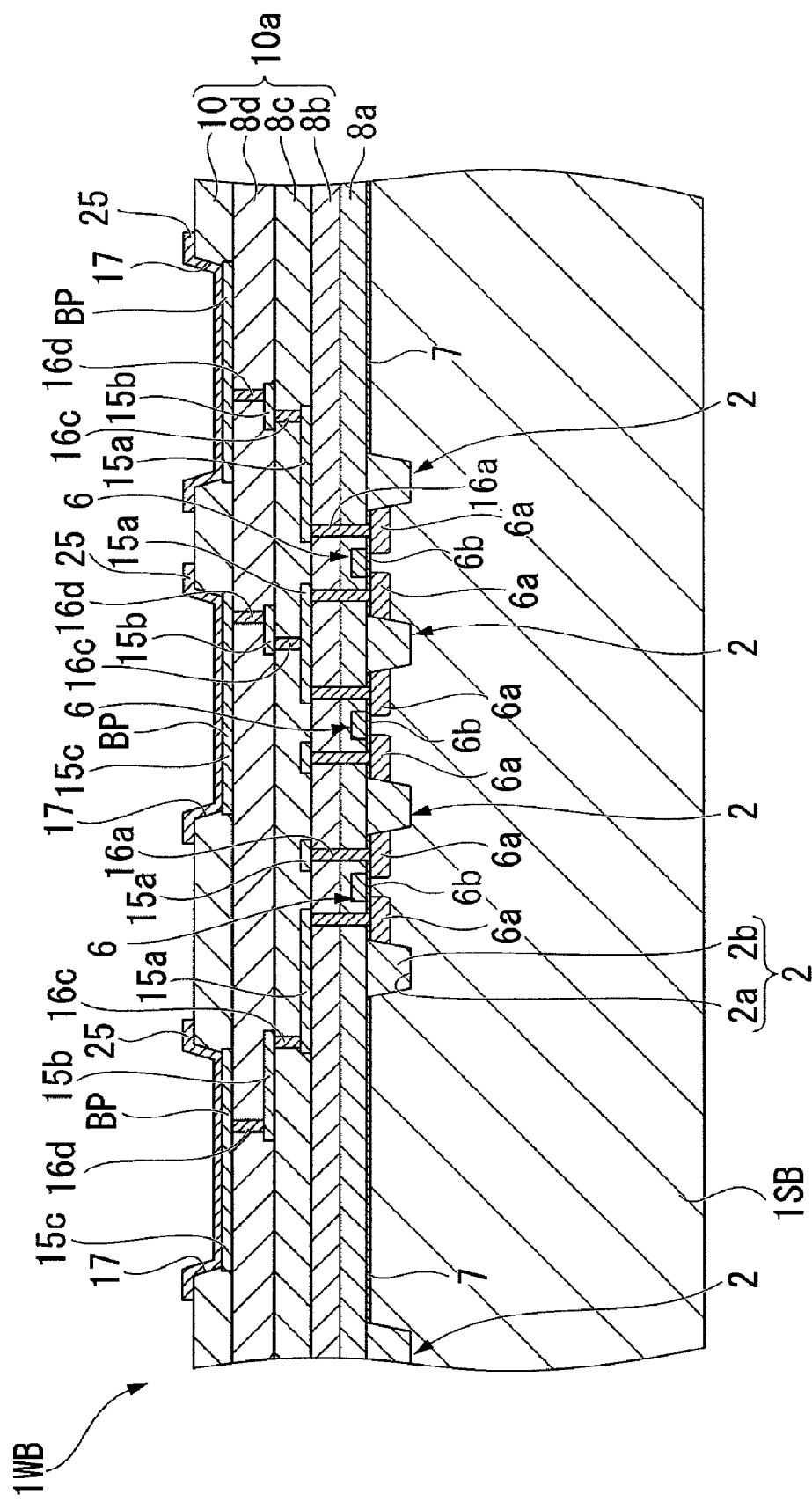
FIG. 15 is an explanatory view of a manufacturing step of the same semiconductor device.

FIG. 15 is a cross-sectional view of primary parts of a lower wafer (lowermost layer wafer) 1WB during a stage of the bump formation process 106B through processes 100B to 105B in FIG. 20 (where processes 102B and 104B are not performed). After the multilayer wiring layer formation process 105B, a conductive film is deposited over the main face of the wafer 1WB by sputtering and the like, and this is patterned by photolithography and etching to form the bump foundation conductive patterns 25.

Figure 16:
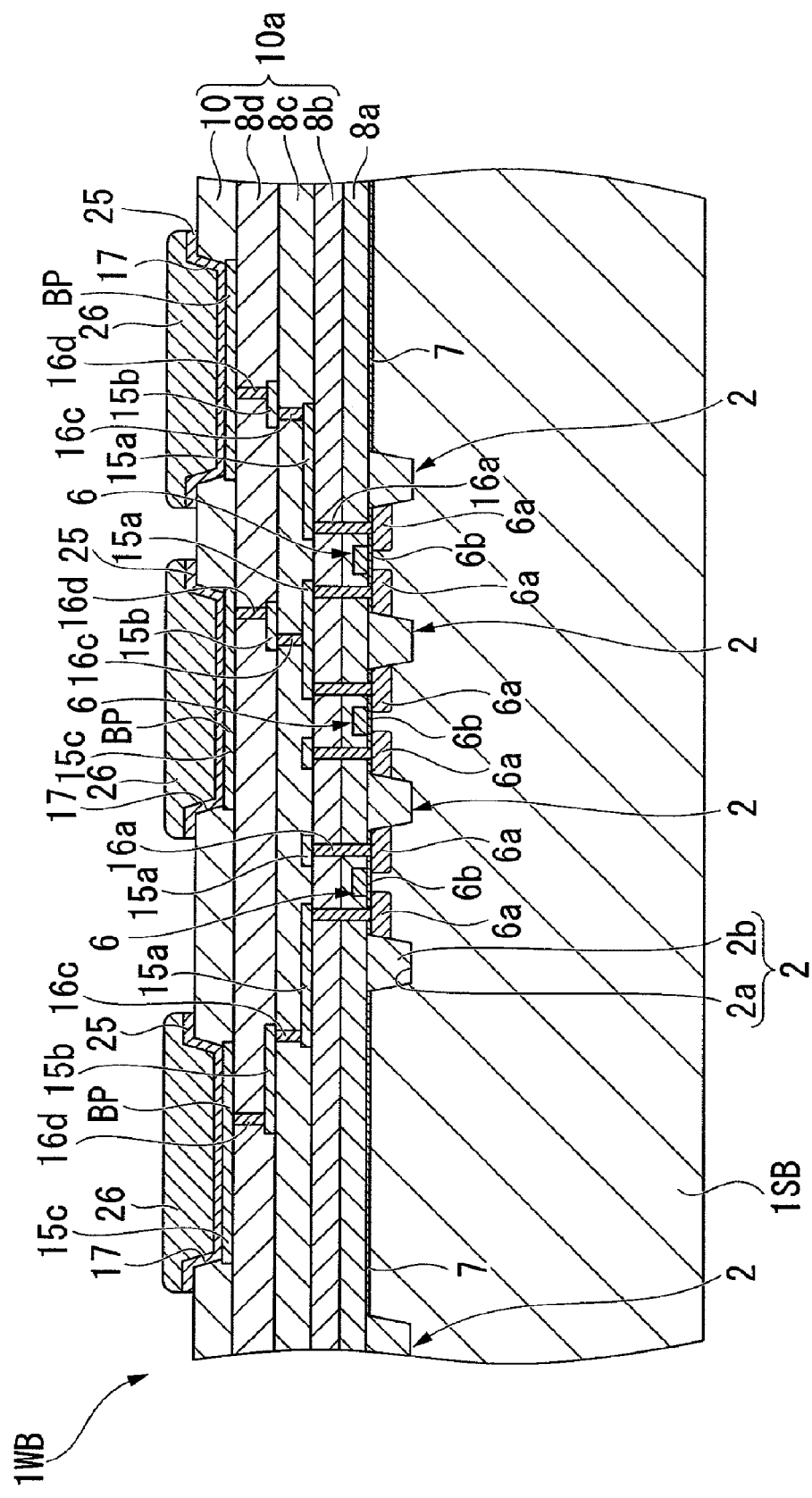
FIG. 16 is an explanatory view of a manufacturing step of the same semiconductor device.

As shown in FIG. 16, a bump 26 is formed on each bump foundation conductive pattern 25 exposed at the main face of the lower wafer 1WB (bonding surface 30a), using a method such as lift-off, electrolytic plating, printing, or ball drop. The bump 26 is formed in a state of protrusion from the bonding surface 30b. As regards the plan-face arrangement of the bumps 26, their centers are arranged opposite the centers of the penetrating wiring part 9 to be arranged on the pre-processed substrate 1SA that will become the upper wafer 1WA.

Thus the processes of manufacturing the lower wafer 1WB end.

Figure 17:
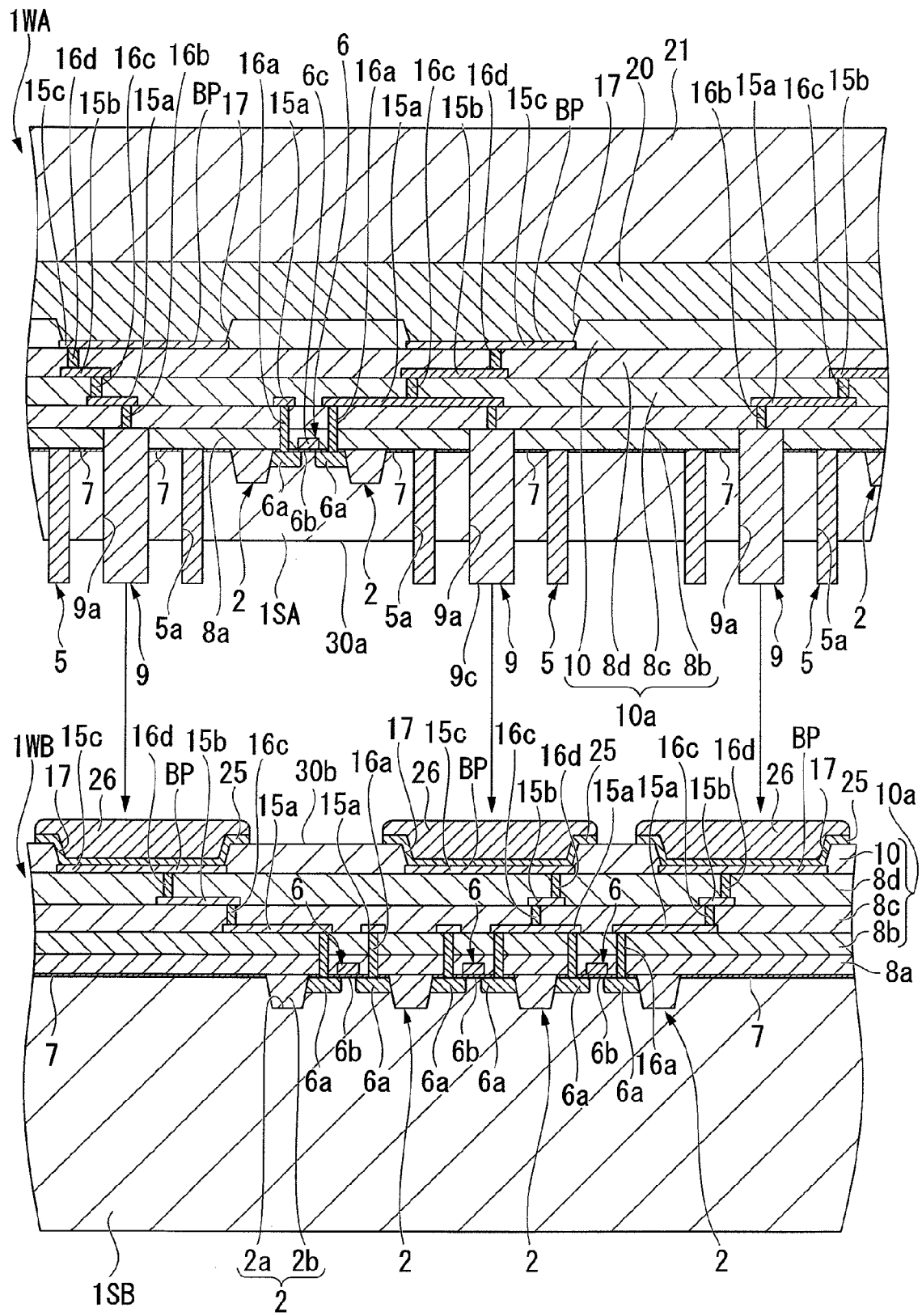
FIG. 17 is an explanatory view of a manufacturing step of the same semiconductor device.

The lower wafer of the second layer (lower wafer 1WB) is then stacked (arrow 520 in FIG. 20). That is, the upper and lower wafers 1WA and 1WB manufactured in the manner described above are bonded together (process of bonding upper and lower wafers of the first and second layers 514 in FIG. 20). Firstly, as shown in FIG. 17, the lower wafer 1WB shown in FIG. 16 is secured. Then, the upper wafer 1WA shown in FIG. 14 is arranged above the main face (bonding surface 30b) of the lower wafer 1WB, with its backside (bonding surface 30a) opposite the main face of the lower wafer 1WB.

The upper wafer 1WA and the lower wafer 1WB are then positioned relative to each other. Specifically, the bumps 26 on the main face of the lower wafer 1WB are aligned with the corresponding penetrating wiring parts 9 on the backside of the upper wafer 1WA (process 201 in FIG. 20).

At this time, there is positional deviation between the centers of the bumps 26 on the lower wafer 1WB and the corresponding penetrating wiring parts 9 of the upper wafer 1WA. This deviation is caused by the positioning precision of the device that positions the wafers, warpage (wafer bow) of the substrates during the processes of manufacturing the wafers 1WA and 1WB, and so on.

Figure 18:
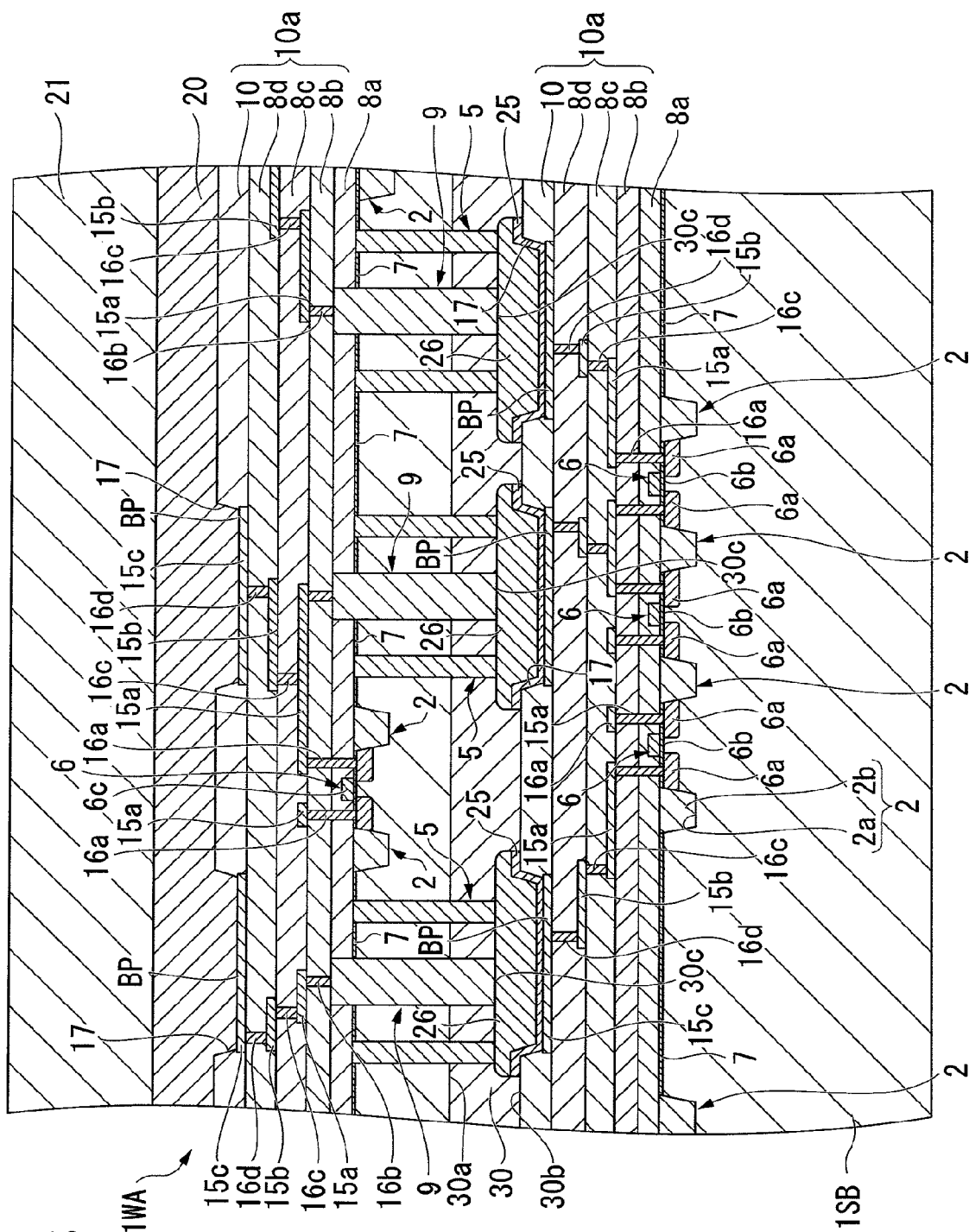
FIG. 18 is an explanatory view of a manufacturing step of the same semiconductor device.

As shown in FIG. 18, the opposing faces (bonding surfaces 30a and 30b) of the upper and lower wafers 1WA and 1WB are brought closer together until they are stacked in contact, and the bumps 26 of the main face of the lower wafer 1WB are electrically connected to the penetrating wiring part 9 on the backside of the upper wafer 1WA. The semiconductor circuit parts of the upper and lower wafers 1WA and 1WB are thereby electrically connected to form a desired semiconductor circuit (process 202 in FIG. 20).

Each of the bumps 26 on the main face of the lower wafer 1WB is connected to the penetrating wiring part 9, and is within the frame of the penetrating isolation part 5. However, in this embodiment, the interval between the bonding surfaces 30a and 30b is set sufficiently wide with respect to the height of the bumps 26 such that there is no contact between the wafer 1WA and the bumps 26.

An insulating adhesive 30 is injected in the gap between the opposing bonding surfaces 30a and 30b of the upper and lower wafers 1WA and 1WB (process 203 in FIG. 20). The glass support substrate 21 is removed from the main face of the upper wafer 1WA, obtaining the semiconductor device shown in FIG. 19.

After these processes, the semiconductor device shown in FIG. 19 is cut into chip units to obtain chips. Each of these chips has a three-dimensional configuration including a plurality of stacked wafers. That is, since semiconductor circuits of the wafers constituting each chip are electrically connected via the penetrating wiring parts 9 and the bumps 26, one desired semiconductor integrated circuit as a whole is fabricated on the chip.

In the semiconductor device of this embodiment, each inter-wafer connection part 30c is insulated from another adjacent inter-wafer connection part 30c, and the planar shape of each bump 26 is larger than the positioning margin shape A2 obtained by enclosing the basic shape A1 that is half the area of the penetrating wiring part 9 with the width of the positioning margin dimension M1. This makes it easier to align the bumps 26 and the penetrating wiring parts 9 opposite each other between the wafers 1WA and 1WB. Therefore, the semiconductor device of this embodiment can prevent unconnected portions between the bumps 26 and the penetrating wiring parts 9, even if the substrates 1SA and 1SB suffer warpage at the time of manufacturing the wafers 1WA and 1WB. This achieves a highly reliable connection between the bumps 26 and the penetrating wiring parts 9.

The semiconductor device of this embodiment is also preferable in that, since the planar shape of the bumps 26 is larger than that of the penetrating wiring parts 9, in comparison with when the planar shape of the penetrating wiring parts 9 is larger than that of the bumps 26, the planar shape can be easily changed without altering the arrangement of other members and altering the manufacturing processes.

Figure 21:
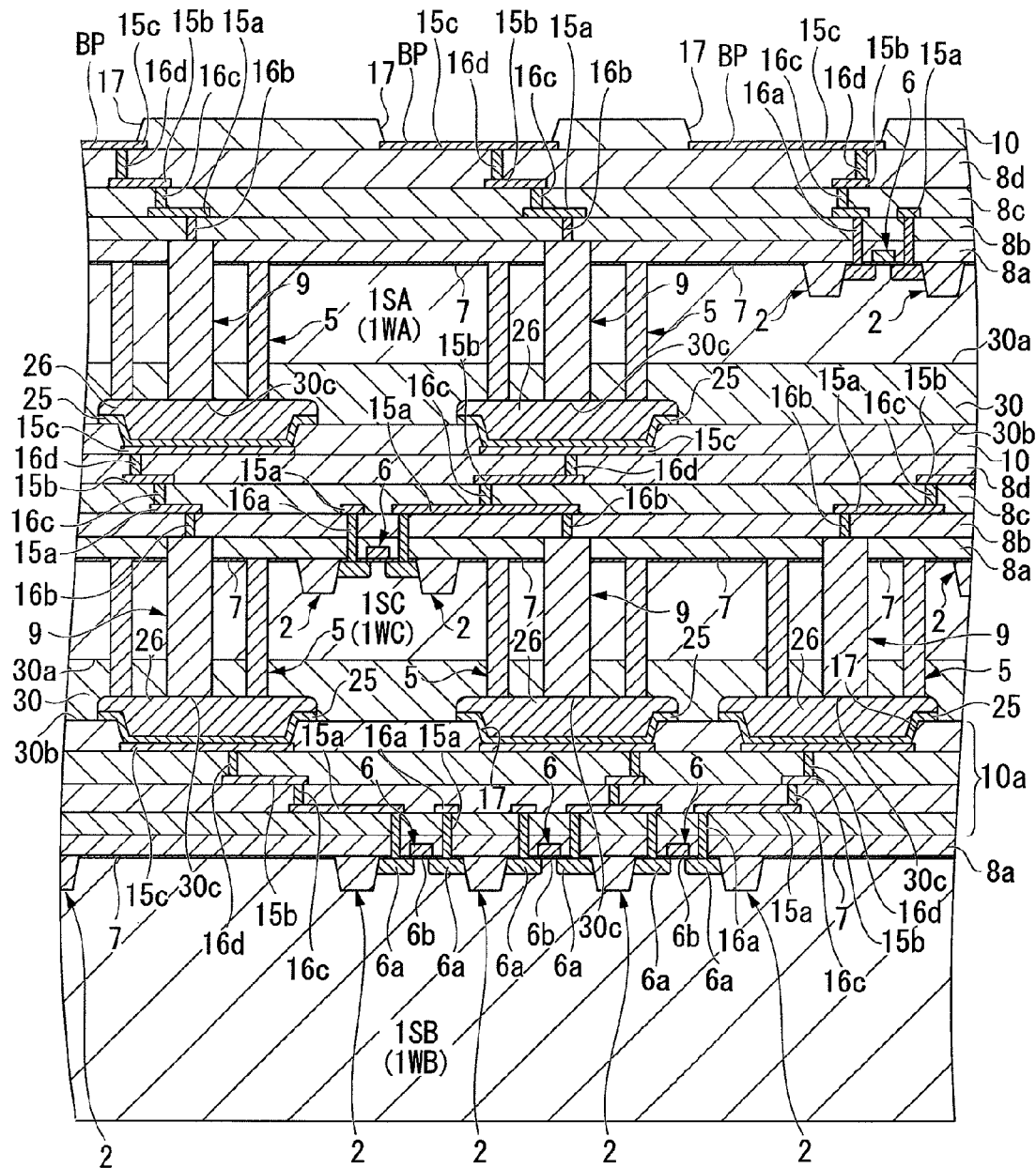
FIG. 21 is a cross-sectional view of primary parts of a modification of the same semiconductor device.

The invention is not limited to the examples described above. For example, while FIG. 19 illustrates an example of a semiconductor device including two bonded wafers 1WA and 1WB, the number of bonded wafers need only be a plurality, and can be three or more. FIG. 21 is a cross-sectional view of primary parts of another example of a semiconductor device of the invention. The semiconductor device shown in FIG. 21 is a three-dimensional semiconductor device having a multilayer configuration formed by laminating substrates 1SA, 1SB, and 1SC in three layers. In the semiconductor device shown in FIG. 21, like members to those in FIG. 19 are designated by like reference numerals, and are not repetitiously explained.

Subsequently, an example of a process of manufacturing the semiconductor device shown in FIG. 21 will be explained using FIG. 20. Firstly, in the manner described in FIGS. 3 to 14, the wafer 1WA of the uppermost layer is prepared. As described in FIGS. 15 and 16, the wafer 1WB of the lowermost layer is also prepared.

Also, a wafer 1WC of an intermediate layer is prepared through processes 100B to 106B of FIG. 20. As with the wafer 1WA of the uppermost layer, penetrating isolation parts 5 and penetrating wiring parts 9 are formed on the wafer 1WC of the intermediate layer. The wafer 1WC of the intermediate layer differs from the wafer 1WA of the uppermost layer in that a bump foundation conductive pattern 25 and bumps 26 are formed on the main face of the wafer 1WC of the intermediate layer. At this stage, the wafer 1WC of the intermediate layer is still thick, since it has not been subjected to the first to third thinning processes.

Figure 30:
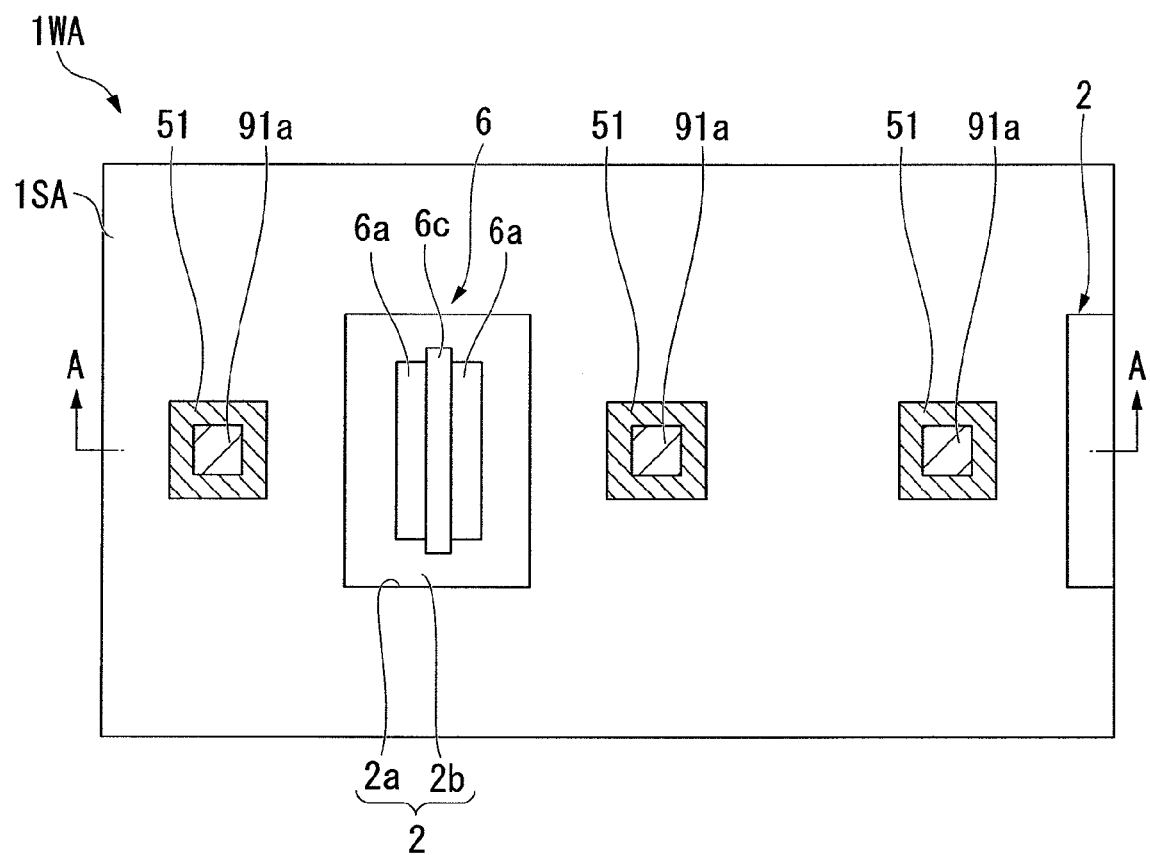
FIG. 30 is an explanatory view of a manufacturing step of the same semiconductor device.

In the manner described in FIGS. 17 and 18, the two wafers 1WA and 1WC are superimposed, an insulating adhesive 30 is injected between them, and they are bonded together (upper and lower wafer bonding process 516 on and after the third layer in FIG. 30). Since the wafer 1WC of the intermediate layer is still thick at this time, it can be stabilized and handled easily.

With the glass support substrate 21 still bonded to the main face of the wafer 1W of the upper-side uppermost layer, the thickness of the wafer 1WC of the lower intermediate layer is reduced from its backside using a thinning process similar to that described in FIGS. 13 to 14 (process 107A in the center of FIG. 20). The penetrating isolation parts 5 and the penetrating wiring parts 9 are thereby exposed (made to protrude) from the backside (bonding surface 30a) of the wafer 1WC of the lower intermediate layer. Since the thickness of the wafer 1WC of the intermediate layer is reduced with the two wafers 1WA and 1WC still bonded together, this maintains mechanical strength of the wafer 1WC during the thinning process, and also enables it to be handled more stably.

Thereafter, with the glass support substrate 21 still bonded to the main face of the wafer 1WA of the upper-side uppermost layer, in the same manner as described in FIGS. 17 and 18, the wafer 1WC of the intermediate layer and the wafer 1WB of the lowermost layer are superimposed, and bonded together by injecting the insulating adhesive 30 (processes 201 to 203 at the bottom of the center of FIG. 20). Subsequent processes are the same as those described above, and are not repetitiously explained. When laminating three or more wafers, the processes performed on the wafer 1WC of the intermediate layer and the wafer bonding process can be repeated.

In the semiconductor device shown in FIG. 21, the inter-wafer connection part 30c is insulating from other adjacent inter-wafer connection parts 30c, and the planar shape of the bumps 26 is larger than the positioning margin shape A2, obtained by extending the basic shape A1, which is half the area of the penetrating wiring part 9, by the width of the positioning margin dimension M1. Thus the bumps 26 and the penetrating wiring parts 9 can easily be aligned opposite each other between the wafers 1WA, 1WB, and 1WC. Therefore, the semiconductor device of this embodiment can prevent unconnected portions between the bumps 26 and the penetrating wiring parts 9, even if the substrates 1SA, 1SB, and 1SC suffer warpage at the time of manufacturing the wafers 1WA, 1WB, and 1WC. This achieves a highly reliable connection between the bumps 26 and the penetrating wiring parts 9.

Second Embodiment

Figure 22:
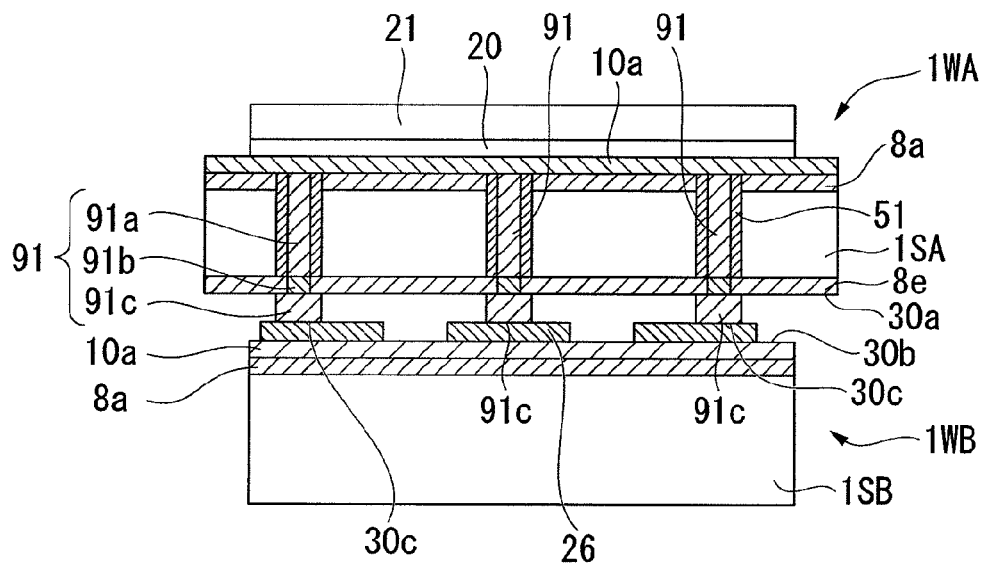
FIG. 22 is an enlarged cross-sectional schematic view of part of a semiconductor device according to a second embodiment of the invention.
Figure 23:
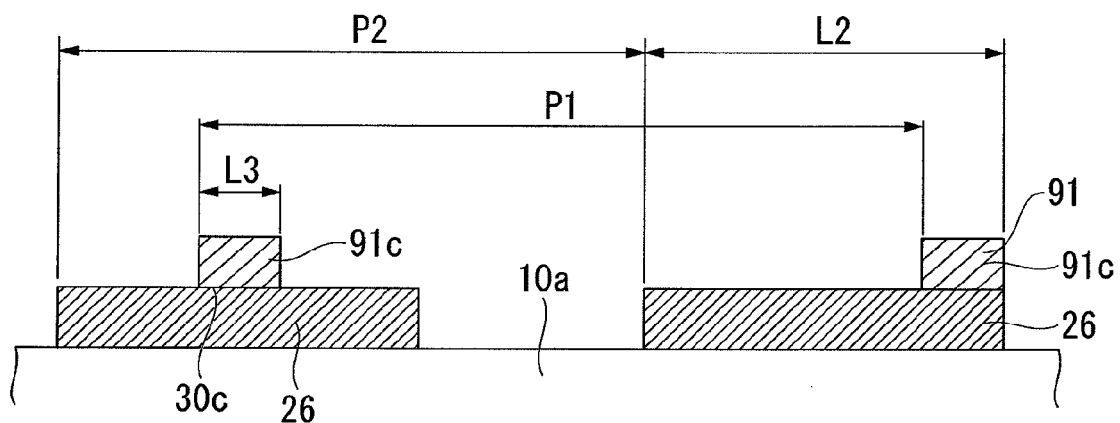
FIG. 23 is an explanatory plan view of the relationship between the size of a penetrating wiring part and a bump in the same semiconductor device.
Figure 41:
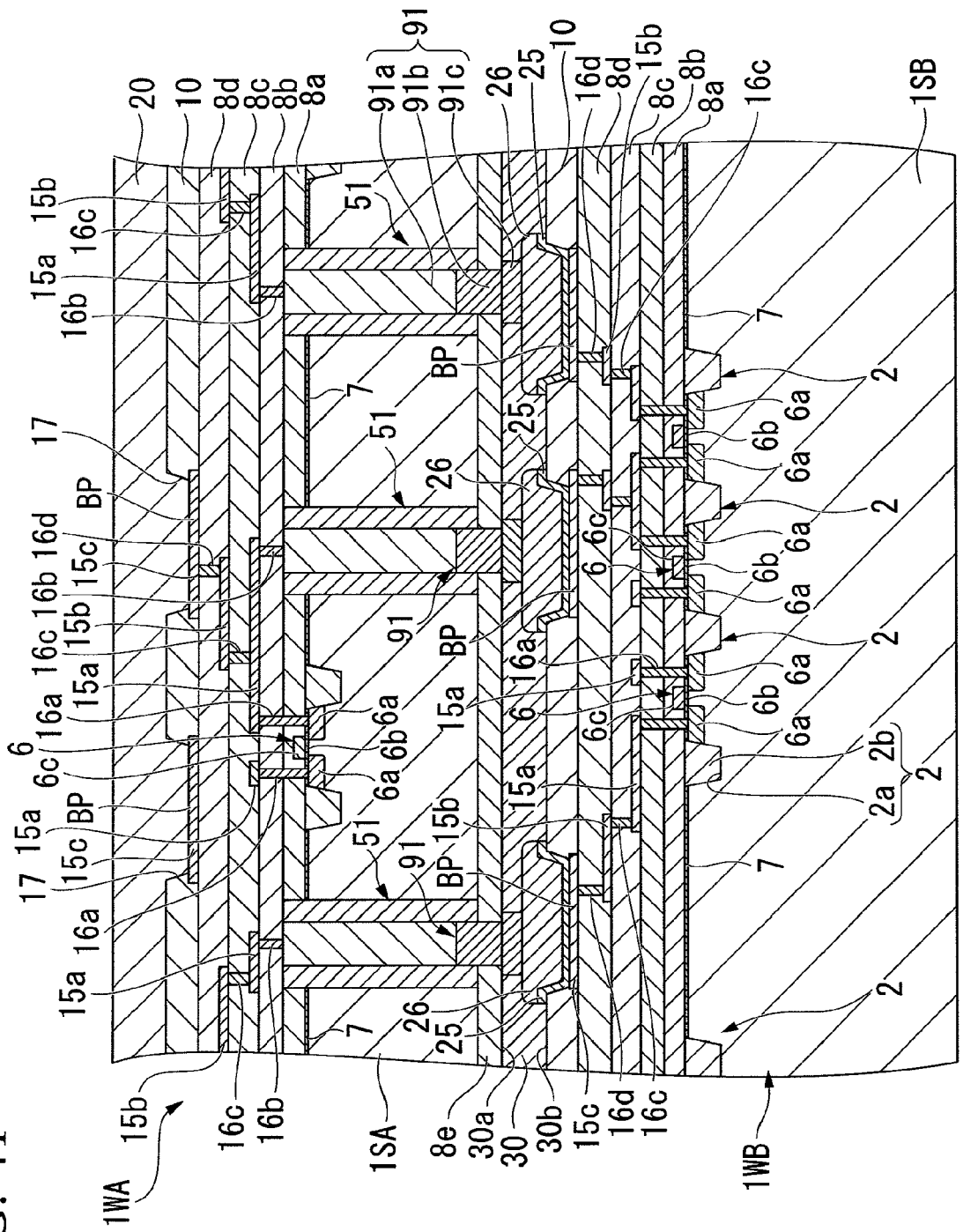
FIG. 41 is a cross-sectional view of primary parts of an example the same semiconductor device.
Figure 42:
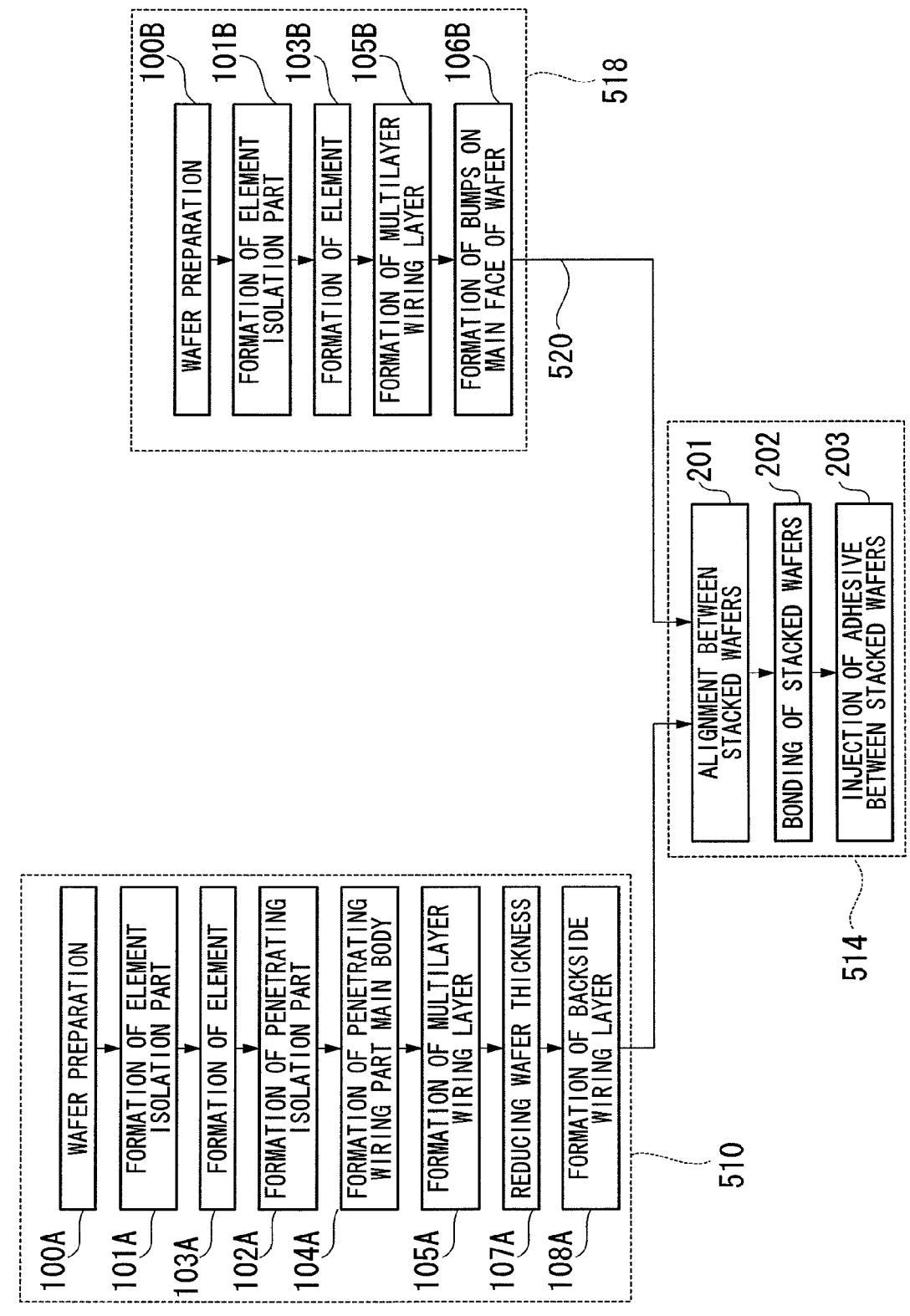
FIG. 42 is an explanatory flowchart of a manufacturing step of the same semiconductor device.

FIGS. 22 to 42 are explanatory views of a semiconductor device according to a second embodiment. FIG. 41 is a cross-sectional view of primary parts of an example of the semiconductor device of the invention, FIG. 22 is an enlarged schematic view of one part of the semiconductor device shown in FIG. 41, and FIG. 23 is an explanatory plan view of the relationship between the size of a penetrating wiring part and a bump in the semiconductor device shown in FIG. 22. FIGS. 24 to 40 are explanatory views of processes of manufacturing the semiconductor device shown in FIG. 41, and FIG. 42 is an explanatory flowchart of processes of manufacturing the semiconductor device shown in FIG. 41.

In the semiconductor device of the embodiment shown in FIGS. 22 to 42, like members to those in FIG. 18 are designated with like reference numerals, and are not repetitiously explained.

The semiconductor device of the embodiment shown in FIG. 41 differs from the semiconductor device shown in FIG. 19 in regard to the shapes of penetrating wiring parts 91 and penetrating isolation parts 51 provided on an upper wafer 1WA. In the semiconductor device of this embodiment, the penetrating isolation parts 51 and the penetrating wiring parts 91 are formed in a single piece.

As shown in FIG. 41, each penetrating wiring part 91 includes a penetrating wiring part main body 91a, a plug wiring 91b that contacts an end part of the penetrating wiring part main body 91a on a bonding surface 30a side, and a connection conductive part 91c that contacts a face of the plug wiring 91b on the bonding surface 30a side and protrudes from that bonding surface 30a.

As shown in FIG. 41, the penetrating wiring part main body 91a is enclosed by the penetrating isolation part 51, which is formed in a single piece with the penetrating wiring part main body 91a. The plug wiring 91b is buried in a first interlayer insulating layer 8e and the penetrating isolation part 51. The plug wiring 91b is buried in the first interlayer insulating layer 8e. Also, an edge of the plug wiring 91b is arranged further to the inside than the superimposed position in plan view with an edge of the penetrating isolation part 51. The plug wiring 91b is thus insulated from the upper wafer 1WA.

In this embodiment, the penetrating wiring part main body 91a, the plug wiring 91b, and the connection conductive part 91c are rectangular in cross-section. In this embodiment, as shown in FIG. 41, the area of the cross-section of the connection conductive part 91c is wider than the cross-sections of the penetrating wiring part main body 91a and the plug wiring 91b. This makes connection between the penetrating wiring parts 91 and the bumps 26 easier and more reliable.

The plug wiring 91b need only contact the connection conductive part 91c, and, as shown in FIG. 41, can be entirely or partially superimposed on the connection conductive part 91c in plan view. It is preferable, however, that the area of contact between the plug wiring 91b and the connection conductive part 91c is wide enough to ensure that the electrical resistance value at the electrical connection between them is sufficiently low, and that a sufficient positioning margin can be obtained between them. It is also preferable that the entire face of the plug wiring 91b is superimposed with the connection conductive part 91c in plan view.

There is no restriction on the cross-sectional shapes of the penetrating wiring part main body 91a, the plug wiring 91b, and the connection conductive part 91c, which need only be formed such that the connection conductive part 91c has a sufficiently wide area for electrically connecting them while insulating them from the upper wafer 1WA. Specifically, the cross-sectional shapes of the penetrating wiring part main body 91a, the plug wiring 91b, and the connection conductive part 91c need not be rectangular, and can be another shape such as circular or square. Also, the cross-sectional shapes of the penetrating wiring part main body 91a, the plug wiring 91b, and the connection conductive part 91c can be mutually similar or different. For example, the cross-sectional shapes of the penetrating wiring part main body 91a and the plug wiring 91b can be circular, while that of the connection conductive part 91c can be rectangular.

There is no restriction on the cross-sectional shape of the penetrating isolation part 51, which can be determined as appropriate in accordance with the cross-sectional shapes of the penetrating wiring part main body 91a and the plug wiring 91b, such that it can enclose the outer peripheral face of the penetrating wiring part main body 91a while preventing the upper wafer 1WA from electrically connecting to the penetrating wiring part main body 91a and the plug wiring 91b.

Shapes of the penetrating wiring parts 91 and the bumps 26 that constitute the semiconductor device shown in FIG. 41 will be explained using FIGS. 22 and 23. FIG. 22 is an enlarged cross-sectional schematic view of one portion of the semiconductor device shown in FIG. 41, wherein, to facilitate explanation of the relationship between the size of the penetrating wiring parts and the size of the bumps, the bumps 26 are schematically represented as having plate-like shapes, the bump foundation conductive pattern 25, the MOS-FET 6, the insulating adhesive 30, and so on, are not repetitiously described, and the description of the multilayer wiring layer 10a is simplified. FIG. 23 is an enlarged cross-sectional view of the inter-wafer connection part 30c, and vicinity thereof, of the semiconductor device shown in FIG. 22.

In the semiconductor device of this embodiment, the planar shape of each bump 26 is larger than that of the connection conductive part 91c of the penetrating wiring part 91. The penetrating wiring parts 91 arranged on the right sides of FIGS. 22 and 41 are connected at the right of the centers of the bumps 26 arranged on the right sides of FIGS. 22 and 41. The penetrating wiring parts 91 arranged on the left sides of FIGS. 22 and 41 are connected at the left of the centers of the bumps 26 arranged on the left sides of FIGS. 22 and 41. Therefore, in the semiconductor device shown in FIG. 41, as shown in FIG. 23, the pitch P1 of the penetrating wiring parts 91 is larger than the pitch P2 of the bumps 26.

Similarly in this embodiment, during processes performed in manufacturing the wafers 1WA and 1WB, such as element formation, multilayer wiring formation, and a process of thinning the wafer 1WA, substrates 1SA and S1B suffer warpage as they expand and contract. Accordingly, the upper wafer 1WA becomes larger (longer in length) than the lower wafer 1WB. This results in deviation between the pitch P1 of the penetrating wiring parts 91 and the pitch P2 of the bumps 26. Also in this embodiment, the wafer 1WA becomes a thinned wafer due to the process of thinning the thickness of the substrate 1SA. This makes the substrate 1SA especially liable to warpage such as wafer bow.

In the semiconductor device of this embodiment, the pitch P2 of the bumps 26 shown in FIG. 23 is larger than the combined size of the width L3 of the exterior of the penetrating wiring parts 91 and the width L2 of the exterior of the bumps 26. For example, if the pitch P2 of the bumps 26 in FIG. 23 is 50 μm, and the width L3 of the exterior of the connection conductive parts 91c of penetrating wiring parts 91 is 10 μm, the width L2 of the exterior of the bumps 26 is less than 40 μm. This can prevent adjacent bumps 26 from becoming electrically connected via the penetrating wiring parts 91, and can ensure that the inter-wafer connection part 30c is reliably insulated from another adjacent inter-wafer connection part 30c.

In the semiconductor device shown in FIG. 41, the connection conductive parts 91c of the penetrating wiring parts 91 are rectangular in plan view, and the bumps 26 are square in plan view. The planar shape of the bumps 26 on the bonding surface 30b is larger than the positioning margin shape A2. The positioning margin dimension M1 is determined in accordance with the precision of an apparatus that positions the wafers (upper and lower wafers 1WA and 1WB). The positioning margin shape A2 has a planar shape that encloses the basic shape A1 with the width of the positioning margin dimension M1. The area of the basic shape A1 is half that of the area of the connection conductive part 91c, which is the area of the penetrating wiring part 91 on the bonding surface 30a. In this embodiment, the basic shape A1 and the positioning margin shape A2 resemble the planar shape of the connection conductive parts 91c of the penetrating wiring parts 91.

In the semiconductor device shown in FIG. 41, the planar shape of the bumps 26 on the bonding surface 30b is larger than the positioning margin shape A2. Therefore, even if the positions of the penetrating wiring parts 91 and the bumps 26 deviate within the range of the precision of the apparatus that positions the wafers 1WA and 1WB, the contact area between the bumps 26 and the penetrating wiring parts 91 will be larger than half the area of the connection conductive parts 91c of the penetrating wiring parts 91. This ensures that the inter-wafer connection part 30c has a sufficient planar area. In this case, in comparison with a case where the planar shape of the bumps 26 is the basic shape A1 or the positioning margin shape A2, a stable connection between the penetrating wiring parts 91 and the bumps 26 can be achieved, even if the substrates 1SA and 1SB suffer warpage during manufacture of the wafers 1WA and 1WB. Therefore, unconnected portions between the penetrating wiring parts 91 and the bumps 26 can be prevented. This makes the connection between the wafers 1WA and 1WB highly reliable.

In the semiconductor device of FIG. 41, the planar shape of the bumps 26 on the bonding surface 30b can be the post-processing positioning margin shape A3, obtained by enclosing the positioning margin shape A2 with the post-processing positioning margin M2. In this case, even if the positions of the penetrating wiring parts 91 and the bumps 26 deviate due to warpage of the substrate 1SA during manufacture of the wafer 1WA, at least half of the area of the connection conductive parts 91c of the penetrating wiring parts 91 will connect to the bumps 26. This can more reliably ensure a wide planar area of the inter-wafer connection parts 30c.

In the semiconductor device shown in FIG. 41, the planar shape of the bumps 26 on the bonding surface 30b can be the corrected shape A4 obtained by enlarging the edges of the post-processing positioning margin shape A3 toward the outside by a correction dimension M3 of no more than 2.5 μm. In this case, even if positional deviation between the penetrating wiring parts 91 and the bumps 26 is larger than the post-processing positioning margin M2, the penetrating wiring parts 91 and the bumps 26 are reliably connected together. Portions where the penetrating wiring parts 91 and the bumps 26 are unconnected can thus be prevented. Another advantage of this embodiment is that, since the correction dimension M3 is no greater than 2.5 μm, the bumps 26 do not become excessively large.

Moreover, when extending the corrected shape A4 from the edge of the post-processing positioning margin shape A3 toward the outside, instead of making the corrected shape A4 resemble the basic shape A1, it can be made into a smooth shape that can be formed easily, such as a square, a circle, or a shape close to those. This is preferable, since it enables the shape of the bumps 26 to be formed easily.

Subsequently, a process of manufacturing the semiconductor device shown in FIG. 41 will be explained using FIGS. 24 to 40 and FIG. 42. In the manufacturing method of the semiconductor device shown in FIG. 41, descriptions of processes common to those in the manufacturing method of the semiconductor device shown in FIG. 19 are simplified or omitted.

A process of manufacturing an upper wafer (process of manufacturing upper wafer of the first layer 510 in FIG. 42) will be explained first. As in the manufacturing method of the semiconductor device shown in FIG. 19, an upper wafer 1WA is prepared (process 100A in FIG. 42), and, as shown in FIG. 24, a trench-shaped isolation part 2 for isolating elements is formed on a main face of the substrate 1SA (i.e. a main face of the wafer 1WA) (process 101A in FIG. 42).

Figure 24:
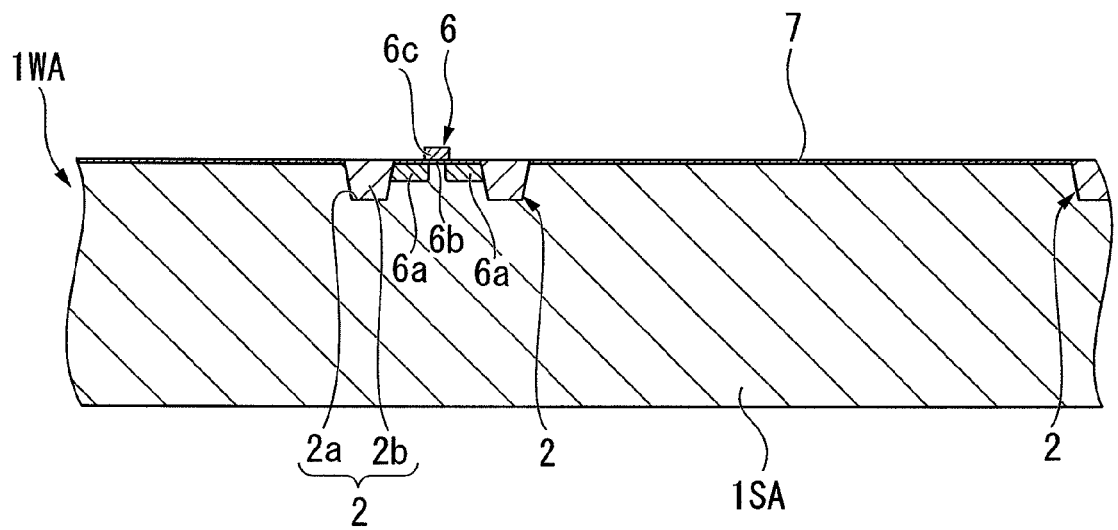
FIG. 24 is an explanatory view of a manufacturing step of the same semiconductor device.

This embodiment differs from the manufacturing method of the semiconductor device shown in FIG. 19 in that, as shown in FIG. 24, an element such as a MOS-FET 6 including semiconductor regions for source and drain 6a, a gate insulating film 6b, and a gate electrode 6c is then fabricated in an active region enclosed by the isolation parts 2 (process 103A in FIG. 42). An insulating film 7 made of, for example, silicon oxide is then formed on the main face of the active region of the substrate 1SA.

Figure 25:
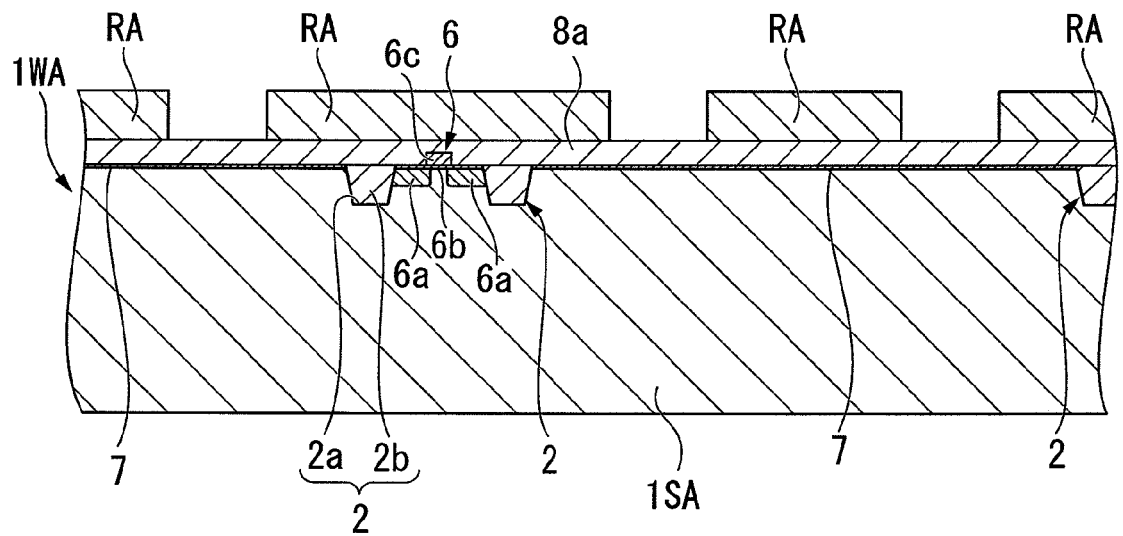
FIG. 25 is an explanatory view of a manufacturing step of the same semiconductor device.

An insulating film made of, for example, silicon oxide is deposited on the main face of the substrate 1SA by a method such as CVD, and the upper face of this insulating film is flattened to form an interlayer insulating film 8a shown in FIG. 25.

Next, penetrating isolation parts 51 are formed in the substrate 1SA. The main face of the substrate 1SA is coated with a resist film by rotation coating and the like, and processes of exposure and developing are performed whereby, as shown in FIG. 25, a resist pattern RA is deposited over the main face of the substrate 1SA.

Figure 26:
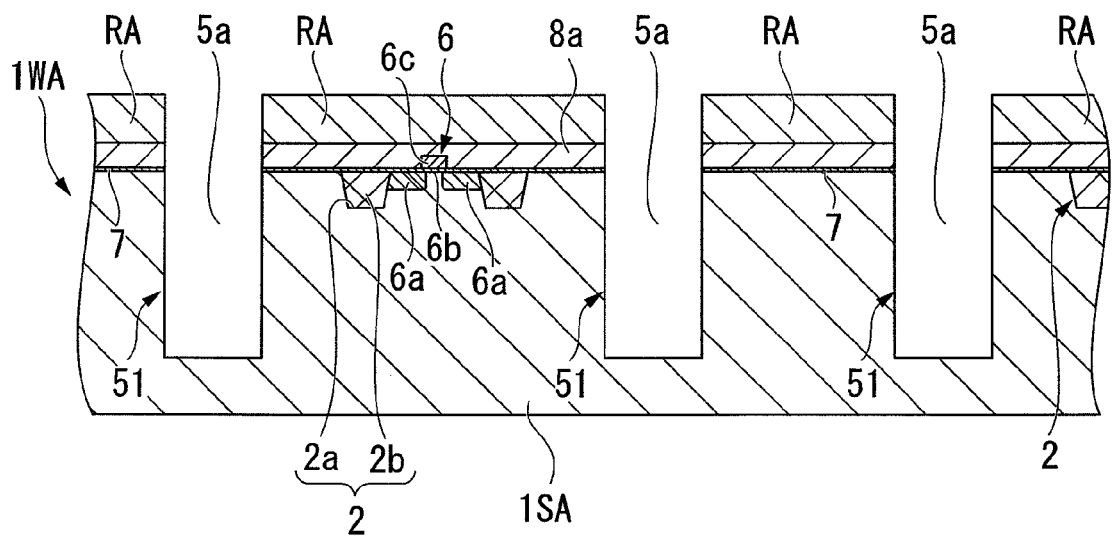
FIG. 26 is an explanatory view of a manufacturing step of the same semiconductor device.

Using this resist pattern RA as an etching mask, the interlayer insulating film 8a, the insulating film 7, and the substrate 1SA exposed through it are etched to form deep isolation trenches 5a in the substrate 1SA as shown in FIG. 26. As shown in FIG. 26, the deep isolation trenches 5a extend from the main face of the substrate 1SA along a direction intersecting its main face, and terminate at positions deeper than the isolation trenches 2a for isolating elements.

Figure 27:
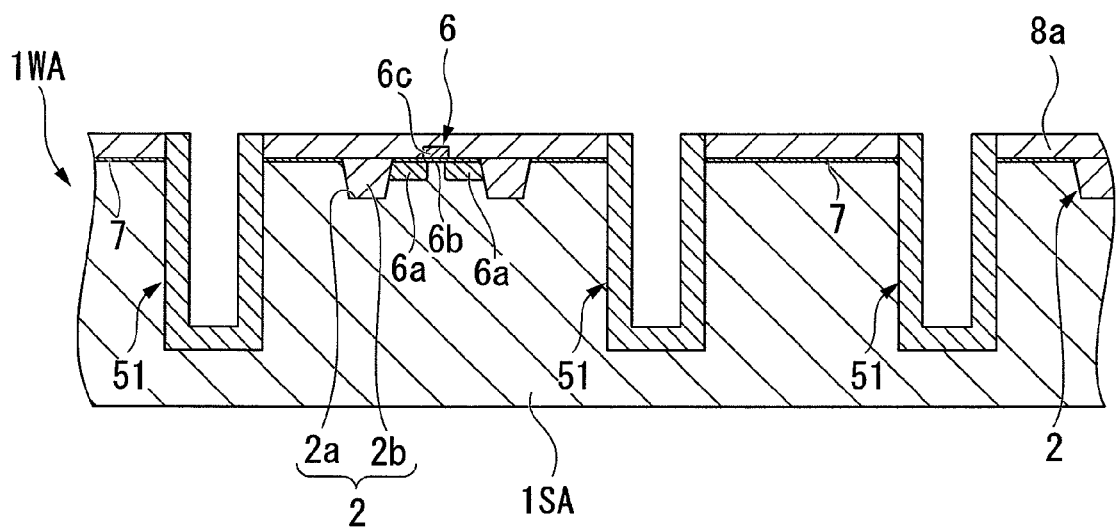
FIG. 27 is an explanatory view of a manufacturing step of the same semiconductor device.
Figure 28:
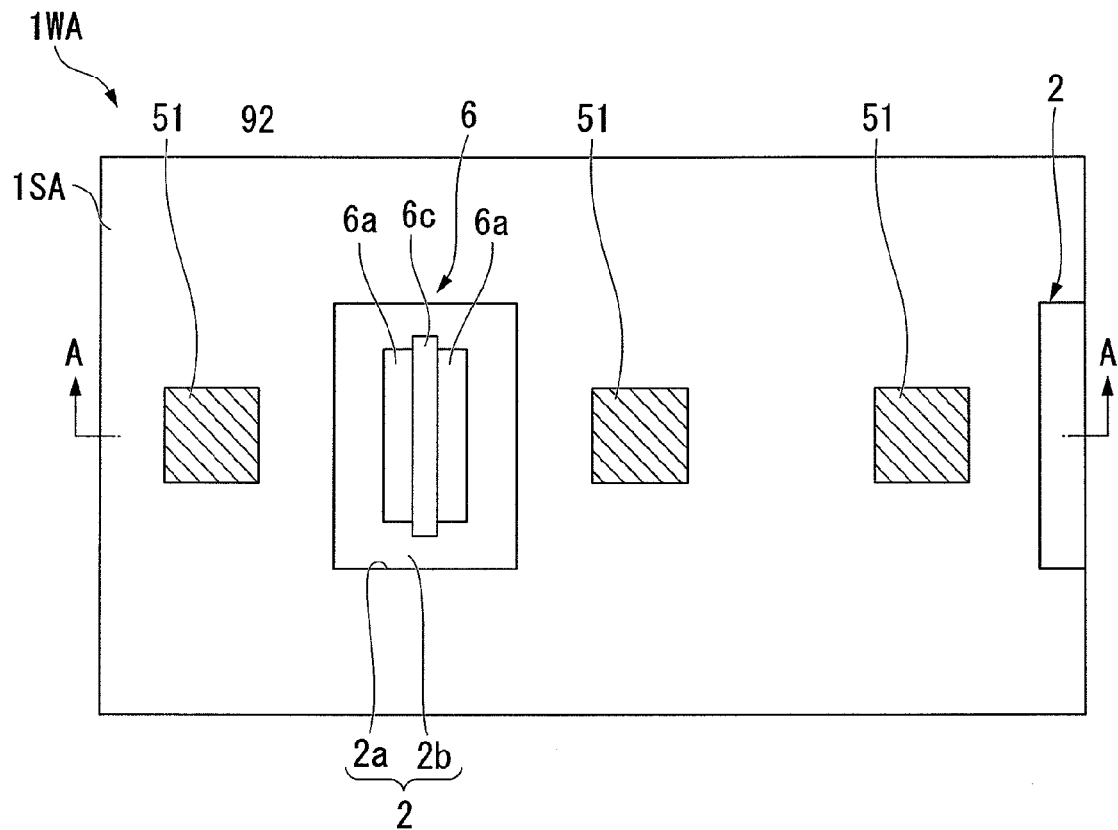
FIG. 28 is an explanatory view of a manufacturing step of the same semiconductor device.

The resist pattern RA is then removed, and insulating film is deposited over the inside faces and bottom face of each deep isolation trench 5a in the substrate 1SA. As shown in FIGS. 27 and 28, an insulating film made of, for example, silicon oxide (SiO2) is deposited by a method such as chemical vapor deposition (CVD) to form the penetrating isolation parts 51 (process 102A in FIG. 42). As shown in FIG. 27, the insulating film that constitutes the penetrating isolation parts 51 is deposited on the inner faces and bottom face of each deep isolation trench 5a, forming a space in the center of the deep isolation trench 5a which is rectangular in plan view and is enclosed by the penetrating isolation part 51. FIG. 27 is a cross-sectional view taken along the line A-A of FIG. 28. Although FIG. 28 is a plan view, hatching is applied to the penetrating isolation parts 51 for ease of viewing.

Figure 29:
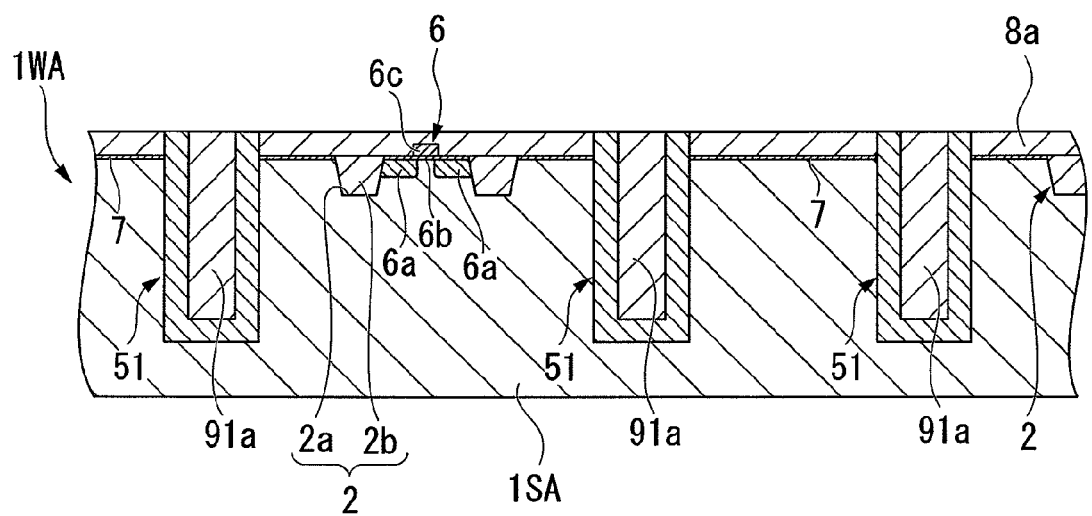
FIG. 29 is an explanatory view of a manufacturing step of the same semiconductor device.

Subsequently, the penetrating wiring parts 9 are formed. By A conductive material is deposited on the main face of the substrate 1SA by a method such as CVD, and is buried in the spaces enclosed by the penetrating isolation parts 51 inside the deep isolation trenches 5a. Superfluous portions of this conductive material formed outside the deep isolation trenches 5a are polished and removed by CMP and the like, leaving the main conductive film only in the deep conductive trenches 5a. As shown in FIGS. 29 and 30, this forms a conductive part that will become the penetrating wiring part main body 91a of the penetrating wiring part 91 (process 104A in FIG. 42).

There are no restrictions on the method used in forming the conductive part for the penetrating wiring part main body 91a of the penetrating wiring parts 91, it being acceptable to use CVD or plating, or another method.

FIG. 29 is a cross-sectional view taken along the line A-A of FIG. 30. Although FIG. 30 is a plan view, hatching is applied to the penetrating isolation parts 51 and the penetrating wiring parts 91 for ease of viewing. As shown in FIG. 30, the penetrating wiring part main body 91a of each penetrating wiring part 91 is enclosed by the penetrating isolation part 51 such as to cover its outer peripheral part, the penetrating isolation part 51 and the penetrating wiring part main body 91a of the penetrating wiring part 91 being formed in a single piece.

Figure 31:
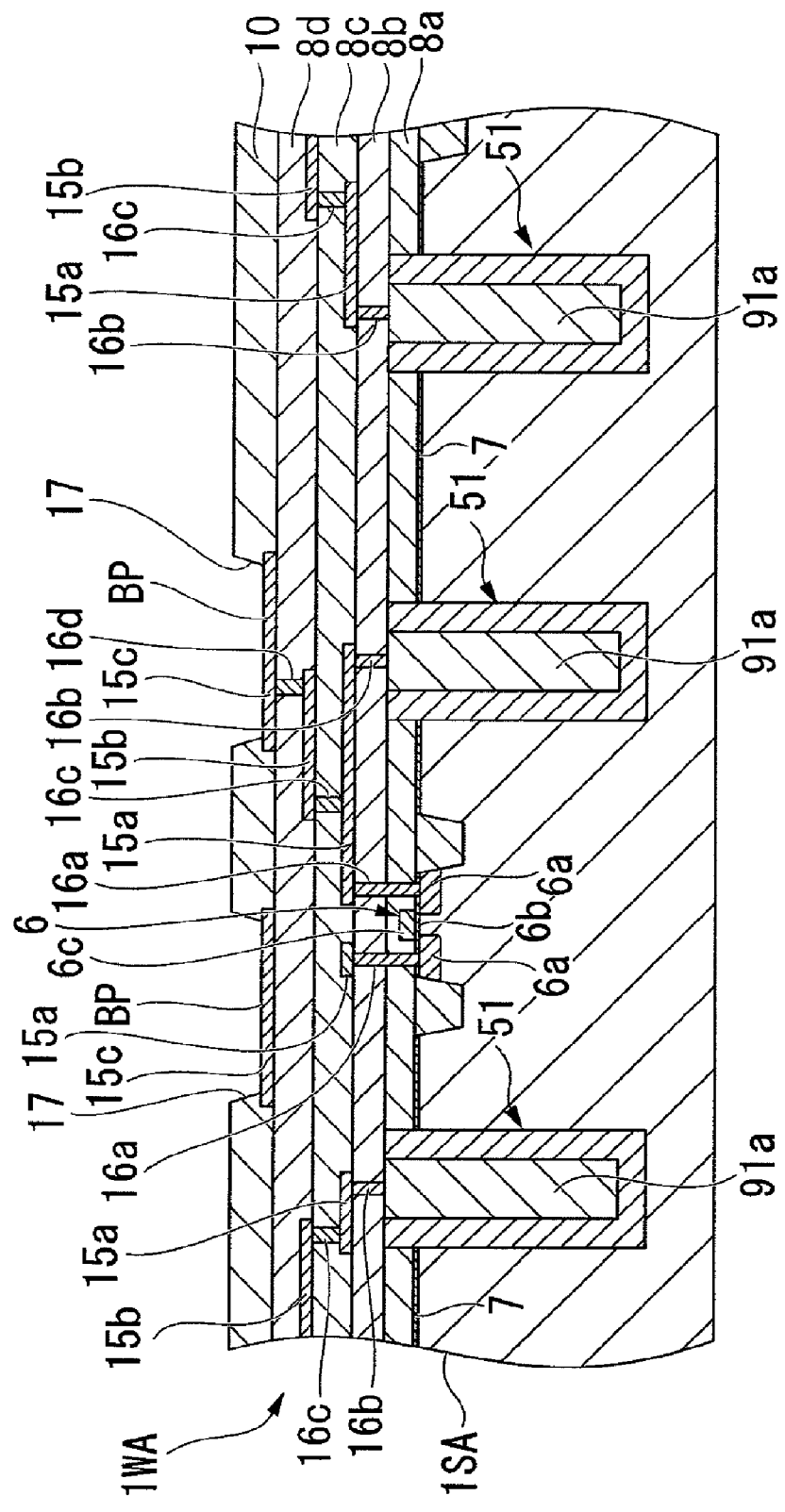
FIG. 31 is an explanatory view of a manufacturing step of the same semiconductor device.

Subsequently, as shown in FIG. 31, interlayer insulating films 8b, 8c, and 8d, a surface protective film 10, wirings 15a, 15b, and 15c, plugs 16a, 16b, 16c, and 16d, an opening 17, and a bonding pad BP are formed on the main face of the substrate 1SA by conventional semiconductor device wiring-formation methods, forming a multilayer wiring layer (process 105A in FIG. 42).

Figure 32:
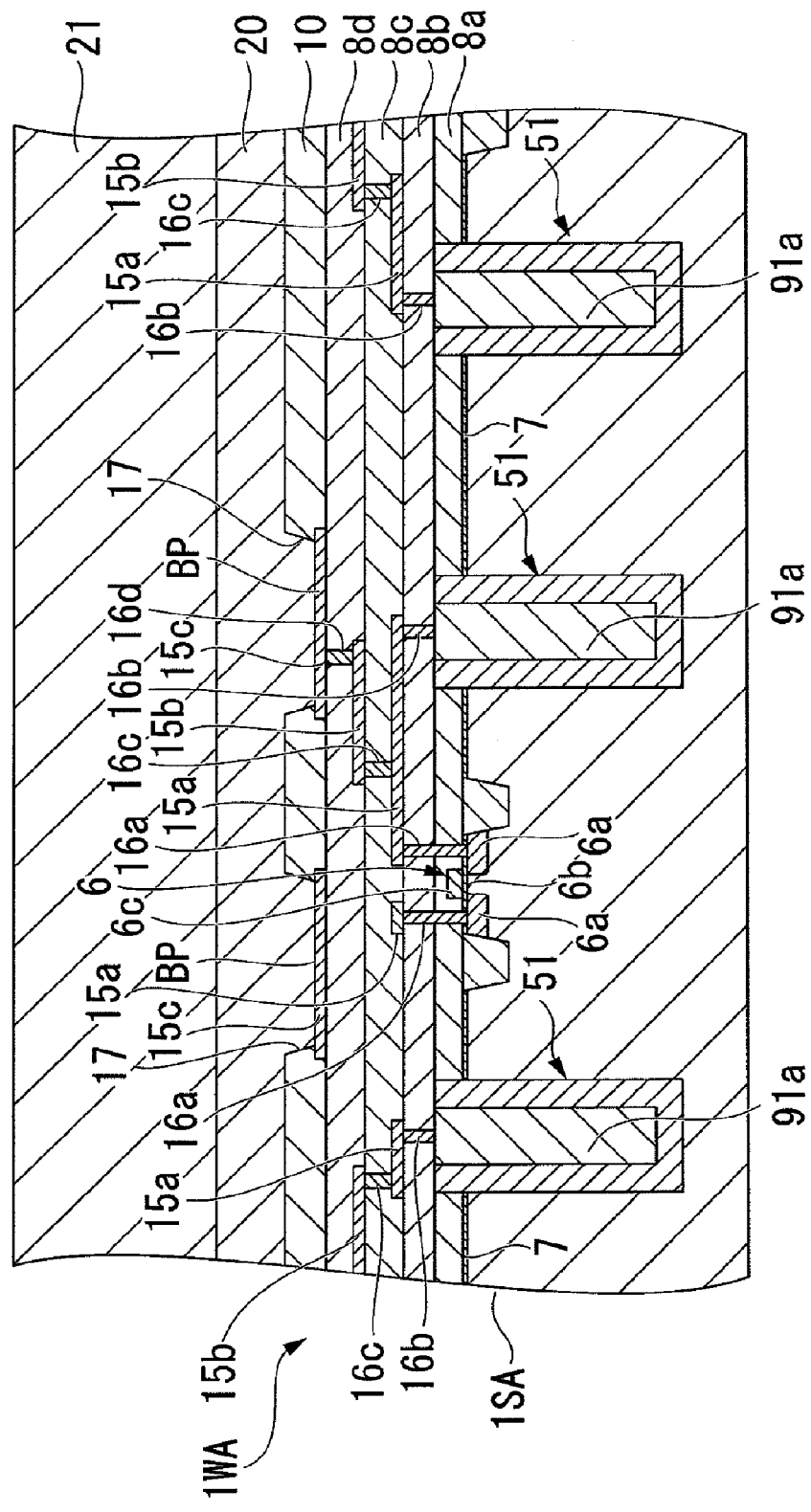
FIG. 32 is an explanatory view of a manufacturing step of the same semiconductor device.

As shown in FIG. 32, a glass support substrate 21 is then bonded over the main face of the wafer 1WA interposing an adhesive sheet 20 therebetween, and the wafer 1WA is subjected to a thinning process (process 107A in FIG. 42). Due to this thinning process, each wafer considerably expands and contracts, and there is considerable positional deviation among electrodes of the wafers, making electrical connection between them extremely problematic. The thinning process of the wafer 1WA of this embodiment includes a first thinning process and a second thinning process as described below.

Figure 33:
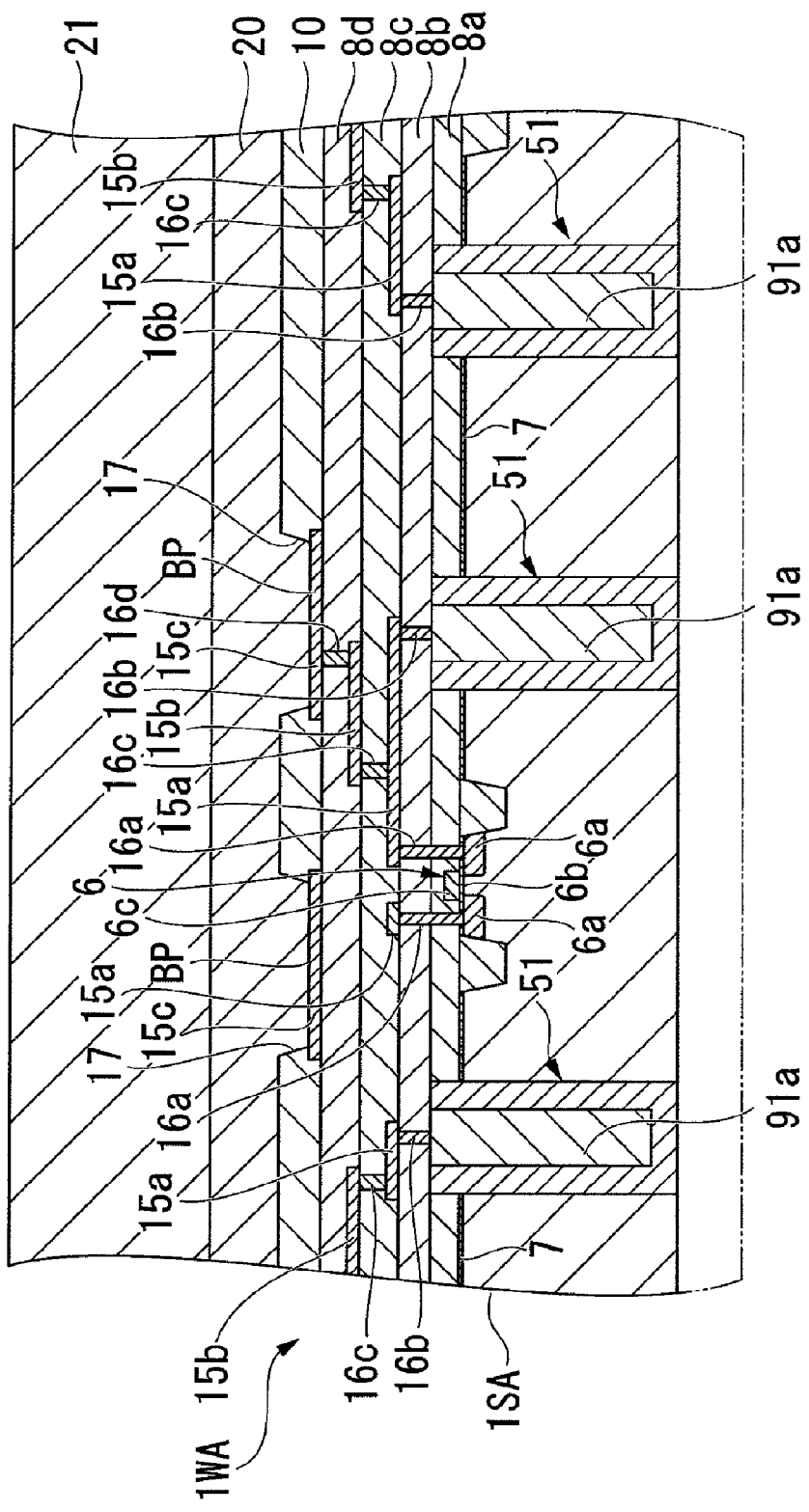
FIG. 33 is an explanatory view of a manufacturing step of the same semiconductor device.

The broken line in FIG. 33 represents the substrate 1SA before a first thinning process. As shown in FIG. 33, in the first thinning process, with the glass support substrate 21 securely attached to the main face of the wafer 1WA, a backside of the wafer 1WA (i.e. the backside of the substrate 1SA) is grinded to a desired thickness. The first thinning process utilizes a mechanical method such as grinding. The first thinning process ends without reaching the penetrating isolation parts 51 (i.e. without exposing the penetrating isolation parts 51 from the backside of the wafer 1WA).

In a second thinning process, with the glass support substrate 21 securely attached to the main face of the wafer 1WA, the backside of the wafer 1WA is polished. The second thinning process combines chemical and mechanical elements, such as CMP.

As shown in FIG. 33, the second thinning process exposes the penetrating isolation parts 51 from the backside of the wafer 1WA.

A plug wiring layer is then formed on the backside of the wafer 1WA after the thinning process (process 108A in FIG. 42).

Figure 34:
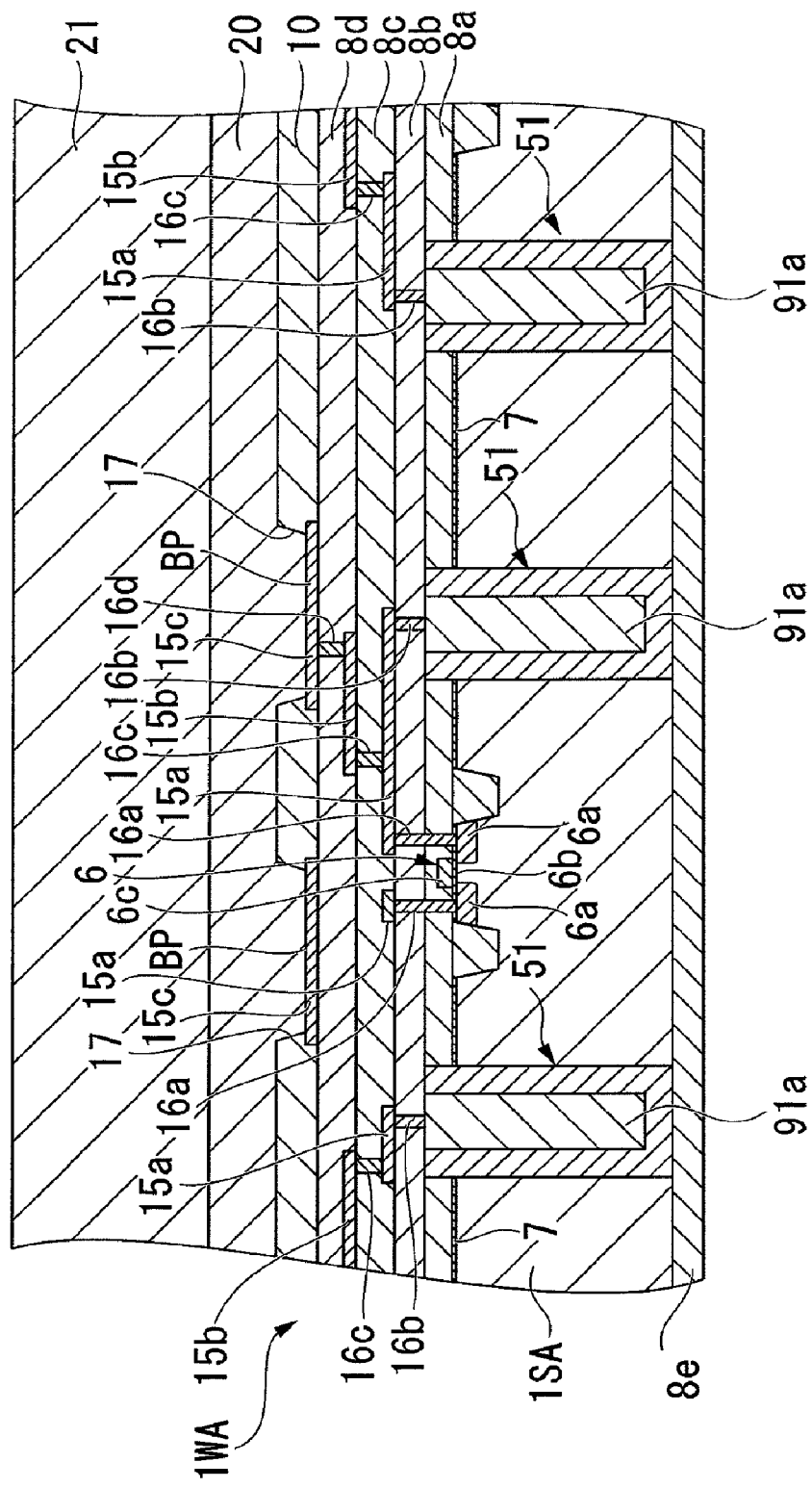
FIG. 34 is an explanatory view of a manufacturing step of the same semiconductor device.
Figure 35:
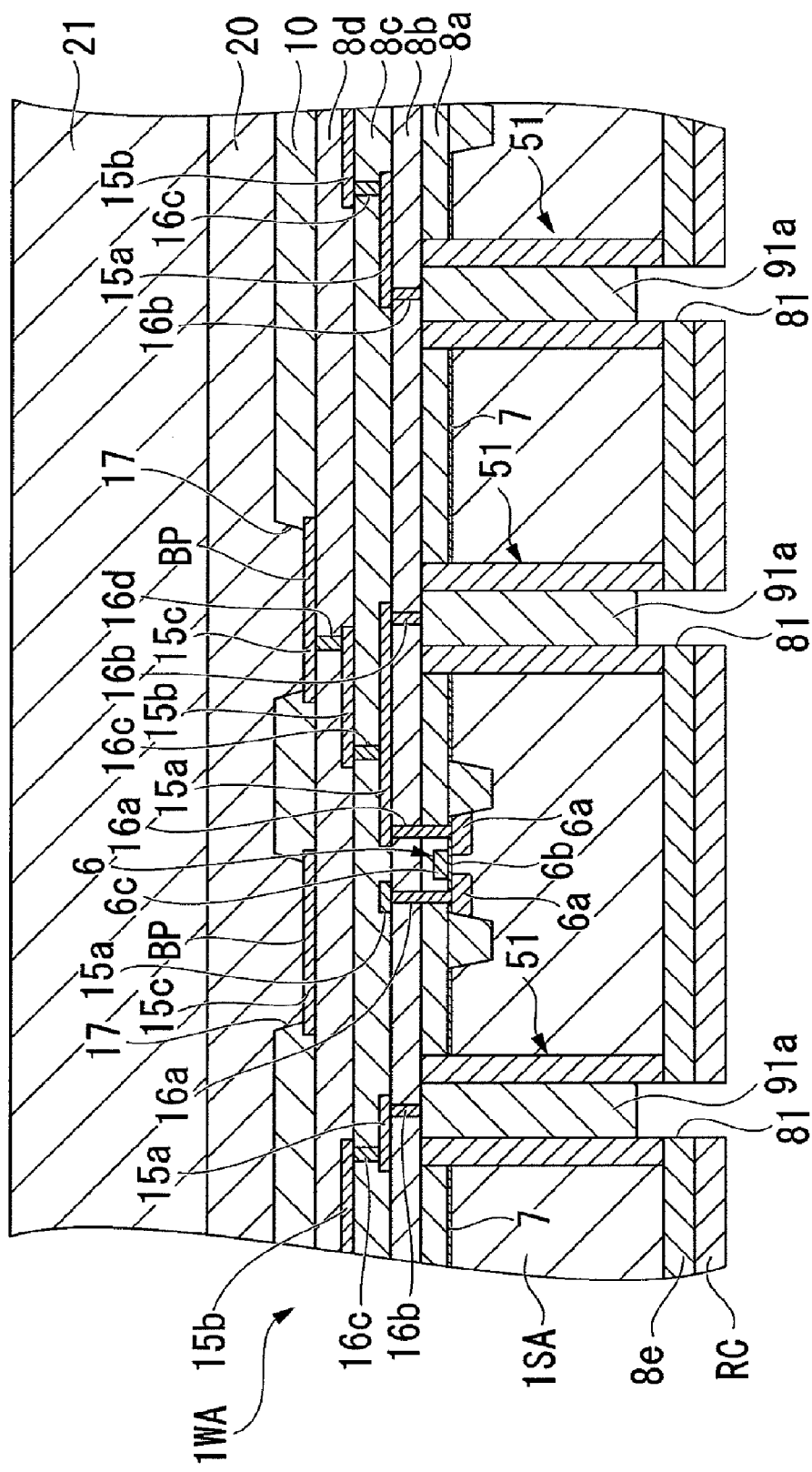
FIG. 35 is an explanatory view of a manufacturing step of the same semiconductor device.
Figure 36:
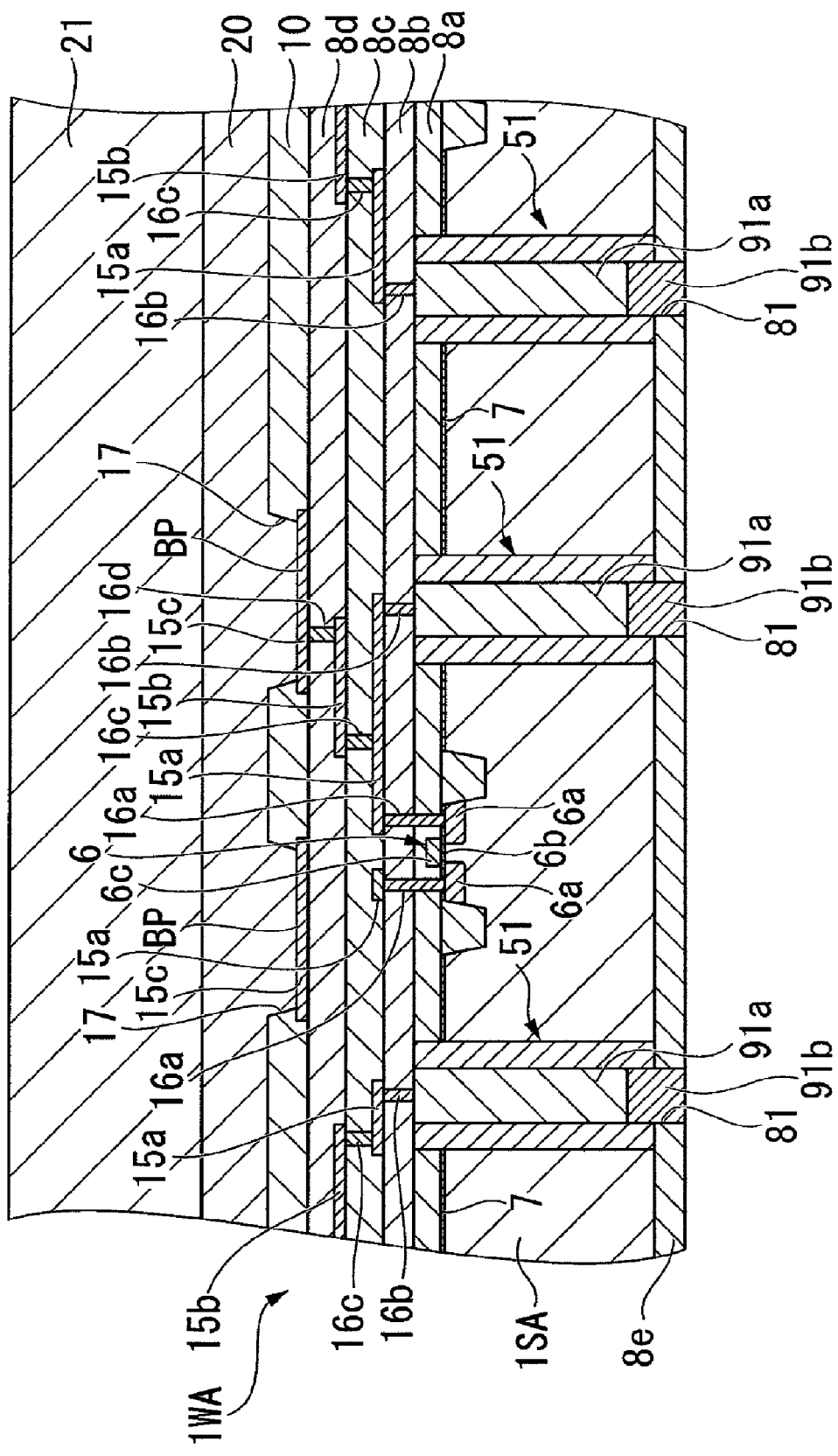
FIG. 36 is an explanatory view of a manufacturing step of the same semiconductor device.

Firstly, as shown in FIG. 34, a first interlayer insulating layer 8e is formed on the backside of the wafer 1WA after the thinning process. A resist pattern RC is then formed on the first interlayer insulating layer 8e, and, as shown in FIG. 35, the first interlayer insulating layer 8e exposed through it is removed using the resist pattern RC as an etching mask to form a trench 81. At this time, the oxidation film on the portion of bottom face of the penetrating isolation parts 51 exposed from the backside of the wafer WA1 that abuts to the bottom face of the penetrating wiring part main bodies 91a is simultaneously etched. As shown in FIG. 35, the trenches 81 overlap with the penetrating wiring part main bodies 91a in plan view. The cross-sectional area of each trench 81 is the same as the cross-sectional area of the penetrating wiring part main bodies 91a. In plan view, side faces of the trenches 81 are arranged further to the inside than edges of the penetrating isolation parts 51.

The resist pattern RC is removed, and a conductive material such as tungsten or aluminum is buried in the trenches 81 by a method such as CVD or sputtering. Alternatively, a conductive material such as copper can be buried in the trenches 81 by plating or such like. Superfluous portions of conductive material formed outside the trenches 81 are polished and removed by CMP and the like, leaving conductive material only in the trenches 81, and thereby forming the plug wirings 91b shown in FIG. 36.

As shown in FIG. 47, each plug wiring 91b is isolated in the direction of its side face from the substrate 1SA by the first interlayer insulating layer 8e, and is thereby completely electrically isolated from the substrate 1SA.

Figure 37:
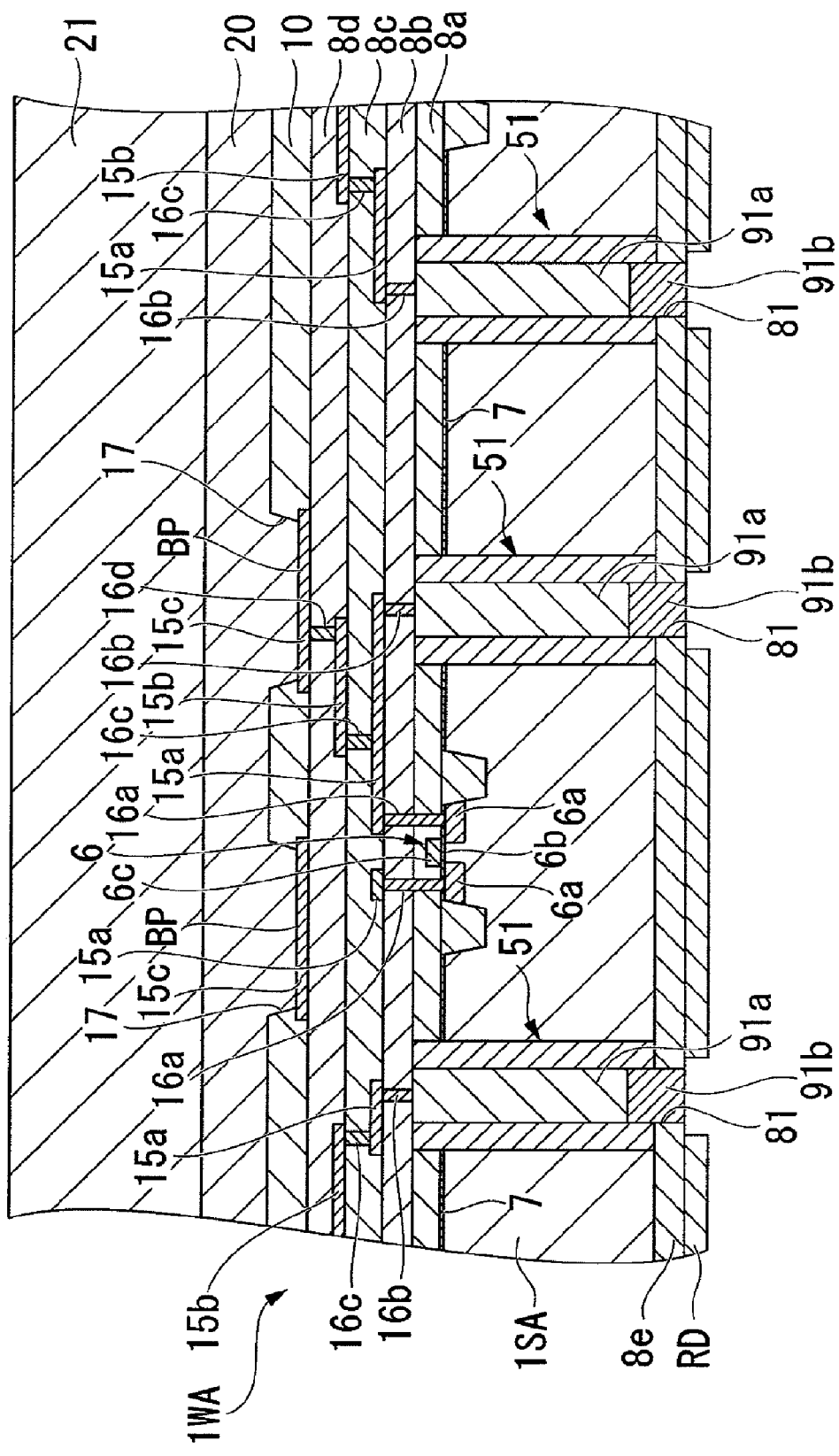
FIG. 37 is an explanatory view of a manufacturing step of the same semiconductor device.

As shown in FIG. 37, a resist pattern RD which exposes regions for connection conductive parts 91c that overlap in plan view with the plug wirings 91b is formed on the backside of the wafer 1WA on which the plug wirings 91b are formed, and a metal such as In is deposited by vapor deposition or the like. After removing the resist pattern RD, superfluous metal portions other than electrodes are removed by lift-off method. This forms the connection conductive parts 91c shown in FIG. 38.

Thus the processes of manufacturing the upper wafer 1WA end.

Subsequently, the lower wafer is manufactured. As a lower wafer, this example describes a process of manufacturing a wafer of a lowermost layer which will not have another wafer bonded to its backside (the process 518 of manufacturing the lower wafer of the second layer in FIG. 42). The process of manufacturing the lower wafer, which is the lowermost layer wafer, is almost the same as the process of manufacturing the upper wafer 1 WA (processes 100A to 107A of FIG. 42).

The manufacturing process of the wafer of the lowermost layer differs from that of upper wafer 1WA in that, as in the process of manufacturing the semiconductor device of FIG. 19, a bump formation process (process 106B) is performed after the process of forming a multilayer wiring layer (process 105B) in FIG. 42, whereas none of a waver thinning process (process 107A), a penetrating isolation part formation process (process 102B), and a penetrating wiring part formation process (process 104B) is performed. Incidentally, the planar arrangement of the bumps 26 that constitute the lower wafer 1WB is such that the center of each bump 26 faces the center of each penetrating wiring part 91 to be arranged on the pre-processed substrate 1SA that becomes the upper wafer 1WA.

Figure 38:
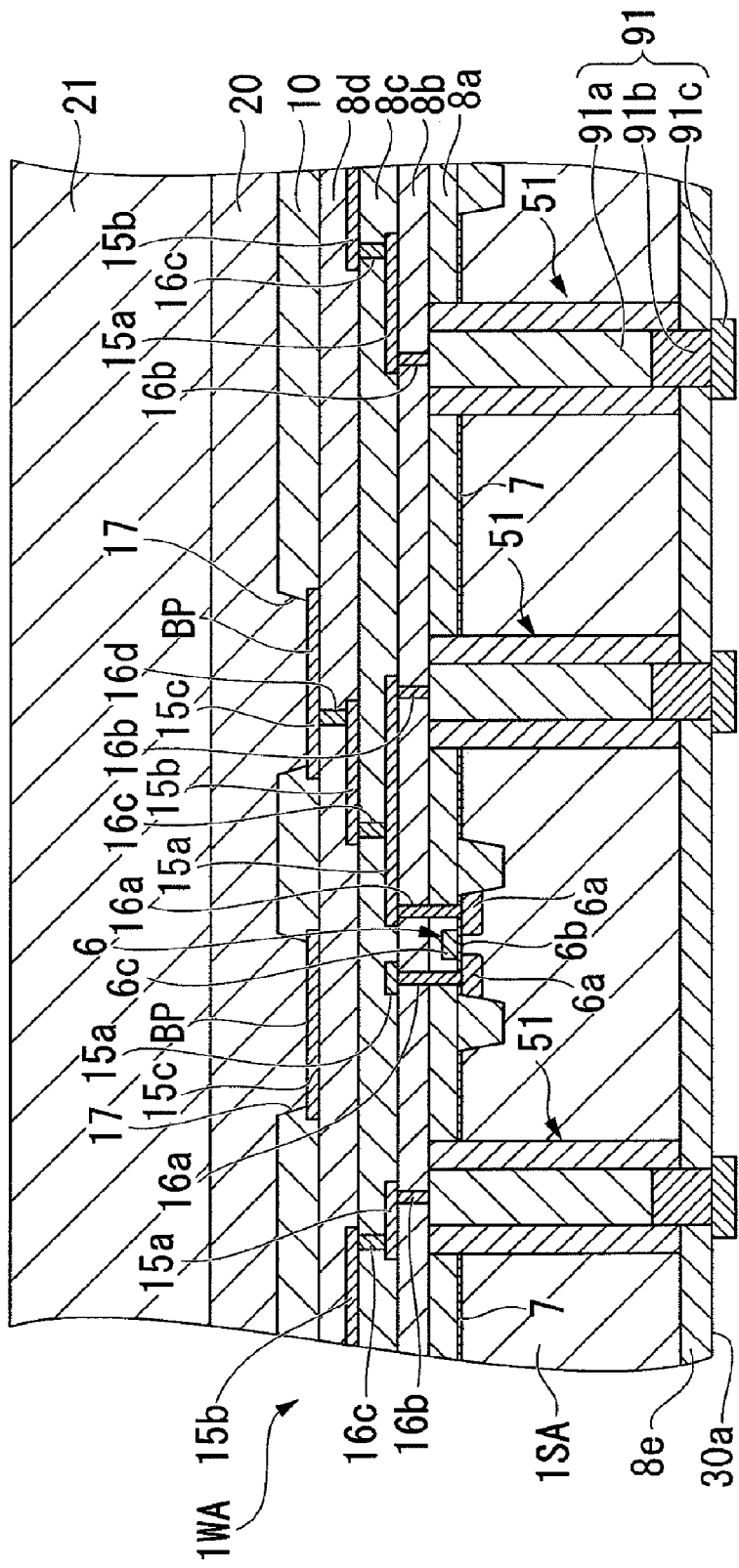
FIG. 38 is a cross-sectional view of primary parts of the same semiconductor device.
Figure 39:
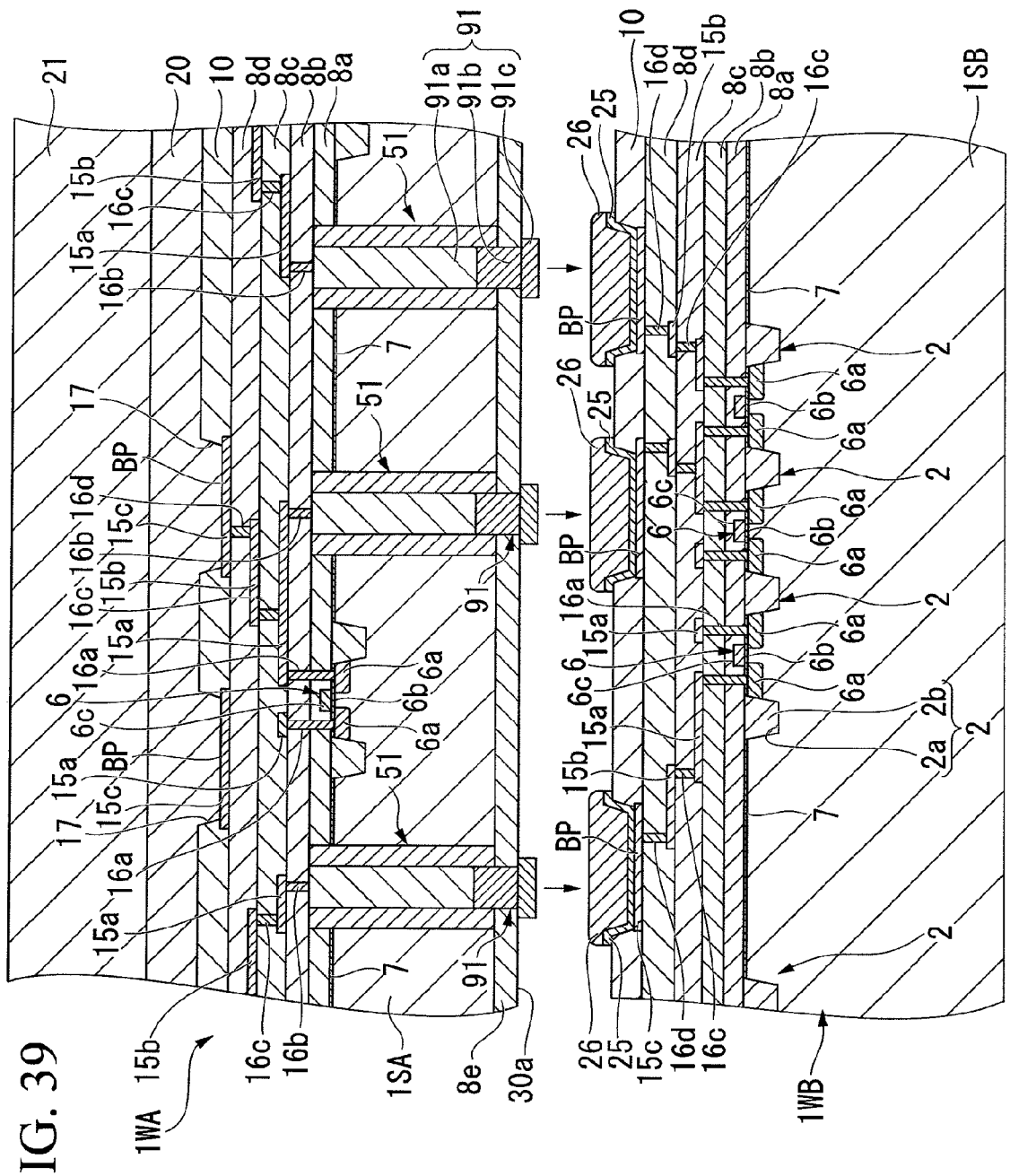
FIG. 39 is an explanatory flowchart of a manufacturing step of the same semiconductor device.

The lower wafer of the second layer (lower wafer 1WB) is then stacked (arrow 520 in FIG. 42). That is, the upper and lower wafers 1WA and 1WB manufactured in the manner described above are bonded together (process of bonding upper and lower wafers of the first and second layers 514 in FIG. 42). Firstly, after securing the lower wafer 1WB, as shown in FIG. 39, the upper wafer 1WA shown in FIG. 38 is arranged above the main face (bonding surface 30b) of the lower wafer 1WB, with its backside (bonding surface 30a) opposite the main face of the lower wafer 1WB.

The upper wafer 1WA and the lower wafer 1WB are then positioned relative to each other. Specifically, the bumps 26 on the main face of the lower wafer 1WB are aligned with the corresponding penetrating wiring parts 91 on the backside of the upper wafer 1WA (process 201 in FIG. 42).

At this time, there is positional deviation between the centers of the bumps 26 on the lower wafer 1WB and the corresponding penetrating wiring parts 91 of the upper wafer 1WA. This deviation is caused by the positioning precision of the device that positions the wafers, warpage (wafer bow) of the substrates during the processes of manufacturing the wafers 1WA and 1WB, and so on.

Figure 40:
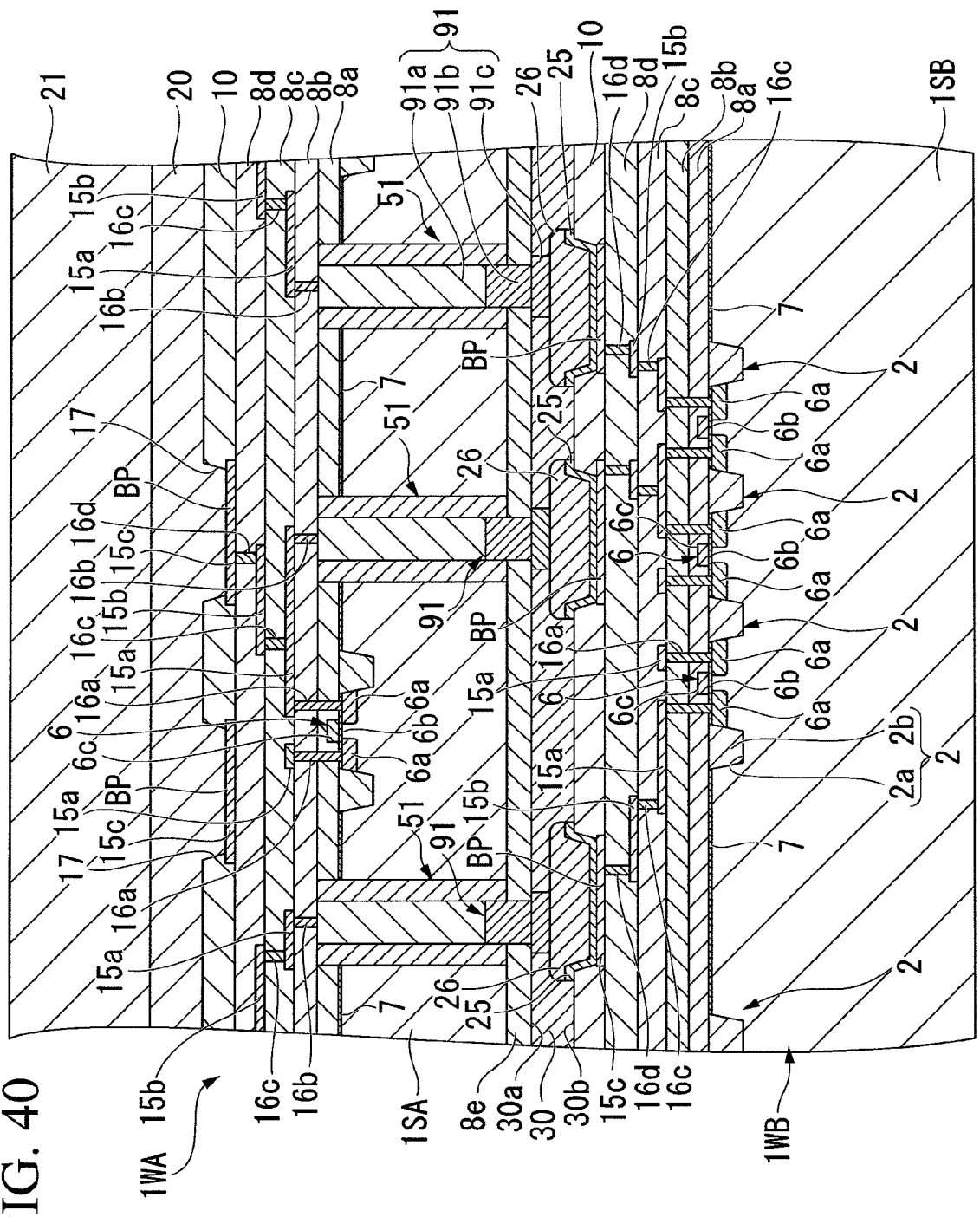
FIG. 40 is a cross-sectional view of primary parts of another example of the same semiconductor device.

Then, as shown in FIG. 40, the opposing faces (bonding surfaces 30a and 30b) of the upper and lower wafers 1WA and 1WB are brought closer together until they are stacked in contact, and the bumps 26 of the main face of the lower wafer 1WB are electrically connected to the connection conductive parts 91c of the penetrating wiring part 91 on the backside of the upper wafer 1WA. The semiconductor circuit parts of the upper and lower wafers 1WA and 1WB are thus electrically connected to form a desired semiconductor circuit (process 202 in FIG. 42).

An insulating adhesive 30 is injected in the gap between the opposing bonding surfaces 30a and 30b of the upper and lower wafers 1WA and 1WB (process 203 in FIG. 42).

The glass support substrate 21 is removed from the main face of the upper wafer 1WA to obtain the semiconductor device shown in FIG. 41.

After these processes, chips are obtained by cutting the semiconductor device shown in FIG. 41 into chip units. Each chip thus obtained has a three-dimensional configuration including a plurality of stacked wafers. That is, since semiconductor circuits of the wafers constituting each chip are electrically connected via the penetrating wiring parts 91 and the bumps 26, one desired semiconductor integrated circuit as a whole is fabricated on the chip.

In the semiconductor device of this embodiment, each inter-wafer connection part 30c is insulated from another adjacent inter-wafer connection part 30c, and the planar shape of each bump 26 is larger than the positioning margin shape A2 obtained by enclosing the basic shape A1 that is half the area of the penetrating wiring part 91 with the width of the positioning margin dimension M1. This makes it easier to align the bumps 26 and the connection conductive parts 91c of the penetrating wiring parts 91 opposite each other between the wafers 1WA and 1WB. Therefore, the semiconductor device of this embodiment can prevent unconnected portions between the bumps 26 and the penetrating wiring parts 91, even if the substrates 1SA and 1SB suffer warpage at the time of manufacturing the wafers 1WA and 1WB. This achieves a highly reliable connection between the bumps 26 and the penetrating wiring parts 91.

The invention is not limited to the examples described above. For example, while FIG. 41 illustrates an example of a semiconductor device including two bonded wafers 1WA and 1WB, the number of bonded wafers need only be a plurality, and can be three or more.

While the above explanation describes an example where the planar shape of the bumps is larger than the planar shape of the penetrating wiring parts, the planar shape of the penetrating wiring parts can be larger than that of the bumps. In this case, the planar shape of the penetrating wiring part at the bonding surface 30a is larger than the positioning margin shape, which is obtained by enclosing the planar shape of half the area of the bump 26 at the bonding surface 30b with the width of the positioning margin.

When the planar shape of the penetrating wiring parts is larger than that of the bumps, the penetrating wiring parts preferably have the structure shown in FIG. 41. In the penetrating wiring parts 91 shown in FIG. 41, the planar shape of the connection conductive parts 91c can easily be changed, without changing the arrangement of the other members or the manufacturing processes.

Experimental Example

Using a silicon substrate having a diameter of 200 mm (eight inches) and a thickness of 30 μm, an upper wafer having penetrating isolation parts and penetrating wiring parts formed thereon was made in the same manner as the upper wafer 1WA of the semiconductor device shown in FIG. 19.

The penetrating wiring part on the upper wafer 1WA includes two wiring parts made of tungsten, whose cross-sectional shape is that of a rectangle having a vertical dimension of 5.6 μm and a horizontal dimension of 1.5 μm, these being arranged in parallel with an interval of 2.6 μm between them. The length of the penetrating protrusions in the thickness direction of the wafer 1WA was 40 μm. In the design of the pre-processed substrate, the pitch for arranging the penetrating wiring parts was set at 50 μm. The penetrating isolation parts are square frames having external length and width of 13.4 μm.

For the upper wafer 1WA thus obtained, a positioning margin was determined (i.e. the difference between the distance from the center to the penetrating wiring parts arranged in an outermost portion, and the distance from the center of the pre-processed substrate and the pre-processed penetrating wiring parts arranged in the outermost portion). The post-processing positioning margin was found to be 7.5 μm, an increase of 0.09% due to manufacturing the upper wafer 1WA.

In the same manner as the lower wafer 1WB of the semiconductor device shown in FIG. 19, a lower wafer with bumps formed thereon is formed. The planar shape of the bumps on the lower wafer is determined as follows.

Figure 43:
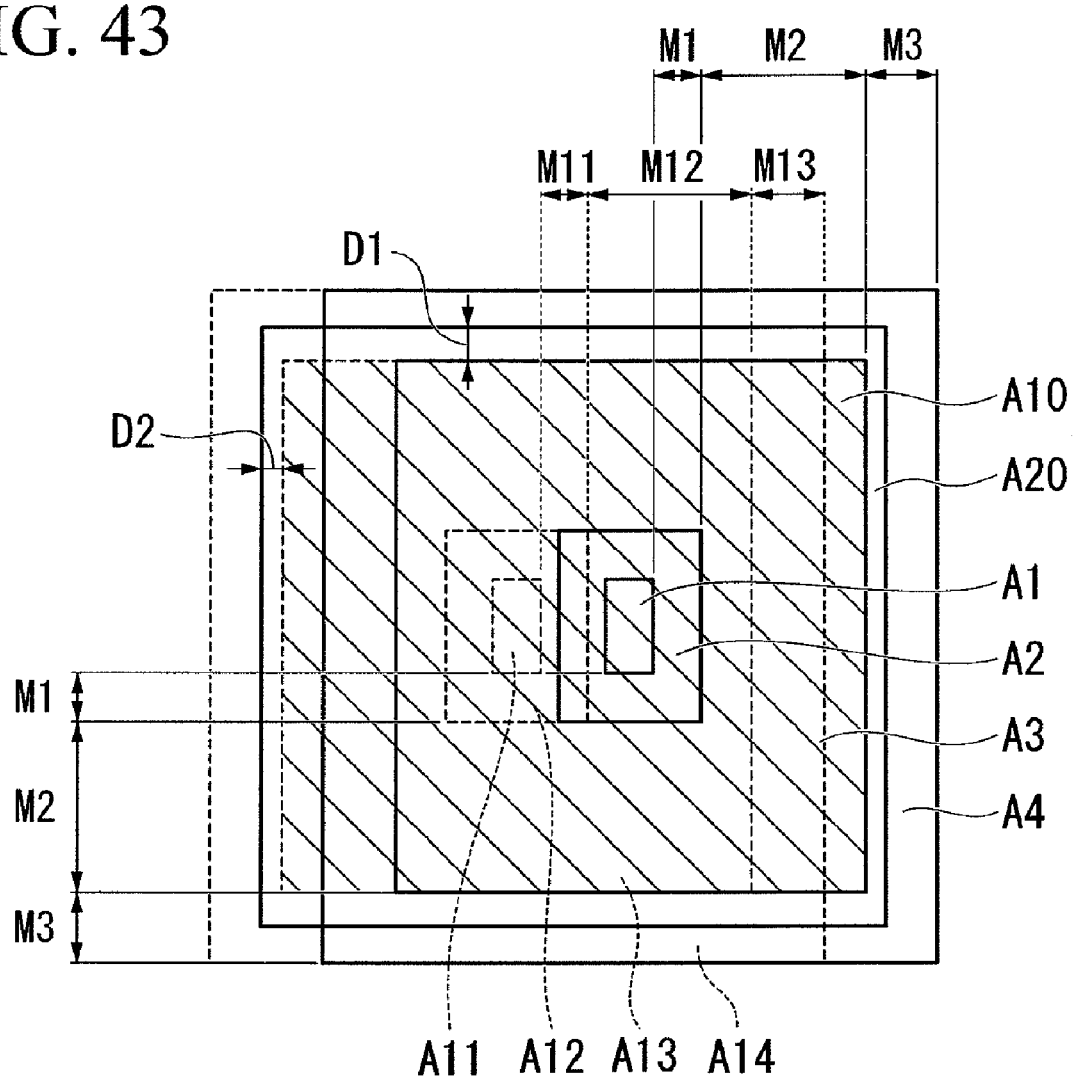
FIG. 43 is an explanatory plan view of a planar shape of a bump.

FIG. 43 is an explanatory plan view of the planar shape of a bump. In FIG. 43, reference numeral A20 represents the planar shape of a bump on a lower wafer, reference numerals A1 and A11 represent a basic shape, reference numerals A2 and A12 represent a positioning margin shape, reference numerals A3 and A13 represent a post-processing positioning margin shape, and reference numerals A4 and A14 represent a maximum region of a corrected shape. This example will describe a case where the planar shape A20 of the bump on the lower wafer is determined using a first basic shape, and a case where it is determined using a second basic shape.
(First Basic Shape)

The area of the planar shape of each of the basic shapes A1 and A11 is half the area of the penetrating wiring part on the bonding surface 30a. In the example of FIG. 43, the planar shapes of the basic shapes A1 and A11 are arranged with their centers aligned with two rectangular wiring parts that constitute the penetrating wiring part, the shape of each being a rectangle with length 4.0 μm and width 1.1 μm that attains the area of the shape of a rectangle with length 2.8 μm and width 1.5 μm which is half of the long side.

The positioning margin shapes A2 and A12 shown in FIG. 43 have a planar shape that is obtained by enclosing the end parts of the basic shapes A1 and A11 with the width of position margin M1, which correspond to the precision of the apparatus that positions the wafers for bonding (upper and lower wafers), and resemble the basic shapes A1 and A11. Since an apparatus used as the apparatus for positioning the upper and lower wafers has a positioning precision of ±1 μm, the positioning margins M1 and M11 corresponding to the positioning precision are 1 μm.

Therefore, each of the positioning margin shapes A2 and A12 is a rectangle of length 6.0 μm and width 3.1 μm.

In FIG. 43, the difference between the distance from the center of the wafer 1WA and the penetrating wiring parts arranged in an outermost part, and the distance from the center of a pre-processing substrate 1SA that becomes the wafer 1WA and the pre-processing penetrating wiring parts arranged in the outermost part is deemed a post-processing positioning margin M2. The post-processing positioning margin shapes A3 and A13 are a planar shape obtained by enlarging the positioning margin shape A2 by the width of the post-processing positioning margin M2, and resemble the basic shapes A1 and A11.

Since the post-processing positioning margins M2 and M12 are each 7.5 μm, the post-processing positioning margin shapes A3 and A13 are each rectangles with length 21.0 μm and width 18.1 μm.

The post-processing positioning margin shape A3 and the post-processing positioning margin shape A13 corresponding to the two wiring parts overlap with each other, and the planar shape of a comprehensive post-processing positioning margin shape A10 (the diagonal line region in FIG. 43) formed by the outline of the overlapping shapes of the post-processing positioning margin shapes A3 and A13 is a rectangle of length 21.0 μm and width 22.2 μm.

As shown in FIG. 43, the vertical dimension of the comprehensive post-processing positioning margin shape A10 is the same as those of the post-processing positioning margin shapes A3 and A13. However, its horizontal dimension is wider than the dimension of one post-processing positioning margin shape by exactly 4.1 μm, which is the dimension obtained by adding 1.5 μm (the dimension of the short side of the wiring part) to 2.6 μm (the interval between the two wiring parts that constitute the penetrating wiring part).

The maximum regions of corrected shape A4 and A14 in FIG. 43 are planar shapes obtained by enlarging the edges of the post-processing positioning margin shapes A3 and A13 toward the outside by a correction dimension M3 and M13 of 2.5 μm, which is the maximum correction dimension, and they resemble the basic shapes A1 and A11.

In this embodiment, the comprehensive post-processing positioning margin shape A10 is outwardly extended by a vertical correction dimension D1 of 1.0 μm and a horizontal correction dimension D2 of 0.4 μm. This region becomes the planar shape A20 of a bump on the lower wafer. That is, the bump planar shape A20 is a square having a vertical dimension of 21.0+(1.0×2)=23 μm, and horizontal dimension of 22.2+(0.4×2)=23 μm. The bump planar shape A20 is a region inside the comprehensive corrected shape formed by the outline of the overlapping maximum regions of the corrected shapes A4 and A14.
(Second Basic Shape)

In this example, the planar shape of the basic shapes A1 and A11 was a rectangle having length of 4.0 μm and width of 1.1 μm. However, the planar shapes of the basic shapes A1 and A11 can be one where the two rectangular wiring parts that constitute the penetrating wiring part are arranged with their centers aligned, in the shape of a rectangle having length of 2.8 μm and width of 1.5 μm.

In this case, the positioning margin shapes A2 and A12 shown in FIG. 43 are both rectangles having length of 4.8 μm and width of 3.5 μm. The post-processing positioning margin shapes A3 and A13 are both rectangles having length of 19.8 μm and width of 18.5 μm, and the planar shape of the comprehensive post-processing positioning margin shape A10 (the diagonal line region in FIG. 43) is a rectangle having length of 19.8 μm and width of 22.6 μm.

When using a rectangle having length of 2.8 μm and width of 1.5 μm as the planar shape of the basic shapes A1 and A11, a region obtained by outwardly widening the comprehensive post-processing positioning margin shape A10 with a vertical correction dimension D1 of 1.6 μm and a horizontal correction dimension D2 of 0.2 μm becomes the bump planar shape A20 of the lower wafer, which has the same shape as when using a rectangle having length of 4.0 μm and width of 1.1 μm as the planar shape of the basic shapes A1 and A11. That is, the bump planar shape A20 in this case is a square having length of 19.8+(1.6×2)=23 μm, and width of 22.6+(0.2×2)=23 μm, being the region inside the comprehensive corrected shape formed by the outline of the overlapping maximum regions of the corrected shapes A4 and A14.

In this example, the bump planar shape A20 is a square of 23 μm by 23 μm, and the pitch of the bumps is 50 μm. Therefore, the pitch of the bumps is larger than the dimension obtained by combining the width of the outer shape of the penetrating isolation parts (13.4 μm) and the width of the outer shape of the bump (23 μm), whereby electrical connection between the bumps via the penetrating isolation parts can be prevented.

Figure 44:
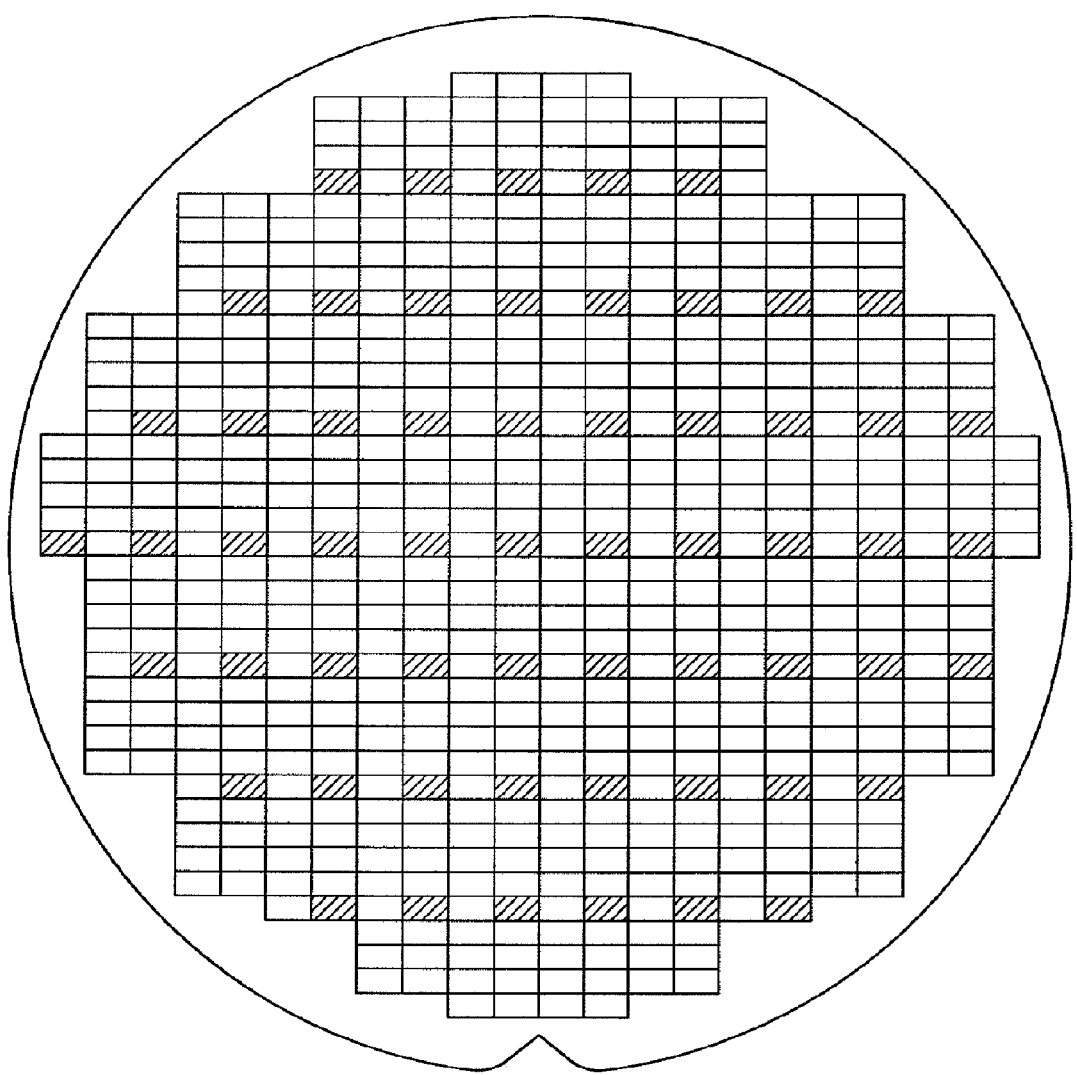
FIG. 44 is a plan view of a semiconductor device manufactured in a test.

The bumps on the lower wafer formed in the above manner were then aligned with the corresponding penetrating wiring parts on the upper wafer as described in FIGS. 17 and 18, and the wafers were bonded by injecting insulating adhesive between them, obtaining the semiconductor device shown in FIG. 44. In the semiconductor device shown in FIG. 44, penetrating wiring parts and bumps are connected at each grid position shown in FIG. 44.

In the semiconductor device shown in FIG. 44, of the grids shown in FIG. 44, fifty-eight of the grid-sections shaded with diagonal lines were measured to determine whether the penetrating wiring parts and the bumps arranged at those locations were connected. It was confirmed that all the penetrating wiring parts and bumps were properly electrically connected, and that there was a proper electrical connection even between the penetrating wiring parts and bumps arranged on the outermost wafers.

Thus it is clear that when the planar shape of the bumps on the bonding surface is the bump planar shape A20, obtained by outwardly widening the comprehensive post-processing positioning margin shape A10 from its edges by a correction dimension of no more than 2.5 μm, even if the substrate suffers warpage at the time of manufacturing the wafer on the side where the penetrating wiring parts are provided, at least half of the area of the penetrating wiring parts will connect to the bumps, ensuring a proper electrical connection.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device comprising:
   a first wafer (1WA) and a second wafer (1WB) that are bonded together at a bonding surface (30a);
   a plurality of first electrical signal connection parts (9), extending from within the first wafer (1WA), across the bonding surface (30a) between the first wafer (1WA) and the second wafer (1WB), and into the second wafer (1WB);
   a plurality of second electrical signal connection parts (26), provided on a bonding surface (30b) within the second wafer (1WB), and forming a plurality of inter-wafer connection parts (30c) at a central portion thereof that electrically connect to each of the first electrical signal connection parts (9);
   wherein:
   each of the first electrical signal connection parts (9) is enclosed by a penetrating isolation part (5) which electrically insulate the inter-wafer connection parts (30c) from each other, each of the penetrating isolation parts (5) having walls arranged in a rectangular shape and which extend from the bonding surface (30b) within the second wafer (1WB), across the bonding surface (30a) between the first wafer (1WA) and the second wafer (1WB), and into the first wafer (1WA); and
   a junction face shape (A3, A4) of each of the second electrical signal connection parts (26) is larger than a shape (A2) of a positioning margin face that is formed by an outer shape (A2) when a minimum junction shape (A1), which has an area that is half of a junction area of the first electrical signal connection part (9), is enclosed by a same width dimension (M1) as a positioning margin dimension between (M1) the first wafer (1WA) and the second wafer (1WB).

2. The semiconductor device according to claim 1, wherein:
   when a difference between the distance from a center (C) of the first wafer (1WA) and the first electrical signal connection parts (9) arranged in an outermost portion of the first wafer (1WA), and the distance from the center (C) of a pre-processed substrate (1SA) that becomes the first wafer (1 WA) and pre-processed parts that become the first electrical signal connection parts (9) arranged in the outermost portion of the pre-processed substrate (1SA), is deemed to be a post-processing positioning margin dimension (M2); and
   the junction face shape of each of the second electrical signal connection parts (26) is the same as the shape (A3) of a post-processing positioning margin face formed when the periphery of the shape (A2) of the positioning margin face is enclosed by the same width as that of the post-processing positioning margin dimension (M2).

3. The semiconductor device according to claim 2, wherein:
   the junction face shape of the second electrical signal connection parts (26) is the same as a corrected outer shape (A4) when the periphery (P) of the shape (A3) of the post-processing positioning margin face is enclosed by a predetermined correction dimension (M3) of no more than 2.5 μm.

4. The semiconductor device according to claim 1, wherein the first wafer (1WA) or the second wafer (1WB) is a thinned wafer which is subjected to a thickness reduction process.

5. The semiconductor device according to claim 1, wherein:

the first electrical signal connection parts (9) are penetrating wiring parts (9) which electrically connects one face of the first wafer (1WA) with another face thereof; and the second electrical signal connection parts (26) are bumps (26).

* * * * *